(12) United States Patent
Oka

(10) Patent No.: US 9,349,856 B2
(45) Date of Patent: May 24, 2016

(54) SEMICONDUCTOR DEVICE INCLUDING FIRST INTERFACE AND SECOND INTERFACE AS AN UPPER SURFACE OF A CONVEX PROTRUDED FROM FIRST INTERFACE AND MANUFACTURING DEVICE THEREOF

(71) Applicant: TOYODA GOSEI CO., LTD., Kiyosu-shi (JP)

(72) Inventor: Toru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/179,412

(22) Filed: Feb. 12, 2014

(65) Prior Publication Data

US 2014/0291756 A1    Oct. 2, 2014

(30) Foreign Application Priority Data

Mar. 26, 2013  (JP) ................................. 2013-063329
Mar. 26, 2013  (JP) ................................. 2013-63331
Oct. 24, 2013  (JP) ................................. 2013-220954

(51) Int. Cl.
*H01L 29/78*     (2006.01)
*H01L 29/66*     (2006.01)
(Continued)

(52) U.S. Cl.
CPC ........ *H01L 29/7813* (2013.01); *H01L 29/1095* (2013.01); *H01L 29/42356* (2013.01); *H01L 29/66727* (2013.01); *H01L 29/66734* (2013.01); *H01L 29/7811* (2013.01); *H01L 29/7825* (2013.01); *H01L 29/7827* (2013.01); *H01L 29/0623* (2013.01); *H01L 29/0661* (2013.01); *H01L 29/0869* (2013.01); *H01L 29/0878* (2013.01); *H01L 29/2003* (2013.01);
(Continued)

(58) Field of Classification Search
CPC ............ H01L 29/7813; H01L 29/7825; H01L 29/7827; H01L 29/42356; H01L 29/66734
USPC .................................. 257/329, 330, 341, 342
See application file for complete search history.

(56) References Cited

U.S. PATENT DOCUMENTS 5,744,826 A    4/1998  Takeuchi et al.
5,910,669 A *  6/1999  Chang et al. .................. 257/339
(Continued)

FOREIGN PATENT DOCUMENTS

EP    0 345 380 A2    12/1989
JP    S58-100460 A    6/1983
(Continued)

*Primary Examiner* — Minh-Loan Tran
(74) *Attorney, Agent, or Firm* — McGinn IP Law Group, PLLC

(57) ABSTRACT

A semiconductor device includes a first n-type semiconductor layer, a p-type semiconductor layer, a second n-type semiconductor layer and a trench. The first n-type semiconductor layer includes a first interface and a second interface. The second interface forms an upper surface of a convex protruded from the first interface. The p-type semiconductor layer is stacked on the first n-type semiconductor layer and includes a first region stacked on the first interface and a second region stacked on the second interface. The first region is uniformly continuous with the second region. The second n-type semiconductor layer is stacked on the p-type semiconductor layer. The trench is depressed from the second n-type semiconductor layer through the p-type semiconductor layer into the convex of the first n-type semiconductor layer.

18 Claims, 35 Drawing Sheets

(51) Int. Cl.
  *H01L 29/423* (2006.01)
  *H01L 29/10* (2006.01)
  *H01L 29/40* (2006.01)
  *H01L 29/417* (2006.01)
  *H01L 29/45* (2006.01)
  *H01L 29/06* (2006.01)
  *H01L 29/08* (2006.01)
  *H01L 29/20* (2006.01)

(52) U.S. Cl.
  CPC ......... *H01L29/407* (2013.01); *H01L 29/41766* (2013.01); *H01L 29/452* (2013.01)

(56) References Cited

U.S. PATENT DOCUMENTS

| | | | |
|---|---|---|---|
| 6,291,298 B1 * | 9/2001 | Williams et al. | 438/270 |
| 6,342,709 B1 | 1/2002 | Sugawara et al. | |
| 7,045,857 B2 * | 5/2006 | Darwish et al. | 257/330 |
| 8,653,593 B2 * | 2/2014 | Omori | 257/334 |
| 2006/0289928 A1 | 12/2006 | Takaya et al. | |
| 2009/0114969 A1 | 5/2009 | Suzuki et al. | |
| 2010/0078714 A1 * | 4/2010 | Tu et al. | 257/330 |
| 2011/0121316 A1 | 5/2011 | Harada | |
| 2011/0254088 A1 * | 10/2011 | Darwish et al. | 257/340 |

FOREIGN PATENT DOCUMENTS

| | | |
|---|---|---|
| JP | S62-11272 A | 1/1987 |
| JP | H01-265570 A | 10/1989 |
| JP | H01-287966 A | 11/1989 |
| JP | H01-310576 A | 12/1989 |
| JP | H06-224437 A | 8/1994 |
| JP | H08-167713 A | 6/1996 |
| JP | H09-199724 A | 7/1997 |
| JP | H10-098188 A | 4/1998 |
| JP | 2001-267570 A | 9/2001 |
| JP | 2005-116822 A | 4/2005 |
| JP | 2007-158275 A | 6/2007 |
| JP | 2008-226914 A | 9/2008 |
| JP | 2009-117593 A | 5/2009 |
| JP | 2009-267029 A | 11/2009 |
| JP | 2011-044513 A | 3/2011 |

\* cited by examiner

SEMICONDUCTOR DEVICE INCLUDING FIRST INTERFACE AND SECOND INTERFACE AS AN UPPER SURFACE OF A CONVEX PROTRUDED FROM FIRST INTERFACE AND MANUFACTURING DEVICE THEREOF

CROSS-REFERENCE TO RELATED APPLICATION

The present application claims priority from Japanese patent applications P2013-63329 filed on Mar. 26, 2013, P2013-63331 filed on Mar. 26, 2013 and P2013-220954 filed on Oct. 24, 2013, the entirety of disclosures of which is hereby incorporated by reference into this application.

BACKGROUND

1. Technical Field

The invention relates to a semiconductor device and a manufacturing method thereof.

2. Related Art

A trench gate structure in which a gate electrode is formed in a trench has been known as the structure of semiconductor devices (semiconductor elements). Patent Literatures 1 to 4 describe formation of a p-type semiconductor in the vicinity of a bottom of a trench, in order to relieve the potential crowding on the bottom of the trench in the trench gate structure. Patent Literatures 5 to 9 describe formation of a p-type semiconductor as a floating area in a bottom of a trench by using at least either of ion implantation and thermal diffusion, in order to relieve the potential crowding on the bottom of the trench in the trench gate structure. These proposed techniques improve the breakdown voltage of the semiconductor device.

Patent Literature 1: JP H06-224437A
Patent Literature 2: JP 2001-267570A
Patent Literature 3: JP 2009-117593A
Patent Literature 4: JP 2011-44513A
Patent Literature 5: JP H01-310576A
Patent Literature 6: JP H10-98188A
Patent Literature 7: JP 2005-116822A
Patent Literature 8: JP 2007-158275A
Patent Literature 9: JP 2009-267029A

SUMMARY

In the trench gate structures described in Patent Literatures 1 and 2, a p-type semiconductor is formed in the vicinity of the bottom of the trench by ion implantation. These trench gate structures accordingly have a problem that this is not applicable to a semiconductor having difficulty in formation of a p-type semiconductor by ion implantation (for example, group-III nitride semiconductor such as gallium nitride (GaN)).

In the trench gate structures described in Patent Literatures 3 and 4, a p-type semiconductor is formed in the vicinity of the bottom of the trench by selective regrowth that causes crystal growth in an area selected by masking. These trench gate structures accordingly have a problem that the manufacturing process is complicated.

The trench gate structures described in Patent Literatures 3 and 4 have a problem that the electrical properties of a previously formed n-type semiconductor layer are deteriorated (for example, an increase in on resistance) by diffusion of a dopant (impurity) contained in a previously formed p-type semiconductor into the previously formed n-type semiconductor layer in the process of forming a p-type semiconductor in the vicinity of the bottom of the trench by selective regrowth.

The trench gate structures described in Patent Literatures 5 to 9 have a problem that the electrical properties of an n-type semiconductor layer are deteriorated (for example, an increase in channel length and an increase in on resistance) by diffusion of a dopant (impurity) contained in a p-type semiconductor into the n-type semiconductor layer. Especially when this trench gate structure is applied to a semiconductor having difficulty in formation of a p-type semiconductor by ion implantation (for example, group-III nitride semiconductor such as gallium nitride (GaN)), long-time heating treatment at a relatively high temperature is needed (for example, 900° C. for 60 minutes). This causes significant deterioration of the electrical properties of the n-type semiconductor layer.

Terminal structures using a trench in the semiconductor device have the similar problems to those of the trench gate structures.

There is accordingly a need for technology to improve the electrical properties of a semiconductor device having a trench. Other needs for the semiconductor device include downsizing, cost reduction, resource saving easy manufacture, improved usability and improved durability.

According to one aspect of the invention, there is provided a semiconductor device. This semiconductor device comprises: a first n-type semiconductor layer having a first interface and a second interface that forms an upper surface of a convex protruded from the first interface; a p-type semiconductor layer stacked on the first n-type semiconductor layer, wherein a first region stacked on the first interface is uniformly continuous with a second region stacked on the second interface; a second n-type semiconductor layer stacked on the p-type semiconductor layer; and a trench depressed from the second n-type semiconductor layer through the p-type semiconductor layer into the convex of the first n-type semiconductor layer. This aspect relieves the potential crowding in the trench by the p-type semiconductor layer. This results in improving the electrical properties of the semiconductor device.

In the semiconductor device of the above aspect, the p-type semiconductor layer may have a first projection protruded along the convex toward a protruding direction, in which the convex is protruded. The second n-type semiconductor layer may have a second projection protruded along the first projection toward the protruding direction. This aspect relieves the potential crowding in the trench formed in the respective semiconductor layers having the respective projections.

The semiconductor device of the above aspect may further comprise an electrode formed in the trench via an insulating film. This aspect relieves the potential crowding in the trench with the electrode formed via the insulating film.

In the semiconductor device of the above aspect, a height Hm of the convex protruded from the first interface may be less than a total thickness Tu obtained by adding a thickness Tp of the p-type semiconductor layer in the first region and a thickness Tn of the second n-type semiconductor layer on the first region. This aspect improves the crystal quality of the respective semiconductor layers formed on the convex.

In the semiconductor device of the above aspect, a depth h1 by which the trench is depressed into the upper surface of the convex may be not less than 0.0 μm and may be not greater than a depth as a sum of the height Hm of the convex protruded from the first interface and 0.4 μm. This aspect effectively relieves the potential crowding in the trench, while ensuring the flow of forward current.

In the semiconductor device of the above aspect, a height h2 from the first interface to a bottom face of the trench along an X-axis direction in which the convex is protruded may be not greater than 1.0 μm on a +X-axis direction side from the first interface toward the second interface and may be not greater than 0.4 μm on a −X-axis direction side from the second interface toward the first interface. This aspect effectively relieves the potential crowding in the trench, while reducing an increase in thickness of the first n-type semiconductor layer.

In the semiconductor device of the above aspect, a distance w1 between a lateral end of the convex and a bottom face of the trench may satisfy 0.1 μm≤w1≤2.0 μm. This aspect suppresses an increase in on resistance due to the excessively close distance w1, while suppressing an increase in potential crowding in the trench due to the excessively far distance w1.

In the semiconductor device of the above aspect, a distance w1 between a lateral end of the convex and a bottom face of the trench may satisfy 0.2 μm≤w1≤1.0 μm. This aspect further suppresses an increase in on resistance due to the excessively close distance w1, while further suppressing an increase in potential crowding in the trench due to the excessively far distance w1.

The semiconductor device of the above aspect may further comprise a third n-type semiconductor layer placed between the first n-type semiconductor layer and the p-type semiconductor layer. This aspect improves the crystal quality of the p-type semiconductor layer.

The semiconductor device of the above aspect may further comprise an intrinsic semiconductor layer placed between the first n-type semiconductor layer and the p-type semiconductor layer. This aspect improves the crystal quality of the p-type semiconductor layer.

In the semiconductor device of the above aspect, the acceptor concentration in the first region may be equal to the acceptor concentration in the second region. This aspect relieves the potential crowding in the trench by the p-type semiconductor layer that is homogeneous over the first region to the second region.

In the semiconductor device of the above aspect, the first n-type semiconductor layer, the p-type semiconductor layer and the second n-type semiconductor layer may be semiconductor layers mainly made of gallium nitride (GaN). This aspect improves the breakdown voltage of the GaN-based semiconductor device, which has difficulty in formation of a p-type semiconductor by ion implantation.

The semiconductor device of the above aspect may have a plurality of the trenches, wherein the convex may be protruded from the first interface at least on a terminal side of an end trench located on the terminal side of the semiconductor device among the plurality of trenches. This aspect relieves the potential crowding in at least the trench located on the terminal side.

The semiconductor device of the above aspect may further comprise: a step portion formed on a terminal side of the trench in the semiconductor device is extended from the second n-type semiconductor layer through the p-type semiconductor layer to the first n-type semiconductor layer; an insulating film configured to have electrical insulation and cover the step portion; and an electrode configured to have electrical conductivity and stacked on the insulating film such that the insulating film is placed between the electrode and the step portion. In this aspect, the field plate structure of the insulating film and the electrode at the step portion relieves the potential crowding at a pn junction between the first n-type semiconductor layer and the p-type semiconductor layer at the step portion.

The semiconductor device of the above aspect may further comprise: a source electrode formed in a recess from the second n-type semiconductor layer to the p-type semiconductor layer; and a gate electrode formed in the trench via an insulating film, wherein parts of the source electrode and parts of the gate electrode may be arranged alternately in a cross section along a stacking direction in which the first n-type semiconductor layer, the p-type semiconductor layer and the second n-type semiconductor layer are stacked. This aspect relieves the potential crowding in each of a plurality of elements comprised of respective parts of the source electrode and the gate electrodes.

In the semiconductor device of the above aspect, the first n-type semiconductor layer may include: an n-type semiconductor layer on a lower layer side away from the p-type semiconductor layer; and an n-type semiconductor layer on an upper layer side having the first interface and the second interface, wherein another convex having another upper surface may be formed at a location corresponding to the convex on the n-type semiconductor layer on the lower layer side, another p-type semiconductor layer different from the p-type semiconductor layer may be stacked on the another upper surface of the another convex, and the trench may be depressed to the another p-type semiconductor layer. This aspect relieves the potential crowding in the trench by the another p-type semiconductor layer. This results in improving the electrical properties of the semiconductor device.

In the semiconductor device of the above aspect, the trench may be in a shape having a bottom face depressed into the another p-type semiconductor layer or in a shape having a bottom face wider than the another p-type semiconductor layer. When the trench is in the shape having the bottom face depressed into the another p-type semiconductor layer, this aspect facilitates positioning of the trench relative to the another p-type semiconductor layer in the process of formation of the trench. When the trench is in the shape having the bottom face wider than the another p-type semiconductor layer, this aspect enables the another p-type semiconductor layer to further suppress an increase in on resistance due to a depletion layer extended on the n-type semiconductor layer on the upper layer side.

In the semiconductor device of the above aspect, the first n-type semiconductor layer may further include another semiconductor layer placed between the n-type semiconductor layer on the lower layer side with the another p-type semiconductor layer and the n-type semiconductor layer on the upper layer side. This aspect improves the crystal quality of the n-type semiconductor layer on the upper layer side.

According to another aspect of the invention, there is provided a manufacturing method of a semiconductor device. This manufacturing method comprises: forming a first n-type semiconductor layer; forming a convex in the first n-type semiconductor layer by dry etching; forming a p-type semiconductor layer on a surface of the first n-type semiconductor layer including the convex by crystal growth; forming a second n-type semiconductor layer on a surface of the p-type semiconductor layer by crystal growth; and forming by dry etching a trench depressed from the second n-type semiconductor layer through the p-type semiconductor layer into the convex of the first n-type semiconductor layer. This aspect enables the p-type semiconductor layer to be formed such as to relieve the potential crowding in the trench without using ion implantation and selective regrowth. This results in reducing the manufacturing cost. This also suppresses an increase in on resistance due to diffusion of a dopant contained in the p-type semiconductor layer into at least one of the first n-type semiconductor layer and the second n-type semiconductor layer.

In the manufacturing method of the semiconductor device of the above aspect, the forming the convex may include wet etching of the first n-type semiconductor layer after the dry etching. This aspect enables damage by dry etching on the surface of the first n-type semiconductor layer to be relieved by wet etching, thus facilitating crystal growth of the p-type semiconductor layer.

According to another aspect of the invention, there is provided a semiconductor device. This semiconductor device comprises: a first n-type semiconductor layer with a convex having an upper surface formed therein; a first p-type semiconductor layer stacked on the upper surface of the convex; a second n-type semiconductor layer stacked over the first n-type semiconductor layer and the first p-type semiconductor layer; a second p-type semiconductor layer stacked on the second n-type semiconductor layer; a third n-type semiconductor layer stacked on the second p-type semiconductor layer; and a trench depressed from the third n-type semiconductor layer through the second p-type semiconductor layer and the second n-type semiconductor layer to the first p-type semiconductor layer. This aspect relieves the potential crowding in the trench by the first p-type semiconductor layer. This results in improving the electrical properties of the semiconductor device.

In the semiconductor device of the above aspect, the first n-type semiconductor layer may be adjacent to the first p-type semiconductor layer only on the upper surface of the convex. This aspect effectively relieves the potential crowding in the trench by the first p-type semiconductor layer.

In the semiconductor device of the above aspect, the second n-type semiconductor layer may have a first projection protruded along the convex and the first p-type semiconductor layer toward a protruding direction in which the convex is protruded; the second p-type semiconductor layer may have a second projection protruded along the first projection toward the protruding direction; and the third n-type semiconductor layer may have a third projection protruded along the second projection toward the protruding direction. This aspect relieves the potential crowding in the trench formed in the respective semiconductor layers having the respective projections.

The semiconductor device of the above aspect may further comprise an electrode formed in the trench via an insulating film. This aspect relieves the potential crowding in the trench with the electrode formed via the insulating film.

In the semiconductor device of the above aspect, a thickness Tp1 of the first p-type semiconductor layer may be not less than 0.1 µm. This aspect effectively relieves the potential crowding in the trench by the first p-type semiconductor layer.

In the semiconductor device of the above aspect, a height Hm as a sum of a height Hn1 of the convex and a thickness Tp1 of the first p-type semiconductor layer may be less than a total thickness Tu obtained by adding a thickness Tn2 of the second n-type semiconductor layer, a thickness Tp2 of the second p-type semiconductor layer, and a thickness Tn3 of the third n-type semiconductor layer. This aspect improves the crystal quality of the respective semiconductor layers formed on the convex and the first p-type semiconductor layer.

In the semiconductor device of the above aspect, the thickness Tn2 of the second n-type semiconductor layer may be not less than the thickness Tp1 of the first p-type semiconductor layer. This aspect improves the crystal quality of the second n-type semiconductor layer.

In the semiconductor device of the above aspect, the thickness Tn2 of the second n-type semiconductor layer may be not less than 0.2 µm. This aspect enables the first p-type semiconductor layer to suppress an increase in on resistance due to a depletion layer extended on the second n-type semiconductor layer.

In the semiconductor device of the above aspect, the thickness Tn2 of the second n-type semiconductor layer may be not less than 0.5 µm. This aspect enables the first p-type semiconductor layer to further suppress an increase in on resistance due to a depletion layer extended on the second n-type semiconductor layer.

In the semiconductor device of the above aspect, the trench may be in a shape depressed into the first p-type semiconductor layer. This aspect facilitates positioning of the trench relative to the first p-type semiconductor layer in the process of formation of the trench.

In the semiconductor device of the above aspect, a distance w1 between a lateral end of the first p-type semiconductor layer and a bottom face of the trench may be not greater than 0.5 µm. This aspect enables the first p-type semiconductor layer to suppress an increase in on resistance due to a depletion layer extended on the second n-type semiconductor layer.

In the semiconductor device of the above aspect, a distance w1 between a lateral end of the first p-type semiconductor layer and a bottom face of the trench may be not greater than 0.25 µm. This aspect enables the first p-type semiconductor layer to further suppress an increase in on resistance due to a depletion layer extended on the second n-type semiconductor layer.

In the semiconductor device of the above aspect, the convex and the first p-type semiconductor layer may be narrower than a bottom face of the trench. This aspect enables the first p-type semiconductor layer to further suppress an increase in on resistance due to a depletion layer extended on the second n-type semiconductor layer.

In the semiconductor device of the above aspect, a distance w2 between a lateral end of the first p-type semiconductor layer and a bottom face of the trench may be not greater than 0.5 µm. This aspect effectively relieves the potential crowding in the trench by the first p-type semiconductor layer.

The semiconductor device of the above aspect may further comprise another n-type semiconductor layer placed between the first n-type semiconductor layer with the first p-type semiconductor layer and the second n-type semiconductor layer. This aspect improves the crystal quality of the second n-type semiconductor layer.

The semiconductor device of the above aspect may further comprise an intrinsic semiconductor layer placed between the first n-type semiconductor layer with the first p-type semiconductor layer and the second n-type semiconductor layer. This aspect improves the crystal quality of the second n-type semiconductor layer.

In the semiconductor device of the above aspect, the second p-type semiconductor layer may be locate on a virtual plane that is extended along a direction, in which the first p-type semiconductor layer is extended, and passes through the first p-type semiconductor layer. This aspect further relieves the potential crowding in the trench by the first p-type semiconductor layer and the second p-type semiconductor layer.

In the semiconductor device of the above aspect, the first n-type semiconductor layer, the second n-type semiconductor layer, the third n-type semiconductor layer, the first p-type semiconductor layer and the second p-type semiconductor layer may be semiconductor layers mainly made of gallium nitride (GaN). This aspect improves the breakdown voltage in the GaN-based semiconductor device, which has difficulty in formation of a p-type semiconductor by ion implantation.

According to another aspect, there is provided a manufacturing method of a semiconductor device. This manufacturing method comprises: forming a first n-type semiconductor layer; forming a first p-type semiconductor layer on the first n-type semiconductor layer by crystal growth; dry etching the first n-type semiconductor layer and the first p-type semiconductor layer to form a convex with the first p-type semiconductor layer formed on an upper surface of the convex in the first n-type semiconductor layer; forming by crystal growth a second n-type semiconductor layer on respective surfaces of the first n-type semiconductor layer and the first p-type semiconductor layer; forming a second p-type semiconductor layer on a surface of the second n-type semiconductor layer by crystal growth; forming a third n-type semiconductor layer on a surface of the second p-type semiconductor layer by crystal growth; and forming by dry etching a trench depressed from the third n-type semiconductor layer through the second p-type semiconductor layer and the second n-type semiconductor layer to the first p-type semiconductor layer. This aspect enables the first p-type semiconductor layer to be formed such as to relieve the potential crowding in the trench without using ion implantation and thermal diffusion. This suppresses an increase in on resistance due to diffusion of a dopant contained in the first p-type semiconductor layer into at least one of the first n-type semiconductor layer and the second n-type semiconductor layer, as well as an increase in on resistance due to diffusion of a dopant contained in the second p-type semiconductor layer into the third n-type semiconductor layer. This results in improving the electrical properties of the semiconductor device.

In the manufacturing method of the semiconductor device of the above aspect, the forming the convex may include wet etching of the first n-type semiconductor layer and the first p-type semiconductor layer after the dry etching. This aspect enables damage by dry etching on the respective surfaces of the first n-type semiconductor layer and the first p-type semiconductor layer to be relieved by wet etching, thus facilitating crystal growth of the second n-type semiconductor layer.

The invention may be implemented by any of various aspects other than the semiconductor device and the manufacturing method thereof. For example, the invention may be implemented by aspects of an electrical device with the semiconductor device of the above aspect incorporated therein or a manufacturing apparatus of manufacturing the semiconductor device of the above aspect.

BRIEF DESCRIPTION OF DRAWINGS

The invention will be described with reference to the accompanying drawings in which.

DESCRIPTION OF EMBODIMENTS

A. First Embodiment

A-1. Structure of Semiconductor Device

Figure 1:
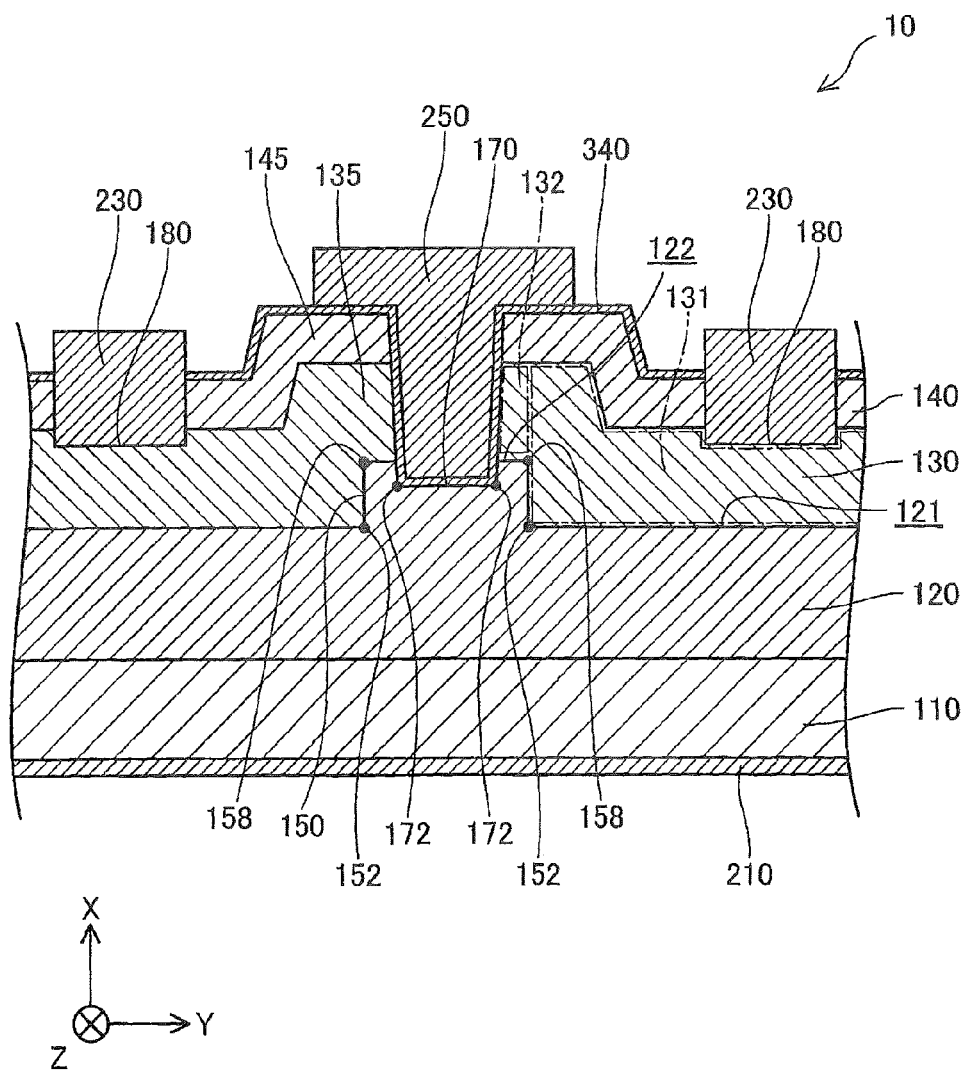
FIG. 1 is a cross sectional view schematically illustrating the structure of a semiconductor device according to a first embodiment.

FIG. 1 is a cross sectional view schematically illustrating the structure of a semiconductor device 10 according to a first embodiment. The semiconductor device 10 is a GaN-based semiconductor device made by using gallium nitride (GaN). According to this embodiment, the semiconductor device 10 is a trench gate MOSFET (Metal-Oxide-Semiconductor Field-Effect Transistor) used for power control and is also called power device.

The semiconductor device 10 includes a substrate 110, an n-type semiconductor layer 120, a p-type semiconductor layer 130, an n-type semiconductor layer 140, electrodes 210, 230 and 250, and an insulating film 340. A trench 170 and recesses 180 are formed in the semiconductor device 10. The semiconductor device 10 has the stacked structure where the n-type semiconductor layer 120, the p-type semiconductor layer 130 and the n-type semiconductor layer 140 are stacked sequentially. The semiconductor device 10 has the trench gate structure in which the electrode 250 is formed in the trench 170.

XYZ axes orthogonal to one another are shown in FIG. 1. Among the XYZ axes of FIG. 1, the X axis is an axis along the stacking direction in which the n-type semiconductor layer 120 is stacked on the substrate 110. In X-axis direction along the X axis, +X-axis direction is a direction from the substrate 110 toward the n-type semiconductor layer 120, and −X-axis direction is a direction opposed to the +X-axis direction. Among the XYZ axes of FIG. 1, the Y axis and the Z axis are orthogonal to the X axis and are also orthogonal to each other. In Y-axis direction along the Y axis, +Y-axis direction is a direction from the left side toward the right side of the sheet plane of FIG. 1, and −Y-axis direction is a direction opposed to the +Y-axis direction. In Z-axis direction along the Z axis, +Z-axis direction is a direction from the front side toward the back side of the sheet plane of FIG. 1, and −Z-axis direction is a direction opposed to the +Z-axis direction.

The substrate 110 of the semiconductor device 10 is a semiconductor layer extended along the Y axis and the Z axis. According to this embodiment, the substrate 110 is mainly made of gallium nitride (GaN) and contains silicon (Si) as the donor at the higher concentration than that of the n-type semiconductor layer 120. According to this embodiment, the average concentration of Si in the entire area of the substrate 110 is not less than $1.0 \times 10^{18}$ cm$^{-3}$.

The n-type semiconductor layer 120 of the semiconductor device 10 is a first n-type semiconductor layer stacked on the +X-axis direction side of the substrate 110 by crystal growth and extended along the Y axis and the Z axis. The n-type semiconductor layer 120 is mainly made of gallium nitride (GaN) and contains silicon (Si) as the donor at the lower concentration than that of the n-type semiconductor layer 140. According to this embodiment, the average concentration of Si in the entire area of the n-type semiconductor layer 120 is not greater than $1.0 \times 10^{16}$ cm$^{-3}$. The n-type semiconductor layer 120 is also called "n$^-$-GaN".

The n-type semiconductor layer 120 has a convex 150 protruded toward the p-type semiconductor layer 130-side (+X-axis direction side). According to this embodiment, the convex 150 has a plateau mesa structure extended in the Z-axis direction. According to this embodiment, the cross section of the convex 150 is in a rectangular shape having the width of the +X-axis direction side equal to the width of the −X-axis direction side. According to this embodiment, the convex 150 is the structure formed by dry etching and wet etching.

The n-type semiconductor layer 120 has a first interface 121 and a second interface 122. The first interface 121 of the n-type semiconductor layer 120 is a face in the +X-axis direction and is adjacent to the p-type semiconductor layer 130. The second interface 122 of the n-type semiconductor layer 120 is a face in the +X-axis direction to form the upper surface of the convex 150 and is adjacent to the p-type semiconductor layer 130. According to this embodiment, the first interface 121 and the second interface 122 are the surfaces formed by dry etching and wet etching.

The p-type semiconductor layer 130 of the semiconductor device 10 is a semiconductor layer stacked on the +X-axis direction side of the n-type semiconductor layer 120 by crystal growth and extended along the Y axis and the Z axis. The p-type semiconductor layer 130 is mainly made of gallium nitride (GaN) and contains magnesium (Mg) as the acceptor. According to this embodiment, the average concentration of Mg in the entire area of the p-type semiconductor layer 130 is not less than $1.0 \times 10^{17}$ cm$^{-3}$ and not greater than $1.0 \times 10^{20}$ cm$^{-3}$. The p-type semiconductor layer 130 is also called "p-GaN".

The p-type semiconductor layer 130 has a first region 131 and a second region 132. The first region 131 of the p-type semiconductor layer 130 is a part of the p-type semiconductor layer 130 stacked on the first interface 121 of the n-type semiconductor layer 120. The second region 132 of the p-type semiconductor layer 130 is a part of the p-type semiconductor layer 130 stacked on the second interface 122 of the n-type semiconductor layer 120. The first region 131 and the second region 132 are uniformly continuous with each other. According to this embodiment, the acceptor concentration in the first region 131 is equal to the acceptor concentration in the second region 132. According to another embodiment, the acceptor concentration in the first region 131 may be different from the acceptor concentration in the second region 132. In this application, the acceptor concentration gradually changes from the first region 131 to the second region 132.

The p-type semiconductor layer 130 has a projection 135. The projection 135 is a first projection protruded along the convex 150 of the n-type semiconductor layer 120 toward the protruding direction of the convex 150 (+X-axis direction). According to this embodiment, the p-type semiconductor layer 130 is parted at the projection 135 by the trench 170.

The n-type semiconductor layer 140 of the semiconductor device 10 is a second n-type semiconductor layer stacked on the +X-axis direction side of the p-type semiconductor layer 130 by crystal growth and extended along the Y axis and the Z axis. The n-type semiconductor layer 140 is mainly made of gallium nitride (GaN) and contains silicon (Si) as the donor at the higher concentration than that of the n-type semiconductor layer 120. According to this embodiment, the average concentration of Si in the entire area of the n-type semiconductor layer 140 is not less than $3.0 \times 10^{18}$ cm$^{-3}$. The n-type semiconductor layer 140 is also called "n$^+$-GaN".

The n-type semiconductor layer 140 has a projection 145. The projection 145 is a second projection protruded along the projection 135 of the p-type semiconductor layer 130 toward the +X-axis direction. According to this embodiment, the n-type semiconductor layer 140 is parted at the projection 145 by the trench 170.

The trench 170 of the semiconductor device 10 is a trench depressed from the +X-axis direction side of the n-type semiconductor layer 140 through the p-type semiconductor layer 130 to the n-type semiconductor layer 120. The trench 170 is in a shape depressed into the convex 150 of the n-type semiconductor layer 120. According to this embodiment, the trench 170 is in a shape extended in the Z-axis direction. According to this embodiment, the trench 170 is formed by wet etching subsequent to dry etching.

The insulating film 340 is formed on the surface of the trench 170 to the +X-axis direction side of the n-type semiconductor layer 140. According to this embodiment, the insulating film 340 is made of silicon dioxide ($SiO_2$).

The recess 180 of the semiconductor device 10 is formed by dry etching and wet etching and is a recess depressed from the +X-axis direction side of the n-type semiconductor layer 140 to the p-type semiconductor layer 130.

The electrode 210 of the semiconductor device 10 is a drain electrode formed on the −X-axis direction side of the substrate 110. According to this embodiment, the electrode 210 is formed by stacking a layer of aluminum (Al) on a layer of titanium (Ti) and subsequently firing the stacked layers.

The electrode 230 of the semiconductor device 10 is a source electrode formed in the recess 180. According to this embodiment, the electrode 230 is formed by stacking a layer of titanium (Ti) and a layer of aluminum (Al) on a layer of palladium (Pd) and subsequently firing the stacked layers.

The electrode 250 of the semiconductor device 10 is a gate electrode formed in the trench 170 via the insulating film 340. According to this embodiment, the electrode 250 is made of aluminum (Al).

Figure 2:
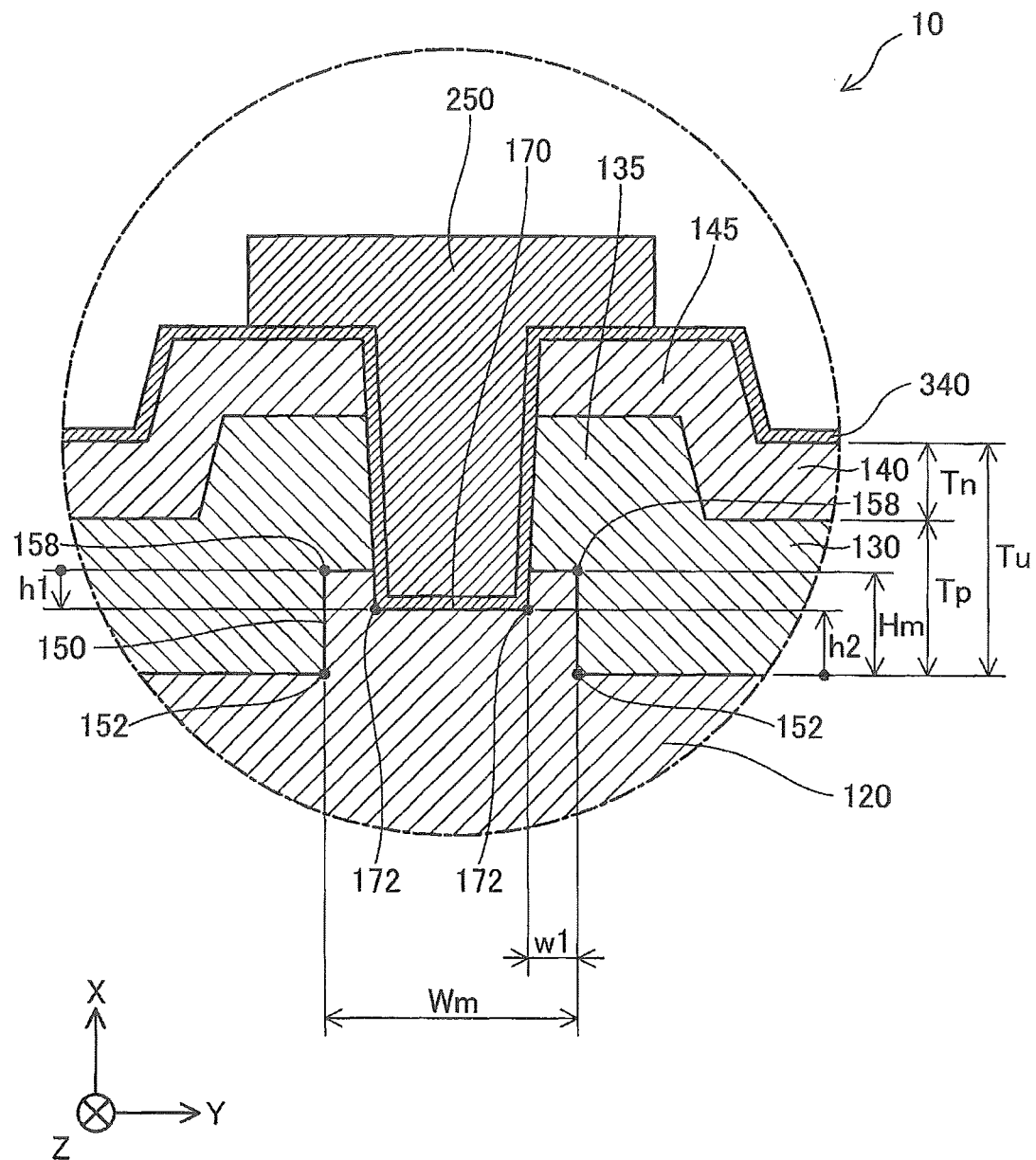
FIG. 2 is an enlarged cross sectional view schematically illustrating the structure of the semiconductor device, focusing around a convex and a trench.

FIG. 2 is an enlarged cross sectional view schematically illustrating the structure of the semiconductor device 10, focusing around the convex 150 and the trench 170. The convex 150 has a locus 152 and a locus 158. The locus 152 of the convex 150 is the starting point at which the convex 150 is protruded in the +X-axis direction. The locus 158 is the top of the convex 150. The locus 152 and the locus 158 are lateral ends of the convex 150. The trench 170 has a locus 172 as a bottom end of the trench 170.

In terms of improving the crystal quality of the p-type semiconductor layer 130 and the n-type semiconductor layer 140 formed on the convex 150, the height Hm of the convex 150 protruded from the first interface 121 is preferably less than a total thickness Tu of the thickness Tp of the p-type semiconductor layer 130 and the thickness Tn of the n-type semiconductor layer 140 and is more preferably less than the thickness Tp of the p-type semiconductor layer 130. According to this embodiment, the height Hm of the convex 150 is 0.3 µm (micrometer), and the thickness Tp of the p-type semiconductor layer 130 is 1.0 µm. According to this embodiment, width Wm of the convex 150 along the Y-axis direction is 2.0 µm.

In terms of ensuring the flow of forward current, a depth h1 by which the trench 170 is depressed into the upper surface of the convex 150 is preferably not less than 0.0 µm. In other words, it is preferable that the trench 170 reaches the convex 150. In terms of effectively relieving the potential crowding in the trench 170, the depth h1 is preferably not greater than the sum of the height Hm of the convex 150 and 0.4 µm. According to this embodiment, the depth h1 is 0.2 µm.

In terms of effectively relieving the potential crowding in the trench 170, a height h2 from the locus 152 to the locus 172 along the X-axis direction is preferably not greater than 0.4 µm on the −X-axis direction side. In other words, it is preferable that the locus 172 is located on the +X-axis direction side of a position of 0.4 µm on the −X-axis direction side from the locus 152. In terms of preventing a damage on the bottom of the trench 170 to increase the avalanche resistance, the height h2 is more preferably not less than 0.0 µm on the +X-axis direction side. In other words, it is more preferable that the locus 172 is located on the +X-axis direction side of the locus 152. In terms of reducing an increase in thickness of the n-type semiconductor layer 120 and thereby reducing the manufacturing cost, the height h2 is preferably not greater than 1.0 µm on the +X-axis direction side.

A distance w1 between the locus 152 ad the locus 172 along the Y-axis direction preferably satisfies $0.1 \mu m \leq w1 \leq 2.0$ µm and more preferably satisfies $0.2 \mu m \leq w1 \leq 1.0$ µm. According to this embodiment, the distance w1 is 0.5 µm. When the distance w1 is less than 0.1 µm, the effect of the p-type semiconductor layer 130 located on the Y-axis direction side causes a depletion layer to be extended on the bottom of the trench 170 during the forward operation and makes the electric current unlikely to flow, thus increasing the on resistance of the semiconductor device 10. When the distance w1 is greater than 2.0 µm, on the other hand, the p-type semiconductor layer 130 does not sufficiently relieve the potential crowding at the locus 172.

A-2. Manufacturing Method of Semiconductor Device

Figure 3:
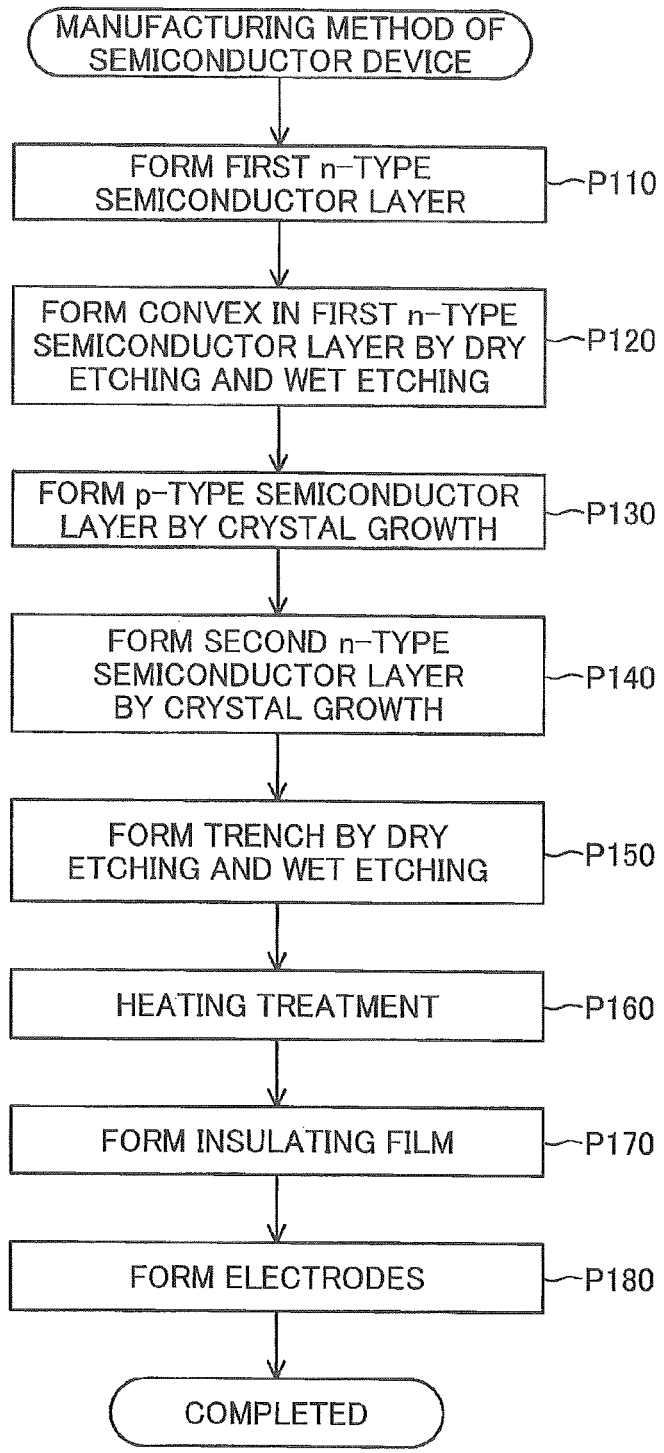
FIG. 3 is a flowchart showing a manufacturing method of the semiconductor device.

FIG. 3 is a flowchart showing a manufacturing method of the semiconductor device 10. In the process of manufacturing the semiconductor device 10, the manufacture first forms the n-type semiconductor layer 120 on the substrate 110 by crystal growth (step P110). According to this embodiment, the manufacturer forms the n-type semiconductor layer 120 on the substrate 110 by crystal growth using an MOCVD apparatus that employs metalorganic chemical vapor deposition method (MOCVD).

Figure 4:
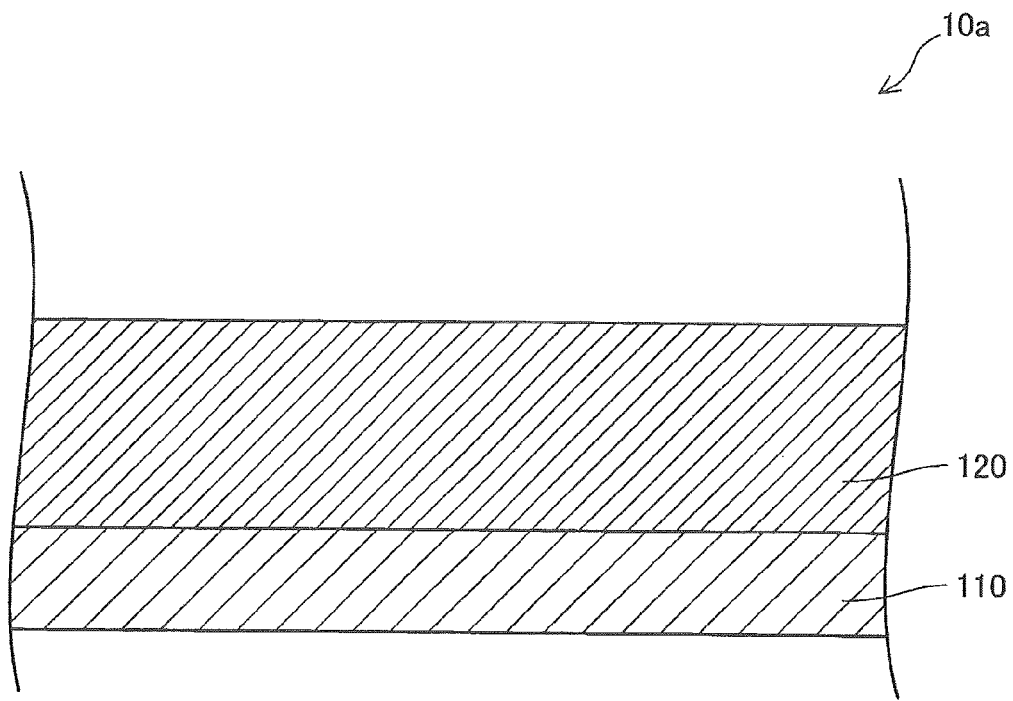
FIG. 4 is a diagram illustrating the structure of a semiconductor device in the middle of manufacture.

FIG. 4 is a diagram illustrating the structure of a semiconductor device 10a in the middle of manufacture. The semiconductor device 10a is produced by crystal growth of the n-type semiconductor layer 120 on the substrate 110 (step P110). The semiconductor device 10a has the structure in which the n-type semiconductor layer 120 is stacked on the substrate 110. According to this embodiment, the thickness of the n-type semiconductor layer 120 formed by crystal growth (step P110) is 10 µm.

Referring back to FIG. 3, after formation of the n-type semiconductor layer 120 (step P110), the manufacturer forms the convex 150 in the n-type semiconductor layer 120 by dry etching and wet etching (step P120). According to this embodiment, the manufacturer forms an etching mask in a region forming the convex 150 on the n-type semiconductor layer 120 and subsequently removes a region of the n-type semiconductor layer 120 from the +X-axis direction side to a depth of 0.3 µm by dry etching. Subsequent to dry etching, the manufacturer wet-etches the exposed surface of the n-type semiconductor layer 120 which is exposed by dry etching, and subsequently washes the surface of the n-type semiconductor layer 120. Subsequent to wet etching, the manufacturer removes the etching mask and subsequently washes the surface of the n-type semiconductor layer 120. This series of operations forms the convex 150 in the n-type semiconductor layer 120. According to another embodiment, the manufacturer may not perform wet etching but form the convex 150 only by dry etching.

Figure 5:
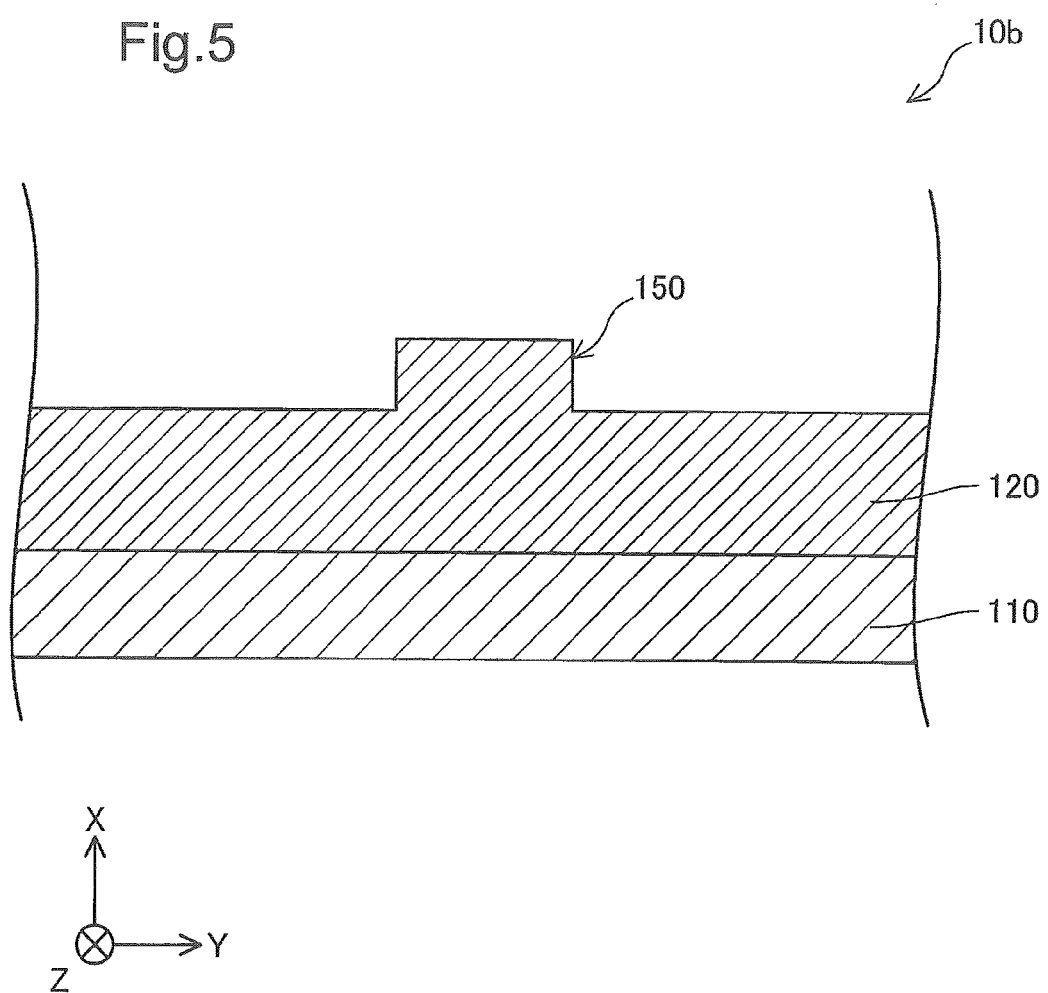
FIG. 5 is a diagram illustrating the structure of a semiconductor device in the middle of manufacture.

FIG. 5 is a diagram illustrating the structure of a semiconductor device 10b in the middle of manufacture. The semiconductor device 10b is produced by dry-etching and wet-etching the n-type semiconductor layer 120 of the semiconductor device 10a (step P 120). The semiconductor device 10b has the n-type semiconductor layer 120 with the convex 150 formed on the +X-axis direction side. According to this embodiment, the height of the convex 150 along the X-axis direction is 0.3 μm.

Referring back to FIG. 3, after formation of the convex 150 (step P120), the manufacturer forms the p-type semiconductor layer 120 by crystal growth on the surface of the +X-axis direction side of the n-type semiconductor layer 120 including the convex 150 (step P130). According to this embodiment, the p-type semiconductor layer 130 is in a shape protruded toward the +X-axis direction side along the convex 150 of the n-type semiconductor layer 120. According to another embodiment, the p-type semiconductor layer 130 may be in a shape having a uniformly flat surface on the +X-axis direction side along the YZ plane.

According to this embodiment, the manufacturer forms the p-type semiconductor layer 130 on the n-type semiconductor layer 120 by crystal growth using the MOCVD apparatus. According to this embodiment, the manufacturer forms the p-type semiconductor layer 130 over the entire surface of the +X-axis direction side of the n-type semiconductor layer 120 by crystal growth. According to this embodiment, the thickness of the p-type semiconductor layer 130 formed by crystal growth (step P130) is 1.0 μm.

Figure 6:
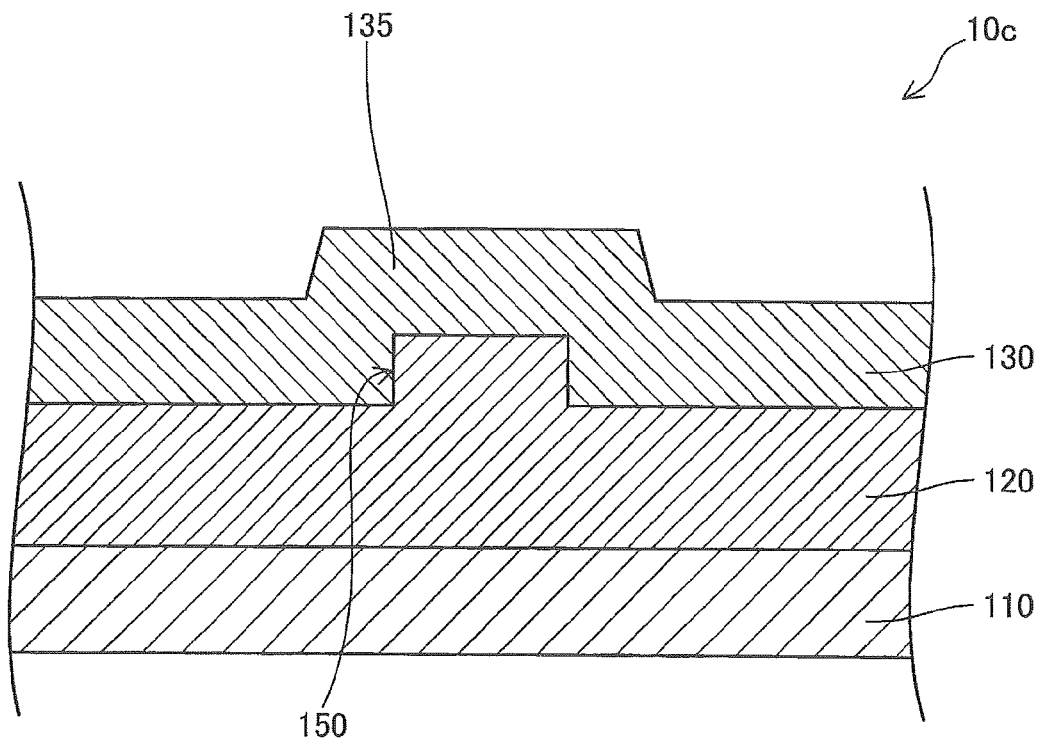
FIG. 6 is a diagram illustrating the structure of a semiconductor device in the middle of manufacture.

FIG. 6 is a diagram illustrating the structure of a semiconductor device 10c in the middle of manufacture. The semiconductor device 10c is produced by crystal growth of the p-type semiconductor layer 130 on the n-type semiconductor layer 120 of the semiconductor device 10b (step P130). The semiconductor device 10c has the p-type semiconductor layer 130 with the projection 135. The projection 135 of the p-type semiconductor layer 130 is a region protruded toward the +X-axis direction side along the convex 150 of the n-type semiconductor layer 120.

Referring back to FIG. 3, after formation of the p-type semiconductor layer 130 (step P130), the manufacturer forms the n-type semiconductor layer 140 by crystal growth on the surface of the +X-axis direction side of the p-type semiconductor layer 130 (step P140). According to this embodiment, the n-type semiconductor layer 140 is in a shape protruded toward the +X-axis direction side along the projection 135 of the p-type semiconductor layer 130. According to another embodiment, the n-type semiconductor layer 140 may be in a shape having a uniformly flat surface on the +X-axis direction side along the YZ plane.

According to this embodiment, the manufacturer forms the n-type semiconductor layer 140 on the p-type semiconductor layer 130 by crystal growth using the MOCVD apparatus. According to this embodiment, the manufacturer forms the n-type semiconductor layer 140 over the entire surface of the +X-axis direction side of the p-type semiconductor layer 130 by crystal growth. According to this embodiment, the thickness of the n-type semiconductor layer 140 formed by crystal growth (step P 140) is 0.3 μm.

Figure 7:
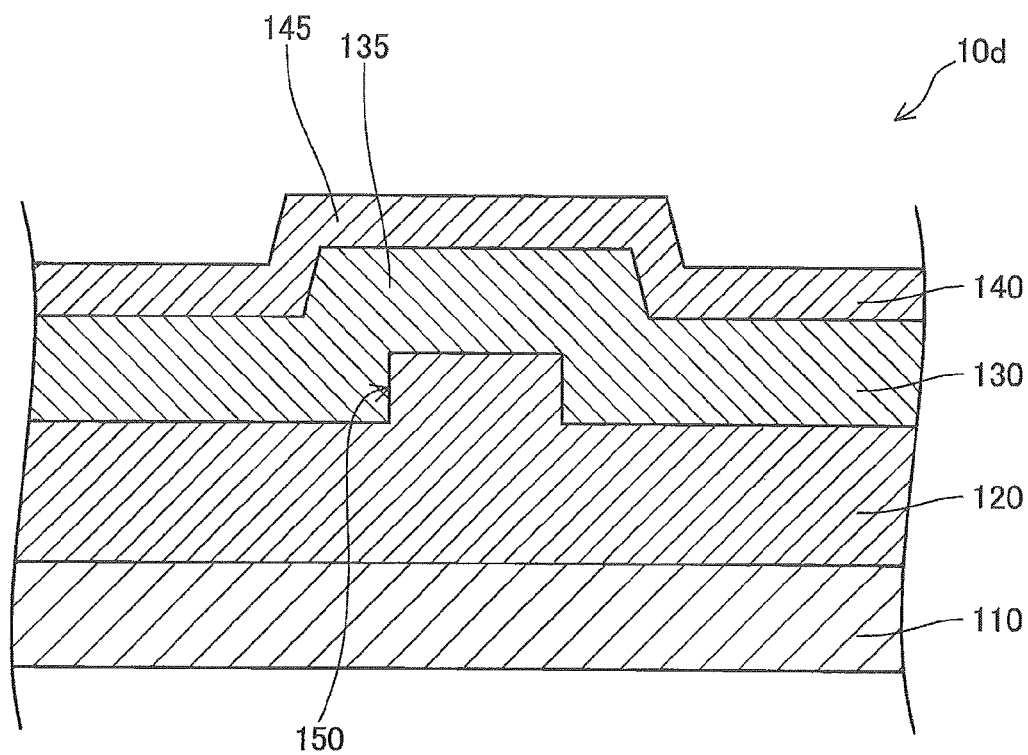
FIG. 7 is a diagram illustrating the structure of a semiconductor device in the middle of manufacture.

FIG. 7 is a diagram illustrating the structure of a semiconductor device 10d in the middle of manufacture. The semiconductor device 10d is produced by crystal growth of the n-type semiconductor layer 140 on the p-type semiconductor layer 130 of the semiconductor device 10c (step P140). The semiconductor device 10d has the n-type semiconductor layer 140 with the projection 145. The projection 145 of the n-type semiconductor layer 140 is a region protruded toward the +X-axis direction side along the projection 135 of the p-type semiconductor layer 130. The projection 145 is also a region protruded toward the +X-axis direction side along the convex 150 of the n-type semiconductor layer 120.

Referring back to FIG. 3, after formation of the n-type semiconductor layer 140 (step P140), the manufacturer forms the trench 170 by dry etching and wet etching (step P150). According to this embodiment, the manufacturer forms an etching mask around a region forming the trench 170 in the n-type semiconductor layer 140 and removes the region from the n-type semiconductor layer 140 through the p-type semiconductor layer 130 into the convex 150 of the n-type semiconductor layer 120 by dry etching. Subsequent to dry etching, the manufacturer wet-etches the exposed surfaces of the respective semiconductor layers which are exposed by dry etching, and subsequently washes the surfaces of the respective semiconductor layers. Subsequent to wet etching, the manufacturer removes the etching mask and subsequently washes the surfaces of the respective semiconductor layers. This series of operations forms the trench 170. According to another embodiment, the manufacturer may not perform wet etching but form the trench 170 only by dry etching.

Figure 8:
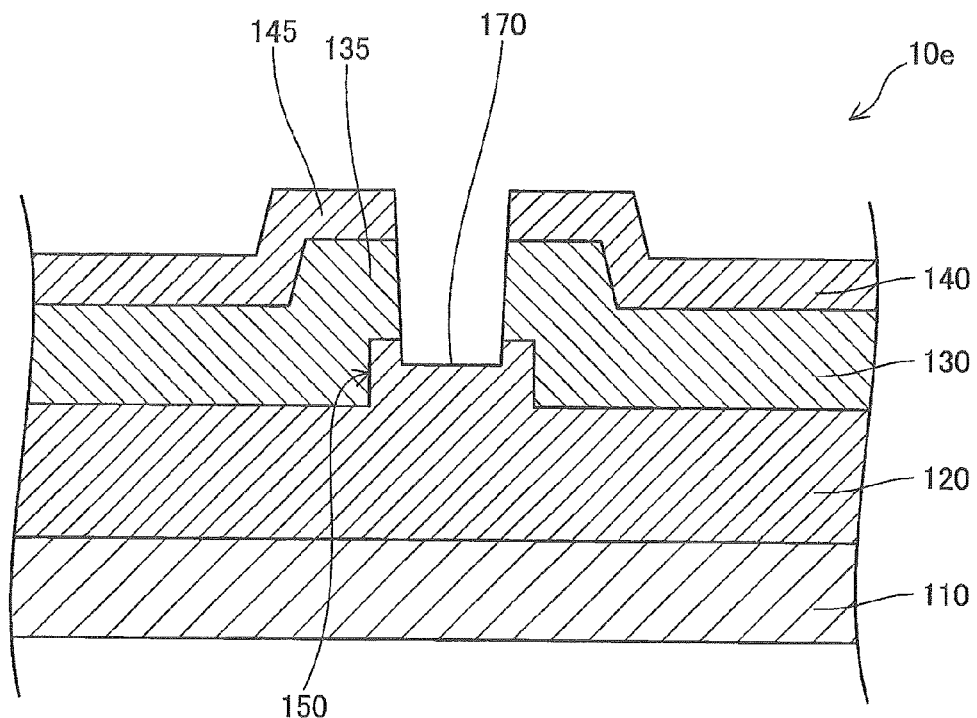
FIG. 8 is a diagram illustrating the structure of a semiconductor device in the middle of manufacture.

FIG. 8 is a diagram illustrating the structure of a semiconductor device 10e in the middle of manufacture. The semiconductor device 10e is produced by dry-etching and wet-etching the semiconductor device 10d (step P150). The semiconductor device 10e has the trench 170 depressed from the n-type semiconductor layer 140 through the p-type semiconductor layer 130 into the convex 150 of the n-type semiconductor layer 120.

Referring back to FIG. 3, after formation of the trench 170 (step P150), the manufacturer performs heating treatment (step P160). In the heating treatment (step P160), the manufacturer heats (anneals) the semiconductor device 10e in an oxygen ($O_2$)-containing gas. This recovers the damage of the respective semiconductor layers by dry etching and activates Mg as the acceptor of the p-type semiconductor layer 130. According to this embodiment, the temperature of the gas used for heating treatment (step P160) is 800° C. According to this embodiment, the heating time of the semiconductor device 10e in the heating treatment (step P160) is 5 minutes.

After the heating treatment (step P160), the manufacturer forms the insulating film 340 on the surface of the trench 170 and the n-type semiconductor layer 140 (step P170).

After formation of the insulating film 340 (step P170), the manufacturer forms the electrodes 210, 230 and 250 in the semiconductor device 10e with the insulating film 340 (step P180). This series of operations completes the semiconductor device 10.

A-3. Evaluation Test

Figure 9:
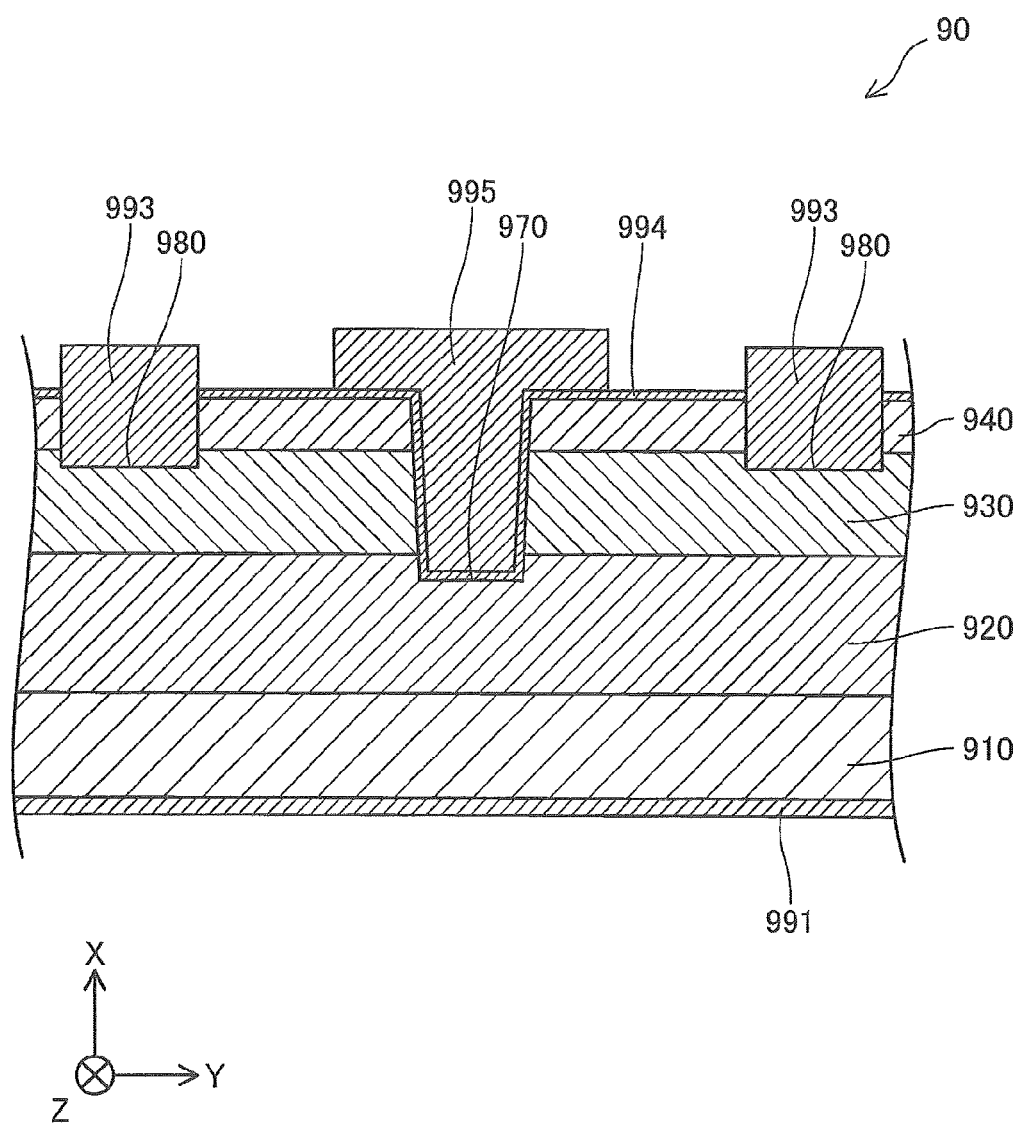
FIG. 9 is a cross sectional view schematically illustrating the structure of a semiconductor device used for an evaluation test.

FIG. 9 is a cross sectional view schematically illustrating the structure of a semiconductor device 90 used for an evaluation test. XYZ axes are shown in FIG. 9 in the same manner as FIG. 1. The semiconductor device 90 includes a substrate 910, an n-type semiconductor layer 920, a p-type semiconductor layer 930, an n-type semiconductor layer 940, electrodes 991, 993 and 995, and an insulating film 994. A trench 970 and recesses 980 are formed in the semiconductor device 90.

The substrate 910 of the semiconductor device 90 is similar to the substrate 110 of the semiconductor device 10.

The n-type semiconductor layer 920 of the semiconductor device 90 is similar to the n-type semiconductor layer 120 of the semiconductor device 10, except the absence of the convex 150.

The p-type semiconductor layer 930 of the semiconductor device 90 is similar to the p-type semiconductor layer 130 of the semiconductor device 10, except the absence of the projection 135.

The n-type semiconductor layer 940 of the semiconductor device 90 is similar to the n-type semiconductor layer 140 of the semiconductor device 10, except the absence of the projection 145.

The trench 970 of the semiconductor device 90 is similar to the trench 170 of the semiconductor device 10, except the trench 970 is depressed from the +X-axis direction side of the n-type semiconductor layer 940 through the p-type semiconductor layer 930 to the n-type semiconductor layer 920.

The recess 980 of the semiconductor device 90 is similar to the recess 180 of the semiconductor device 10, except the recess 980 is depressed from the +X-axis direction side of the n-type semiconductor layer 940 to the p-type semiconductor layer 930.

The electrodes 991, 993 and 995 of the semiconductor device 90 are respectively similar to the electrodes 210, 230 and 250 of the semiconductor device 10. The insulating film 994 is similar to the insulating film 340 of the semiconductor device 10, except that the insulating film 994 is formed on the surface of the trench 970 and the n-type semiconductor layer 940.

Figure 10:
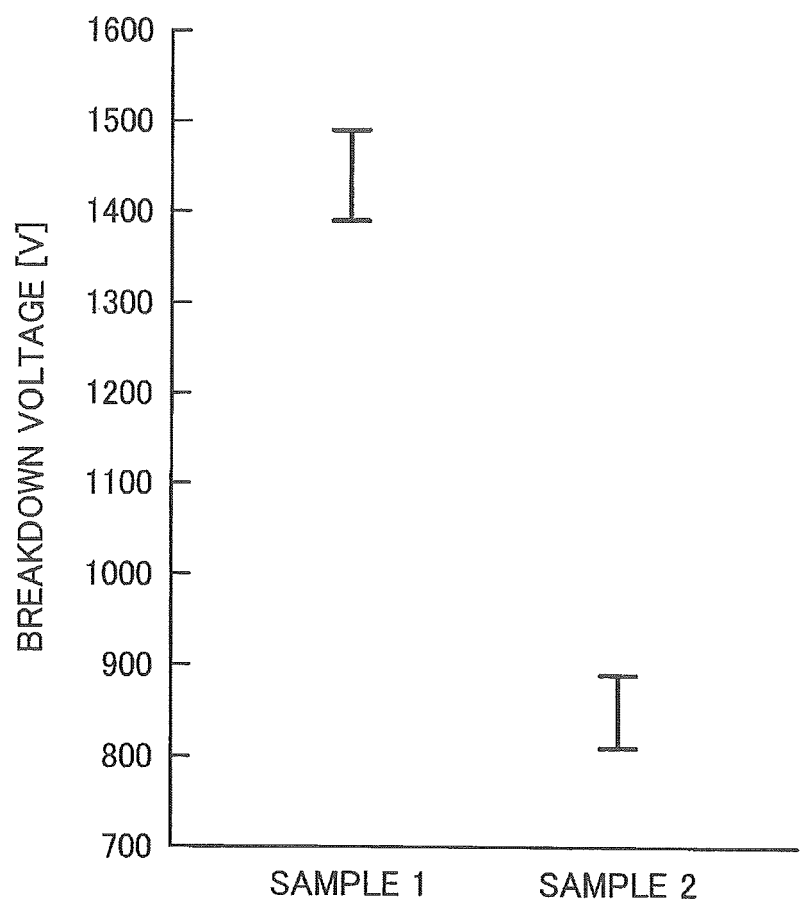
FIG. 10 is a diagram showing the results of the evaluation test.

FIG. 10 is a diagram showing the results of the evaluation test. In the evaluation test of FIG. 10, the tester provided the semiconductor device 10 as sample 1 and the semiconductor device 90 as sample 2. The tester measured the on resistance and the breakdown voltage of the respective samples. As shown in FIG. 10, the breakdown voltage of the semiconductor device 10 was 1400 to 1500 V (volts), while the breakdown voltage of the semiconductor device 90 was 800 to 900 V. In other words, the breakdown voltage of the semiconductor device 10 was increased from the semiconductor device 90 by more than 50%. The on resistance of the semiconductor device 10 was increased from the semiconductor device 90 by 3 to 5%.

A-4. Advantageous Effects

The first embodiment described above relieves the potential crowding in the trench 170 by the p-type semiconductor layer 130. This results in improving the electrical properties of the semiconductor device 10. This also improves the breakdown voltage of the GaN-based semiconductor device 10, which has difficulty in formation of a p-type semiconductor by ion implantation.

The p-type semiconductor layer 130 is formed to relieve the potential crowding in the trench 170 without using ion implantation and selective regrowth. This results in reducing the manufacturing cost. This also reduces an increase in on resistance by diffusion of the dopant of the p-type semiconductor layer 130 into at least one of the n-type semiconductor layer 120 and the n-type semiconductor layer 140.

The height Hm of the convex 150 is less than the total thickness Tu of the thickness Tp of the p-type semiconductor layer 130 and the thickness Tn of the n-type semiconductor layer 140. This improves the crystal quality of the p-type semiconductor layer 130 and the n-type semiconductor layer 140 formed on the convex 150.

The depth h1 in the trench 170 is not less than 0.0 μm and is not greater than the sum of the height Hm of the convex 150 and 0.4 μm. This effectively relieves the potential crowding in the trench 170, while ensuring the flow of the forward current.

The height h2 from the first interface 121 to the trench 170 is not greater than 1.0 μm on the +X-axis direction side and is not greater than 0.4 μm on the −X-axis direction side. This effectively relieves the potential crowding in the trench 170, while reducing an increase in thickness of the n-type semiconductor layer 120.

The distance w1 satisfies 0.1≤μm≤w1≤2.0 μm. This suppresses an increase in on resistance due to the excessively close distance w1, while suppressing an increase in potential crowding in the trench 170 due to the excessively far distance w1.

B. Second Embodiment

Figure 11:
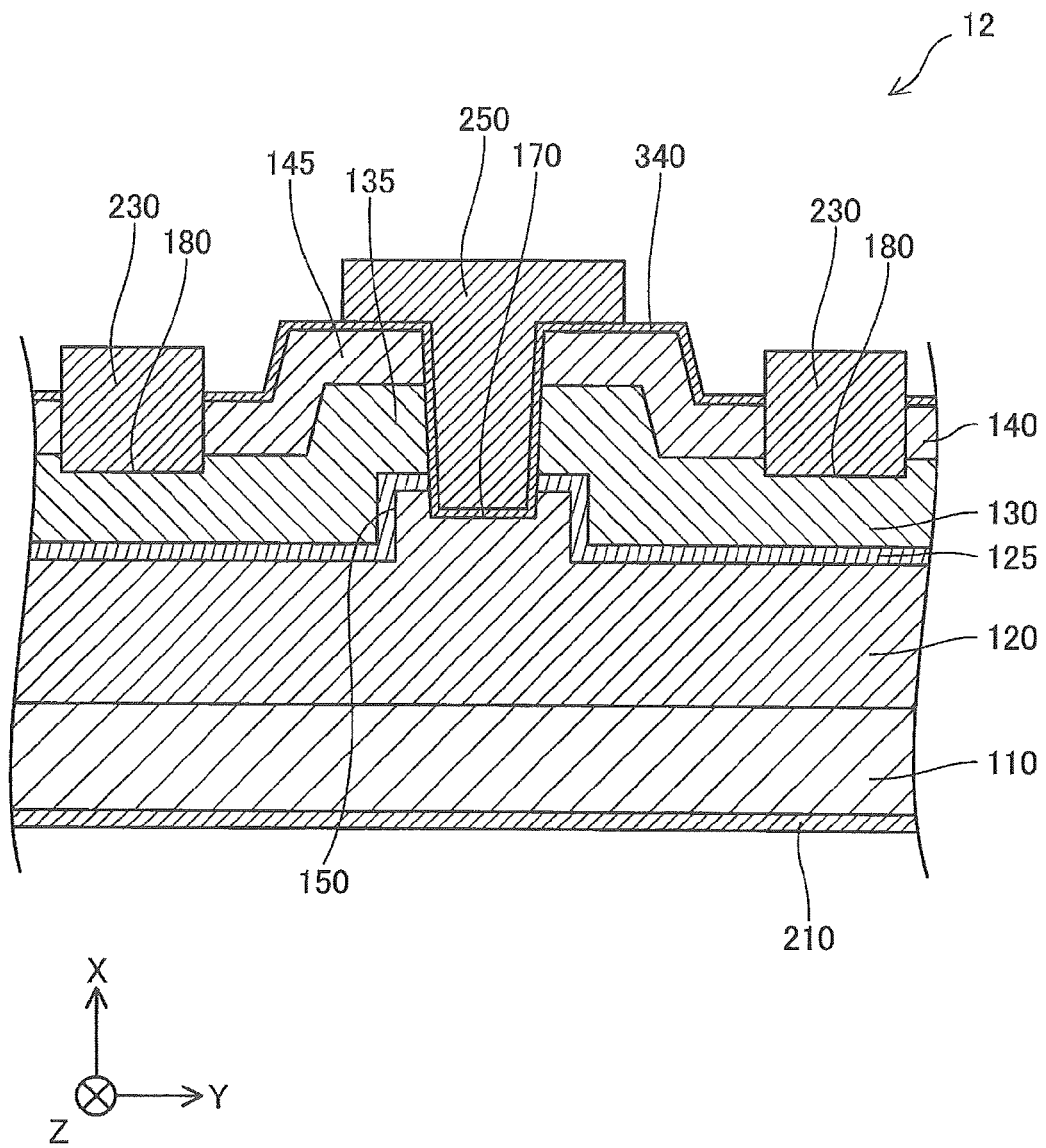
FIG. 11 is a cross sectional view schematically illustrating the structure of a semiconductor device according to a second embodiment.

FIG. 11 is a cross sectional view schematically illustrating the structure of a semiconductor device 12 according to a second embodiment. XYZ axes are shown in FIG. 11 in the same manner as FIG. 1. The semiconductor device 12 of the second embodiment is similar to the semiconductor device 10 of the first embodiment, except addition of another semiconductor layer 125.

The semiconductor layer 125 is a semiconductor layer placed between the n-type semiconductor layer 120 and the p-type semiconductor layer 130 and may be regarded as part of the n-type semiconductor layer 120. According to this embodiment, the semiconductor layer 125 of the semiconductor device 12 is a third n-type semiconductor layer having the lower donor concentration than that of the p-type semiconductor layer 130. According to another embodiment, the semiconductor layer 125 may be an intrinsic semiconductor layer (undoped semiconductor layer) having the lower donor concentration than that of the p-type semiconductor layer 130 or may consist of a plurality of semiconductor layers comprised of at least one of the n-type semiconductor layer and the intrinsic semiconductor layer.

After forming the convex 150 on the n-type semiconductor layer 120 by dry etching and wet etching (step P120), the manufacturer of the semiconductor device 12 forms the semiconductor layer 125 on the n-type semiconductor layer 120, prior to formation of the p-type semiconductor layer 130 (step P130). According to this embodiment, the manufacturer forms the semiconductor layer 125 by crystal growth over the entire surface of the +X-axis direction side of the n-type semiconductor layer 120. The temperature for crystal growth of the semiconductor layer 125 is preferably lower than the temperature for crystal growth of the p-type semiconductor layer 130 by 50° C. to 100° C., in order to obtain the good crystal quality, but may be equal to the temperature for crystal growth of the p-type semiconductor layer 130.

After forming the semiconductor layer 125 on the n-type semiconductor layer 120, the manufacturer of the semiconductor device 12 forms the p-type semiconductor layer 130 by crystal growth on the surface of the +X-axis direction side of the semiconductor layer 125 (step P130).

The second embodiment described above improves the electrical properties of the semiconductor device 12, like the first embodiment. The second embodiment also reduces the manufacturing cost, like the first embodiment. Even when the effect of dry etching and wet etching for formation of the convex 150 (step P120) interferes with crystal growth on the surface of the n-type semiconductor layer 120 (for example, roughness of surface morphology or adhesion of foreign substances on the surface), formation of the semiconductor layer 125 facilitates crystal growth of the p-type semiconductor layer 130. This results in improving the crystal quality of the p-type semiconductor layer 130.

C. Third Embodiment

Figure 12:
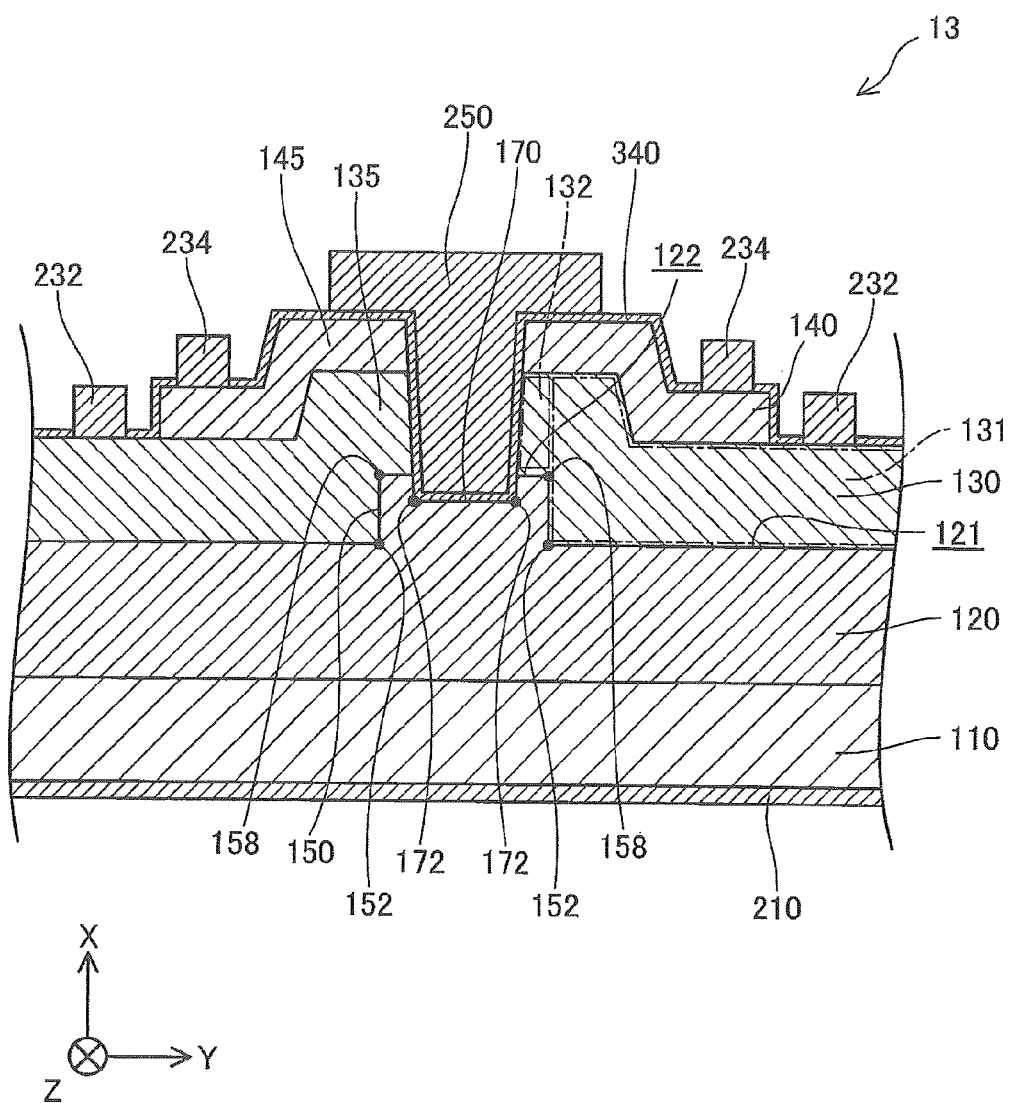
FIG. 12 is a cross sectional view schematically illustrating the structure of a semiconductor device according to a third embodiment.

FIG. 12 is a cross sectional view schematically illustrating the structure of a semiconductor device 13 according to a third embodiment. XYZ axes are shown in FIG. 12 in the same manner as FIG. 1. The semiconductor device 13 of the third embodiment is similar to the semiconductor device 10 of the first embodiment, except replacement of the electrode 230 with an electrode 232 suitable for the p-type semiconductor layer 130 and an electrode 234 suitable for the n-type semiconductor layer 140.

According to this embodiment, the electrode 232 is an electrode made of palladium (Pd). According to this embodiment, the electrode 234 is formed by stacking a layer made of aluminum (Al) on a layer made of titanium (Ti) and firing the stacked layers.

The third embodiment described above improves the electrical properties of the semiconductor device 13, like the first embodiment.

D. Fourth Embodiment

Figure 13:
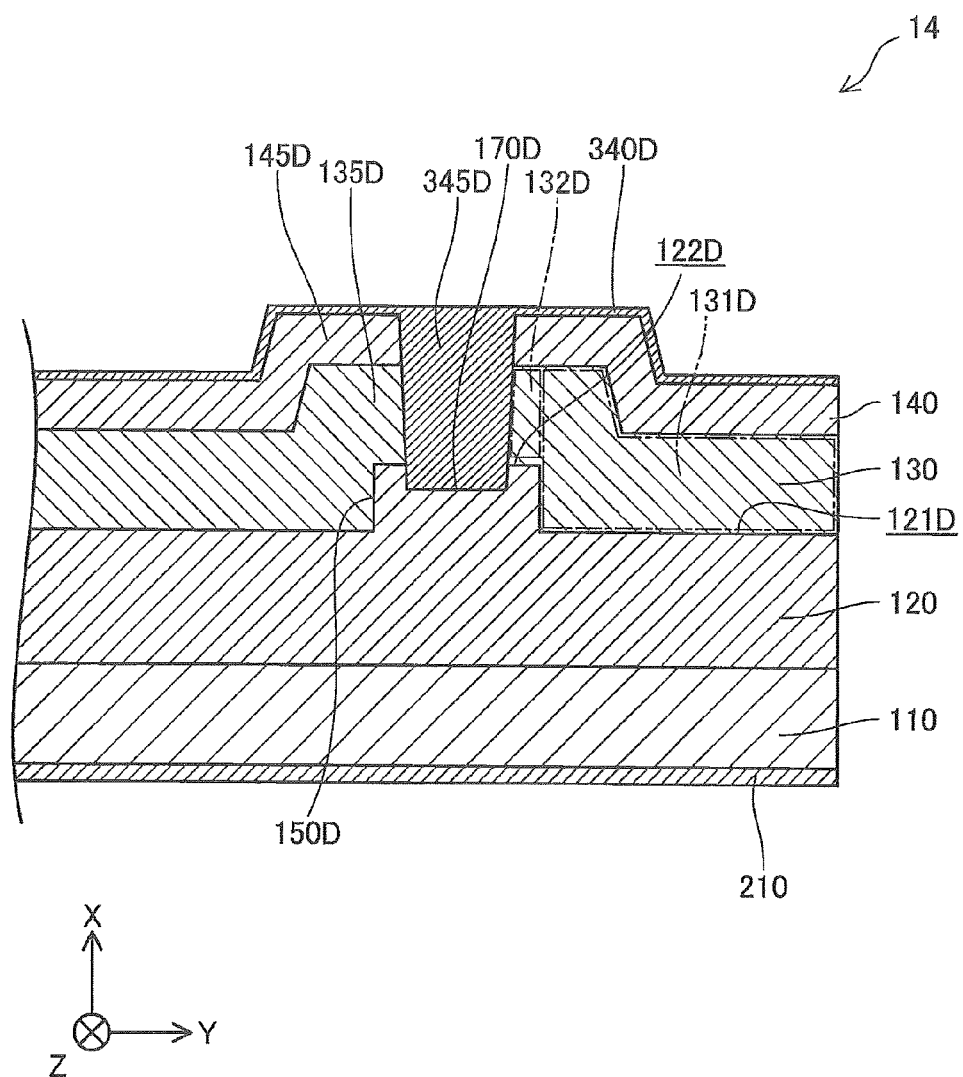
FIG. 13 is a cross sectional view schematically illustrating the structure of a semiconductor device according to a fourth embodiment.

FIG. 13 is a cross sectional view schematically illustrating the structure of a semiconductor device 14 according to a fourth embodiment. XYZ axes are shown in FIG. 13 in the same manner as FIG. 1. The semiconductor device 14 of the fourth embodiment is similar to the semiconductor device 10 of the first embodiment, except a terminal structure using a trench 170D. The semiconductor device 14 includes, as the terminal structure, a convex 150D, a first interface 121D, a second interface 122D, a first region 131D, a second region 132D, a projection 135D, a projection 145D and an insulating film 340D, in addition to the trench 170D.

The convex 150D of the fourth embodiment is similar to the convex 150 of the first embodiment, except that the convex 150D is provided at the location corresponding to the trench 170D.

The first interface 121D of the n-type semiconductor layer 120 is a face in the +X-axis direction and is adjacent to the p-type semiconductor layer 130, like the first interface 121 of the first embodiment. The second interface 122D of the n-type semiconductor layer 120 is similar to the second interface 122 of the first embodiment, except that the second interface 122D is a face in the +X-axis direction to form the upper surface of the convex 150D.

The first region 131D of the p-type semiconductor layer 130 is a part of the p-type semiconductor layer 130 stacked on the first interface 121D of the n-type semiconductor layer 120. The second region 132D of the p-type semiconductor layer 130 is a part of the p-type semiconductor layer 130 stacked on the second interface 122D of the n-type semiconductor layer 120. The first region 131D and the second region 132D are uniformly continuous with each other. According to this embodiment, the acceptor concentration in the first region 131D is equal to the acceptor concentration in the second region 132D. According to another embodiment, the acceptor concentration in the first region 131D may be different from the acceptor concentration in the second region 132D. In this application, the acceptor concentration gradually changes from the first region 131D to the second region 132D.

The projections 135D and 145D of the fourth embodiment are similar to the projections 135 and 145 of the first embodiment, except that the projections 135D and 145D are provided at the locations corresponding to the trench 170D.

The trench 170D of the fourth embodiment is similar to the trench 170 of the first embodiment, except that the trench 170D is a trench having the terminal structure. The trench 170D is a trench depressed from the +X-axis direction side of the n-type semiconductor layer 140 through the p-type semiconductor layer 130 to the n-type semiconductor layer 120. The trench 170D is in a shape depressed into the convex 150D of the n-type semiconductor layer 120. According to other embodiments, the trench 170D may be applied to either of the structures of the second embodiment and the third embodiment.

The insulating film 340D of the fourth embodiment is similar to the insulating film 340 of the first embodiment, except that the insulating film 340D has a filling part 345D filled in the trench 170D. According to another embodiment, an electrode like the electrode 250 of the first embodiment may be provided in the trench 170D, instead of the filling part 345D.

The fourth embodiment described above relieves the potential crowding in the trench 170D by the p-type semiconductor layer 130, like the first embodiment. This results in improving the electrical properties of the semiconductor device 14.

E. Fifth Embodiment

Figure 14:
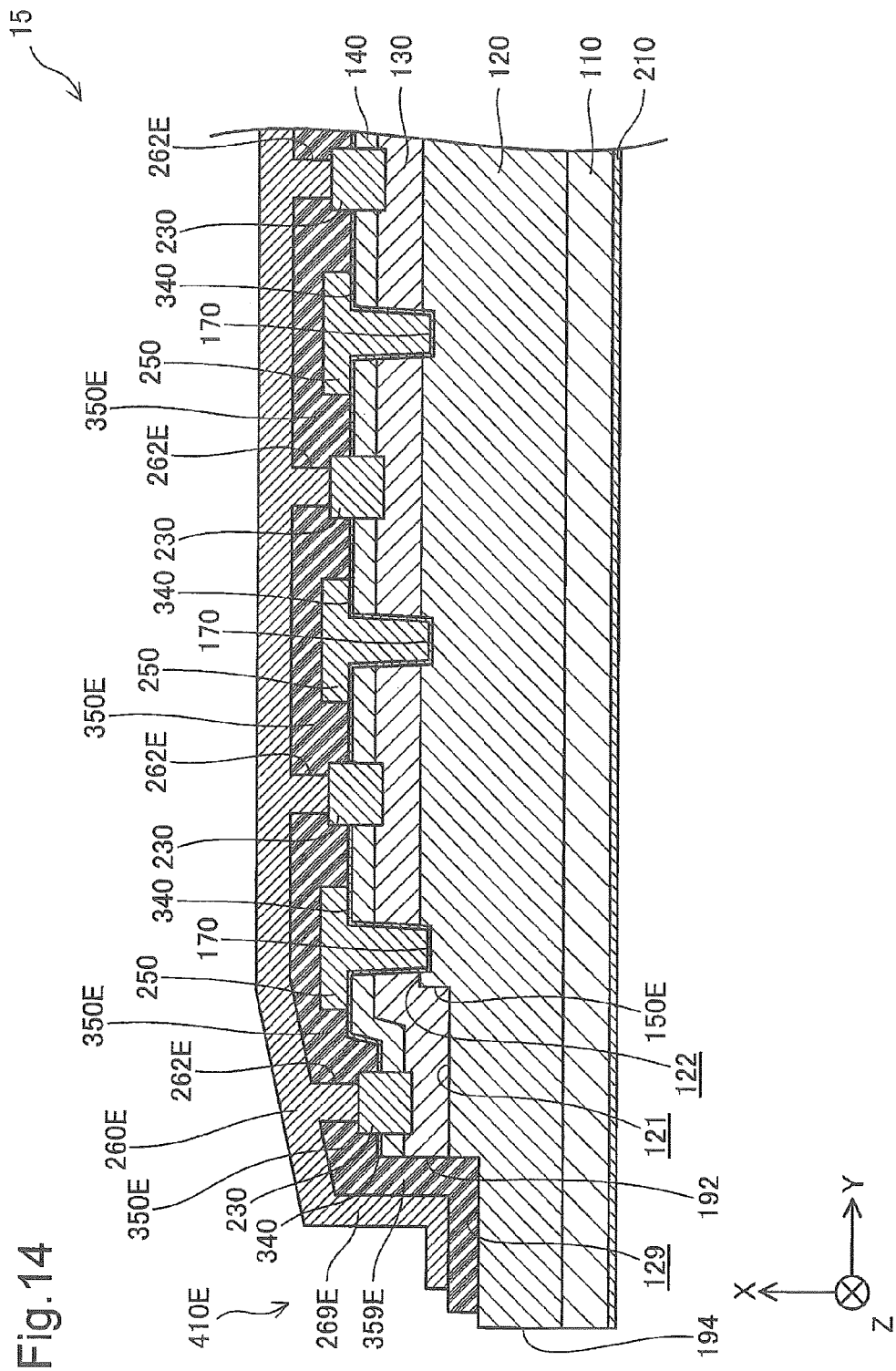
FIG. 14 is a cross sectional view schematically illustrating the structure of a semiconductor device according to a fifth embodiment.

FIG. 14 is a cross sectional view schematically illustrating the structure of a semiconductor device 15 according to a fifth embodiment. XYZ axes are shown in FIG. 14 in the same manner as FIG. 1.

The semiconductor device 15 of the fifth embodiment includes a substrate 110, an n-type semiconductor layer 120, a p-type semiconductor layer 130 and an n-type semiconductor layer 140, like the first embodiment. The semiconductor device 15 has a step portion 192 and a terminal element 194 as the terminal structure on the −Y-axis direction side. According to this embodiment, the semiconductor device 15 also has the terminal structure on the +Y-axis direction side, like the −Y-axis direction side.

The step portion 192 of the semiconductor device 15 forms a difference in level from the n-type semiconductor layer 140 through the p-type semiconductor layer 130 to the n-type semiconductor layer 120. The step portion 192 includes an interface of the n-type semiconductor layer 140 in the −Y-axis direction, an interface of the p-type semiconductor layer 130 in the −Y-axis direction and an interface of the n-type semiconductor layer 120 in the −Y-axis direction.

The terminal element 194 of the semiconductor device 15 forms an end of the semiconductor device 15 located on the −Y-axis direction side of the step portion 192. The terminal element 194 includes an interface of the n-type semiconductor layer 120 in the −Y-axis direction and an interface of the substrate 110 in the −Y-axis direction. The n-type semiconductor layer 120 has an interface 129 in the +X-axis direction between the step portion 192 and the terminal element 194.

The semiconductor device 15 includes an electrode 210, electrodes 230, electrodes 250 and an insulating film 340, like the first embodiment. The semiconductor device 15 has a plurality of the electrodes 230 and a plurality of the electrodes 250, which are alternately arranged in the Y-axis direction. According to this embodiment, the electrodes 230 and the electrodes 250 are respectively extended along the Z-axis direction. According to this embodiment, the plurality of electrodes 250 in the semiconductor device 15 are connected in parallel in a non-illustrated region.

The semiconductor layer 15 has the multi-trench gate structure, in which the electrodes 250 are formed in trenches 170. The n-type semiconductor layer 120 of the semiconductor device 15 has a convex 150E. The convex 150E is protruded from a first interface 121 on the terminal side (−Y-axis direction side) of the end trench 170 located on the terminal side (i.e., −Y-axis direction side where the terminal element 194 is formed) of the semiconductor device 15 among the plurality of trenches 170. According to this embodiment, the convex 150E is a region protruded toward the p-type semiconductor layer 130-side (+X-axis direction side) over the area from the end trench 170 on the side of the terminal structure of the −Y-axis direction side to the end trench 170 on the side of the terminal structure of the +Y-axis direction side.

The semiconductor device 15 further includes an electrode 260E and an insulating film 350E.

The insulating film 350E of the semiconductor device 15 has electrical insulation and covers the interfaces 129, the step portions 192, the electrodes 230, the electrodes 250 and the insulating film 340. The insulating film 350E has regions 359E to cover the step portions 192. According to this embodiment, the insulating film 350E is made of silicon dioxide ($SiO_2$).

The electrode 260E of the semiconductor device 15 has electrical conductivity and is stacked on the insulating film 350E. The electrode 260E is a source wiring electrode having a plurality of connector elements 262E respectively connected with the plurality of electrodes 230. This arrangement causes a plurality of elements corresponding to the plurality of electrodes 250 to be connected in parallel. According to this embodiment, the electrode 260E is made of aluminum (Al).

The electrode 260E also has a region 269E which is arranged such that the insulating film 350E is placed between the region 269E and the step portion 192. The region 269E of the electrode 260E and the region 359E of the insulating film 350E constitute a field plate structure 410E.

The fifth embodiment described above relieves the potential crowding in the trenches 170 on the terminal sides by the p-type semiconductor layer 130, like the first embodiment. This results in improving the electrical properties of the semiconductor device 15.

The first interface 121 which is the pn junction on the terminal side is located on the −X-axis direction side of the end trench 170 on the terminal side and a second interface 122. When a high voltage is applied between the electrode 210 and the electrodes 230, this arrangement causes an avalanche breakdown to occur on the first interface 121 as the pn junction on the terminal side. This protects the trench 170 from being damaged and thereby increases the avalanche resistance.

The field plate structure 410E relieves the potential crowding on the first interface 121 as the pn junction on the terminal side in the step portion 192.

Figure 15:
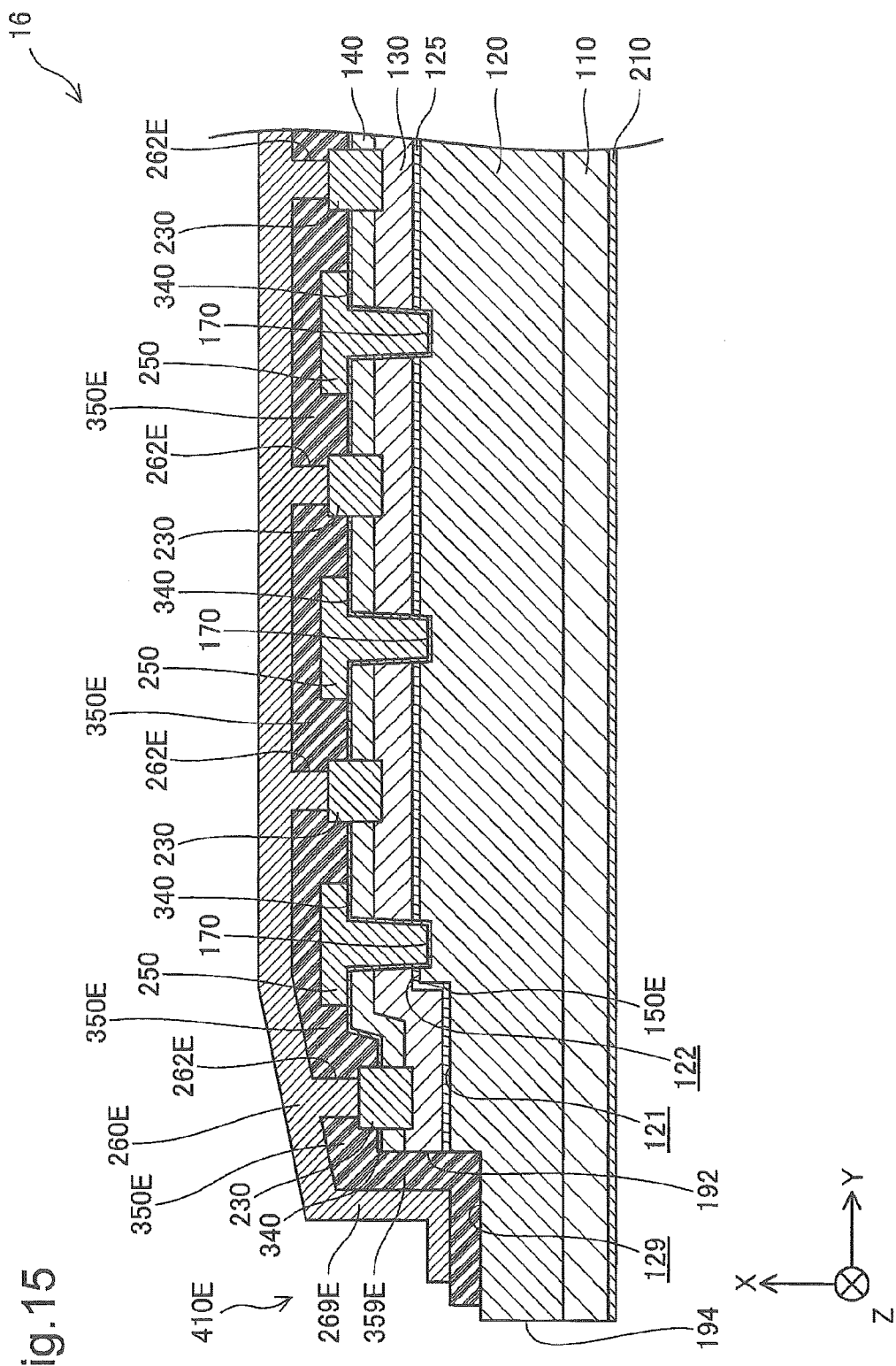
FIG. 15 is a cross sectional view schematically illustrating the structure of a semiconductor device according to a modification of the fifth embodiment.

FIG. 15 is a cross sectional view schematically illustrating the structure of a semiconductor device 16 according to a modification of the fifth embodiment. XYZ axes are shown in FIG. 15 in the same manner as FIG. 1. The semiconductor device 16 is similar to the semiconductor device 15 of FIG. 14, except addition of a semiconductor layer 125 like the second embodiment. Like the fifth embodiment, this modification improves the electrical properties of the semiconductor device 16.

F. Sixth Embodiment

Figure 16:
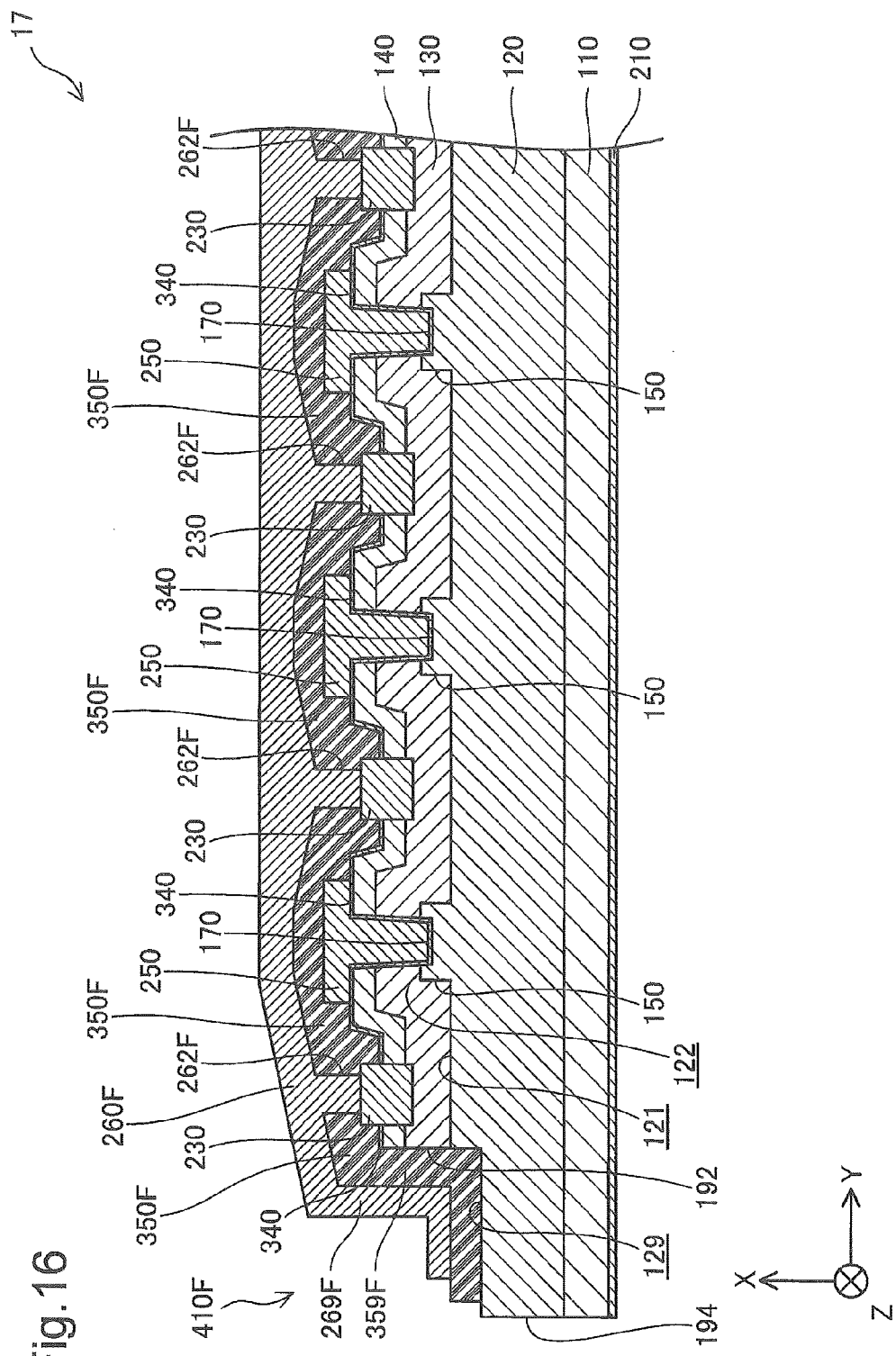
FIG. 16 is a cross sectional view schematically illustrating the structure of a semiconductor device according to a sixth embodiment.

FIG. 16 is a cross sectional view schematically illustrating the structure of a semiconductor device 17 according to a sixth embodiment. XYZ axes are shown in FIG. 16 in the same manner as FIG. 1.

The semiconductor device 17 of the sixth embodiment includes a substrate 110, an n-type semiconductor layer 120, a p-type semiconductor layer 130 and an n-type semiconductor layer 140, like the first embodiment. Like the semiconductor device 15 of the fifth embodiment, the semiconductor device 17 has a step portion 192 and a terminal element 194 as the terminal structure on the −Y-axis direction side. According to this embodiment, the semiconductor device 17 also has the terminal structure on the +Y-axis direction side, like the −Y-axis direction side.

The semiconductor device 17 includes an electrode 210, electrodes 230, electrodes 250 and an insulating film 340, like the first embodiment. The semiconductor device 17 has a plurality of the electrodes 230 and a plurality of the electrodes 250, which are alternately arranged in the Y-axis direction. According to this embodiment, the electrodes 230 and the electrodes 250 are respectively extended along the Z-axis direction. According to this embodiment, the plurality of electrodes 250 in the semiconductor device 17 are connected in parallel in a non-illustrated region.

The semiconductor layer 17 has the multi-trench gate structure, in which the electrodes 250 are formed in trenches 170. The n-type semiconductor layer 120 of the semiconductor device 17 has a plurality of convexes 150 at locations respectively corresponding to the plurality of trenches 170.

The semiconductor device 17 further includes an insulating film 350F and an electrode 260F.

The insulating film 350F of the semiconductor device 17 is similar to the insulating film 350E of the fifth embodiment, except the shape of the insulating film 350F corresponding to the plurality of convexes 150. The insulating film 350F has regions 359F to cover the step portions 192.

The electrode 260F of the semiconductor device 17 is similar to the electrode 260E of the fifth embodiment, except the shape of the electrode 260F corresponding to the plurality of convexes 150. The electrode 260F is a source wiring electrode having a plurality of connector elements 262F respectively connected with the plurality of electrodes 230.

The electrode 260F also has a region 269F which is arranged such that the insulating film 350F is placed between the region 269F and the step portion 192. The region 269F of the electrode 260F and the region 359F of the insulating film 350F constitute a field plate structure 410F.

The sixth embodiment described above relieves the potential crowding in the plurality of trenches 170 by the p-type semiconductor layer 130, like the first embodiment. This results in improving electrical properties of the semiconductor device 17. This also increases the avalanche resistance like the fifth embodiment. The field plate structure 410F relieves the potential crowding on the first interface 121 as the pn junction on the terminal side in the step portion 192.

Figure 17:
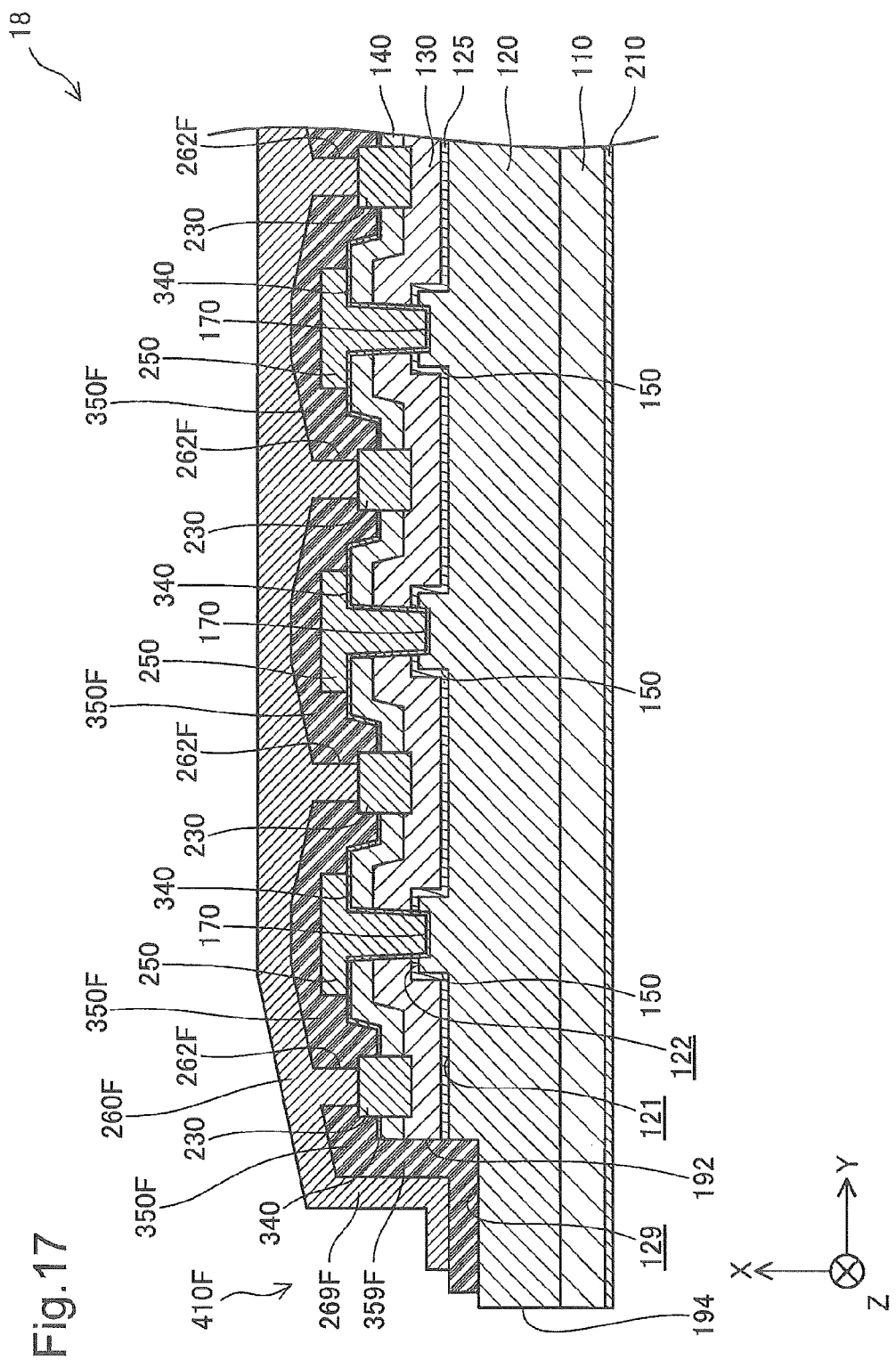
FIG. 17 is a cross sectional view schematically illustrating the structure of a semiconductor device according to a modification of the sixth embodiment.

FIG. 17 is a cross sectional view schematically illustrating the structure of a semiconductor device 18 according to a modification of the sixth embodiment. XYZ axes are shown in FIG. 17 in the same manner as FIG. 1. The semiconductor device 18 is similar to the semiconductor device 17 of FIG. 16, except addition of a semiconductor layer 125 like the second embodiment. Like the sixth embodiment, this modification improves the electrical properties of the semiconductor device 18.

G. Seventh Embodiment

G-1. Structure of Semiconductor Device

Figure 18:
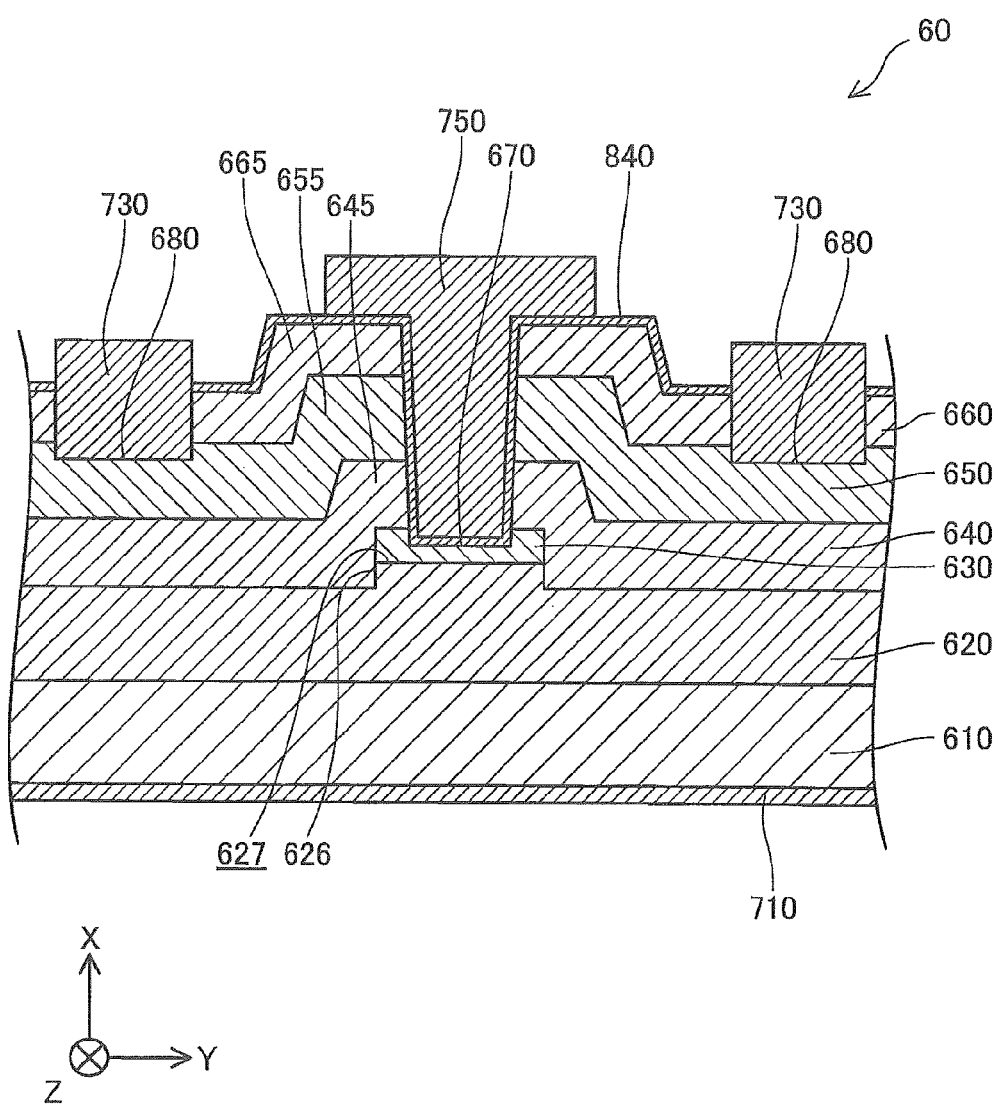
FIG. 18 is a cross sectional view schematically illustrating the structure of a semiconductor device according to a seventh embodiment.

FIG. 18 is a cross sectional view schematically illustrating the structure of a semiconductor device 60 according to a seventh embodiment. The semiconductor device 60 is a GaN-based semiconductor device made by using gallium nitride (GaN). According to this embodiment, the semiconductor device 60 is a trench gate MOSFET (Metal-Oxide-Semiconductor Field-Effect Transistor) used for power control and is also called power device.

The semiconductor device 60 includes a substrate 610, an n-type semiconductor layer 620, a p-type semiconductor layer 630, an n-type semiconductor layer 640, a p-type semiconductor layer 650, an n-type semiconductor layer 660, electrodes 710, 730 and 750, and an insulating film 840. A trench 670 and recesses 680 are formed in the semiconductor device 60. The semiconductor device 60 has the trench gate structure in which the electrode 750 is formed in the trench 670.

XYZ axes orthogonal to one another are shown in FIG. 18. Among the XYZ axes of FIG. 18, the X axis is an axis along the stacking direction in which the n-type semiconductor layer 620 is stacked on the substrate 610. In X-axis direction along the X axis, +X-axis direction is a direction from the substrate 610 toward the n-type semiconductor layer 620, and −X-axis direction is a direction opposed to the +X-axis direction. Among the XYZ axes of FIG. 18, the Y axis and the Z axis are orthogonal to the X axis and are also orthogonal to each other. In Y-axis direction along the Y axis, +Y-axis direction is a direction from the left side toward the right side of the sheet plane of FIG. 18, and −Y-axis direction is a direction opposed to the +Y-axis direction. In Z-axis direction along the Z axis, +Z-axis direction is a direction from the front side toward the back side of the sheet plane of FIG. 18, and −Z-axis direction is a direction opposed to the +Z-axis direction.

The substrate 610 of the semiconductor device 60 is a semiconductor layer extended along the Y axis and the Z axis. According to this embodiment, the substrate 610 is mainly made of gallium nitride (GaN) and contains silicon (Si) as the donor at the higher concentration than that of the n-type semiconductor layer 620. According to this embodiment, the average concentration of Si in the entire area of the substrate 610 is not less than $1.0 \times 10^{18}$ cm$^{-3}$.

The n-type semiconductor layer 620 of the semiconductor device 60 is a first n-type semiconductor layer formed by crystal growth. The n-type semiconductor layer 620 is stacked on the +X-axis direction side of the substrate 610 and is extended along the Y axis and the Z axis. The n-type semiconductor layer 620 is mainly made of gallium nitride (GaN) and contains silicon (Si) as the donor at the lower concentration than that of the n-type semiconductor layer 660. According to this embodiment, the average concentration of Si in the entire area of the n-type semiconductor layer 620 is not greater than $1.0 \times 10^{16}$ cm$^{-3}$. The n-type semiconductor layer 620 is also called "n$^-$-GaN".

The n-type semiconductor layer 620 has a convex 626 protruded toward +X-axis direction side. The convex 626 has an upper surface 627 which is a face in the +X-axis direction. The p-type semiconductor layer 630 is stacked on the upper surface 627 of the convex 626. According to this embodiment, the convex 626 and the p-type semiconductor layer 630 constitute a plateau mesa structure extended in the Z-axis direction. According to this embodiment, the cross section of the mesa structure is in a rectangular shape having the width of the +X-axis direction side equal to the width of the −X-axis direction side. According to this embodiment, the convex 626 and the p-type semiconductor layer 630 constitute the structure formed by dry etching and wet etching.

The p-type semiconductor layer 630 of the semiconductor device 60 is a first p-type semiconductor layer formed by crystal growth. The p-type semiconductor layer 630 is stacked on the upper surface 627 of the convex 626 in the n-type semiconductor layer 620 and is extended along the Y axis and the Z axis. The p-type semiconductor layer 630 is a floating area separated from the p-type semiconductor layer 650 by the n-type semiconductor layer 640. The p-type semiconductor layer 630 is adjacent to the −X-axis direction side of the trench 670. The p-type semiconductor layer 630 is mainly made of gallium nitride (GaN) and contains magnesium (Mg) as the acceptor. According to this embodiment, the average concentration of Mg in the entire area of the p-type semiconductor layer 630 is not less than $1.0 \times 10^{17}$ cm$^{-3}$ and not greater than $1.0 \times 10^{20}$ cm$^{-3}$.

The n-type semiconductor layer 640 of the semiconductor device 60 is a second n-type semiconductor layer formed by crystal growth. The n-type semiconductor layer 640 is stacked over the +X-axis direction side of the n-type semiconductor layer 620 and the p-type semiconductor layer 630 and is extended along the Y axis and the Z axis. The n-type semiconductor layer 640 is mainly made of gallium nitride (GaN) and contains silicon (Si) as the donor at the concentration comparable to that of the n-type semiconductor layer 620. The n-type semiconductor layer 640 is also called "n$^-$-GaN".

The n-type semiconductor layer 640 has a projection 645. The projection 645 is a first projection protruded along the convex 626 of the n-type semiconductor layer 620 and the p-type semiconductor layer 630 toward the protruding direction of the convex 626 (+X-axis direction). According to this embodiment, the n-type semiconductor layer 640 is parted at the projection 645 by the trench 670.

The p-type semiconductor layer 650 of the semiconductor device 60 is a second p-type semiconductor layer formed by crystal growth. The p-type semiconductor layer 650 is stacked on the +X-axis direction side of the n-type semiconductor layer 640 and is extended along the Y axis and the Z axis. The p-type semiconductor layer 650 is mainly made of gallium nitride (GaN) and contains magnesium (Mg) as the acceptor. According to this embodiment, the average concentration of Mg in the entire area of the p-type semiconductor layer 650 is not less than $1.0 \times 10^{17}$ cm$^{-3}$ and not greater than $1.0 \times 10^{20}$ cm$^{-3}$. The p-type semiconductor layer 650 is also called "p-GaN".

The p-type semiconductor layer 650 has a projection 655. The projection 655 is a second projection protruded along the projection 645 of the n-type semiconductor layer 640 toward the +X-axis direction. According to this embodiment, the p-type semiconductor layer 650 is parted at the projection 655 by the trench 670.

The n-type semiconductor layer 660 of the semiconductor device 60 is a third n-type semiconductor layer formed by crystal growth. The n-type semiconductor layer 660 is stacked on the +X-axis direction side of the p-type semiconductor layer 650 and is extended along the Y axis and the Z axis. The n-type semiconductor layer 660 is mainly made of gallium nitride (GaN) and contains silicon (Si) as the donor at the higher concentration than those of the n-type semiconductor layer 620 and the n-type semiconductor layer 640. According to this embodiment, the average concentration of Si in the entire area of the n-type semiconductor layer 660 is not less than $3.0 \times 10^{18}$ cm$^{-3}$. The n-type semiconductor layer 660 is also called "n$^+$-GaN".

The n-type semiconductor layer 660 has a projection 665. The projection 665 is a third projection protruded along the projection 655 of the p-type semiconductor layer 650 toward the +X-axis direction. According to this embodiment, the n-type semiconductor layer 660 is parted at the projection 665 by the trench 670.

The trench 670 of the semiconductor device 60 is a trench depressed from the +X-axis direction side of the n-type semiconductor layer 660 through the p-type semiconductor layer 650 and the n-type semiconductor layer 640 to the p-type semiconductor layer 630. According to this embodiment, the trench 670 is in a shape depressed into the p-type semiconductor layer 630. According to this embodiment, the trench 670 is in a shape extended in the Z-axis direction. According to this embodiment, the trench 670 is formed by wet etching subsequent to dry etching.

The insulating film 840 is formed on the surface of the trench 670 to the +X-axis direction side of the n-type semiconductor layer 660. According to this embodiment, the insulating film 840 is made of silicon dioxide (SiO$_2$).

The recess 680 of the semiconductor device 60 is formed by dry etching and wet etching and is a recess depressed from the +X-axis direction side of the n-type semiconductor layer 660 to the p-type semiconductor layer 650.

The electrode 710 of the semiconductor device 60 is a drain electrode formed on the −X-axis direction side of the substrate 610. According to this embodiment, the electrode 710 is formed by stacking a layer of aluminum (Al) on a layer of titanium (Ti) and subsequently firing the stacked layers.

The electrode 730 of the semiconductor device 60 is a source electrode formed in the recess 680. According to this embodiment, the electrode 730 is formed by stacking a layer of titanium (Ti) and a layer of aluminum (Al) on a layer of palladium (Pd) and subsequently firing the stacked layers.

The electrode 750 of the semiconductor device 60 is a gate electrode formed in the trench 670 via the insulating film 840. According to this embodiment, the electrode 750 is made of aluminum (Al).

Figure 19:
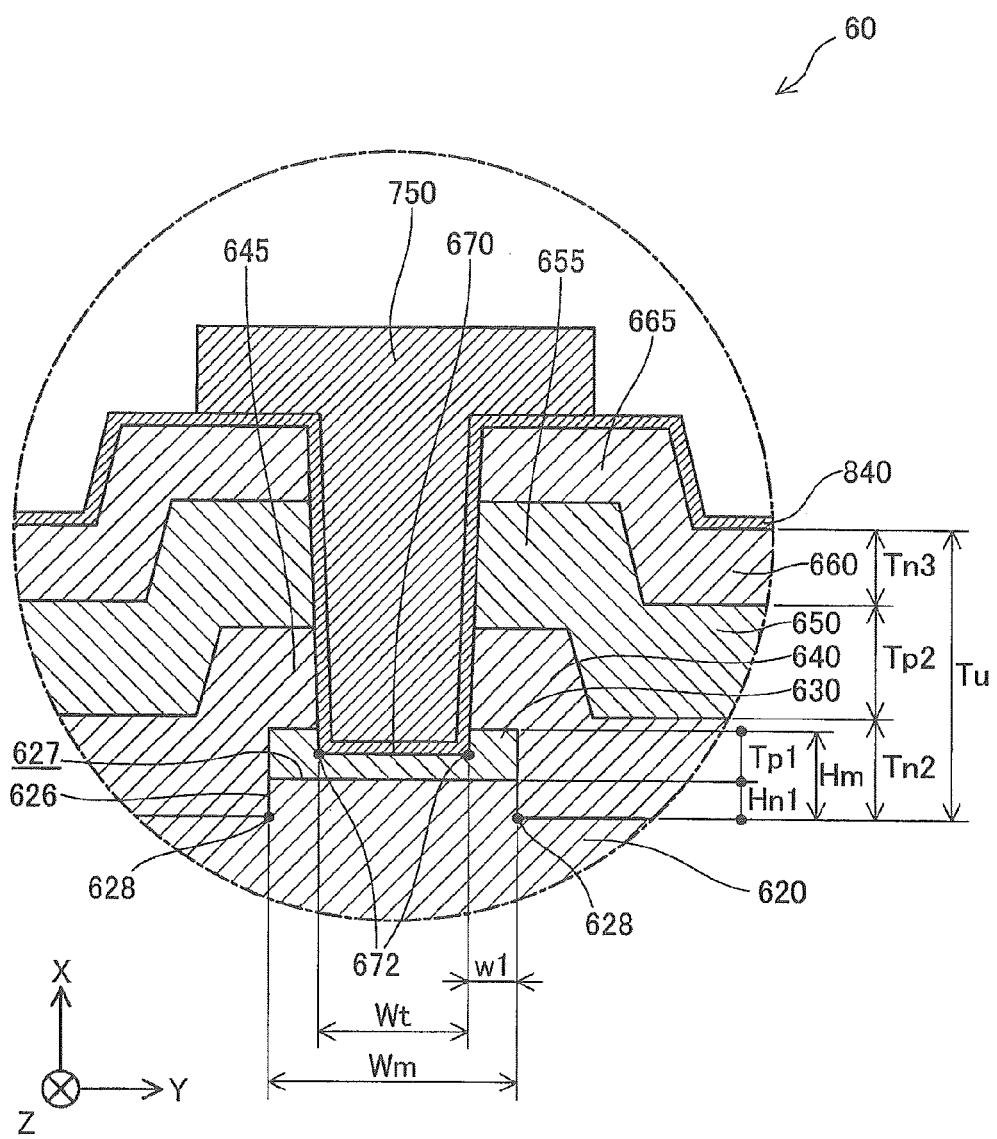
FIG. 19 is an enlarged cross sectional view schematically illustrating the structure of the semiconductor device, focusing around a trench.

FIG. 19 is an enlarged cross sectional view schematically illustrating the structure of the semiconductor device 60, focusing around the trench 670. XYZ axes are shown in FIG. 19, in the same manner as FIG. 18.

The trench 670 has a locus 672 as a bottom end of the trench 670. The convex 626 located on the −X-axis direction side of the trench 670 has a locus 628. The locus 628 of the convex 626 is the starting point at which the convex 626 is protruded in the +X-axis direction. The locus 628 is also a lateral end of the convex 626.

According to this embodiment, the trench 670 is in a shape depressed into the p-type semiconductor layer 630. The width Wt of the bottom face of the trench 670 along the Y-axis direction is less than the width Wm of the convex 626 and the p-type semiconductor layer 630 along the Y-axis direction. In other words, the convex 626 and the p-type semiconductor layer 630 are wider than the bottom face of the trench 670.

In terms of suppressing an increase in on resistance of the semiconductor device 60 due to a depletion layer extended on the n-type semiconductor layer 640 by the effect of the p-type semiconductor layer 630, a distance w1 between the locus 628 and the locus 672 along the Y-axis direction is preferably not greater than 0.5 μm (micrometer) and is more preferably not greater than 0.25 μm. According to this embodiment, the width Wm is 2.0 μm, the width Wt is 1.5 μm, and the distance w1 is 0.25 μm.

In terms of sufficiently reliving the potential crowding at the locus 672 in the trench 670 by the p-type semiconductor layer 630, the thickness Tp1 of the p-type semiconductor layer 630 along the X-axis direction is preferably not less than 0.1 μm. In terms of improving the crystal quality of the respective semiconductor layers formed on the convex 626 and the p-type semiconductor layer 630, it is preferable that a height Hm as the sum of the height Hn1 of the convex 626 and the thickness Tp1 of the p-type semiconductor layer 630 is less than a total thickness Tu of the thickness Tn2 of the n-type semiconductor layer 640, the thickness Tp2 of the p-type semiconductor layer 650 and the thickness Tn3 of the n-type semiconductor layer 660.

In terms of ensuring the crystal quality around the convex 626, the thickness Tn2 of the n-type semiconductor layer 640 along the X-axis direction is preferably not less than the thickness Tp1 of the p-type semiconductor layer 630. In terms of suppressing an increase in on resistance of the semiconductor device 60 due to a depletion layer extended on the n-type semiconductor layer 640 by the effect of the p-type semiconductor layer 630, the thickness Tn2 of the n-type semiconductor layer 640 is preferably not less than 0.2 μm and is more preferably not less than 0.5 μm. In terms of the manufacturing cost, the thickness Tn2 of the n-type semiconductor layer 640 is preferably not greater than 1.0 μm.

G-2. Manufacturing Method of Semiconductor Device

Figure 20:
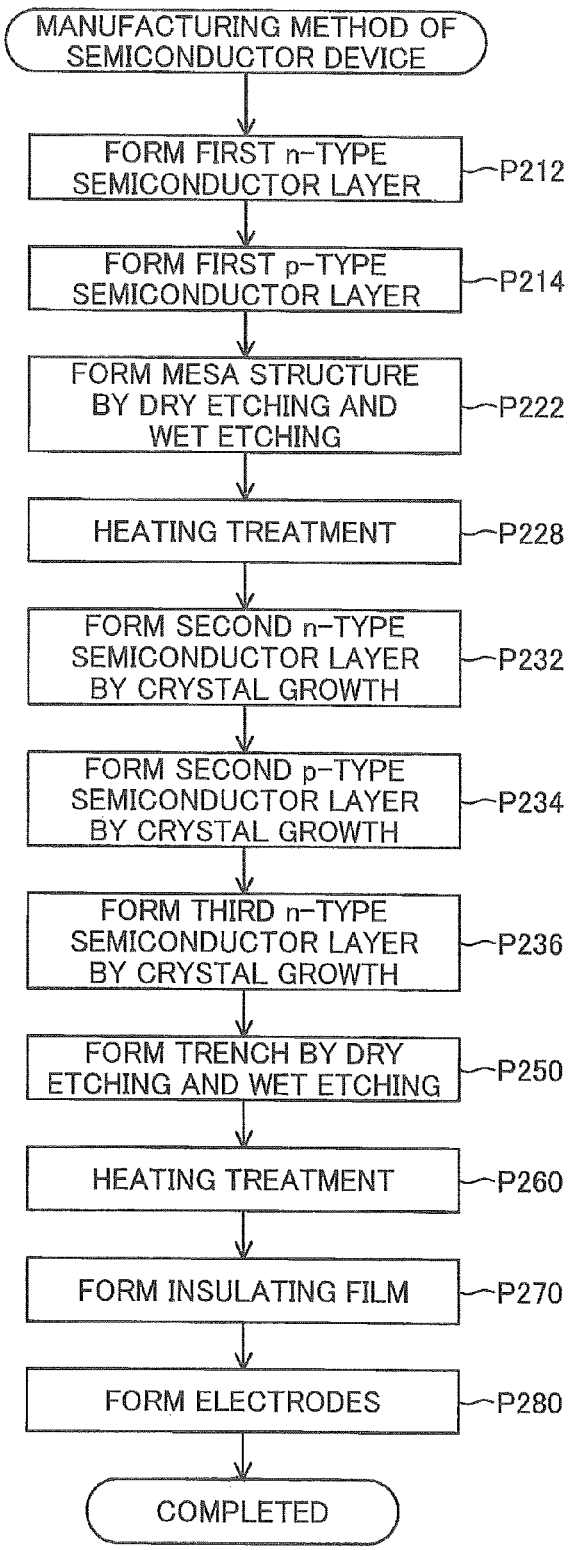
FIG. 20 is a flowchart showing a manufacturing method of the semiconductor device.

FIG. 20 is a flowchart showing a manufacturing method of the semiconductor device 60. In the process of manufacturing the semiconductor device 60, the manufacture first forms the n-type semiconductor layer 620 on the substrate 610 by crystal growth (step P212). According to this embodiment, the manufacturer forms the n-type semiconductor layer 620 by crystal growth using an MOCVD apparatus that employs metalorganic chemical vapor deposition method (MOCVD). According to this embodiment, the thickness of the n-type semiconductor layer 620 formed by crystal growth (step P212) is 9.5 μm.

After formation of the n-type semiconductor layer 620 (step P212), the manufacturer forms the p-type semiconductor layer 630 on the n-type semiconductor layer 620 by crystal growth (step P214). According to this embodiment, the manufacturer forms the p-type semiconductor layer 630 by crystal growth using the MOCVD apparatus. According to this embodiment, the manufacturer forms the p-type semiconductor layer 630 over the entire surface of the +X-axis direction side of the n-type semiconductor layer 620. According to this embodiment, the thickness of the p-type semiconductor layer 630 formed by crystal growth (step P214) is 0.2 μm.

Figure 21:
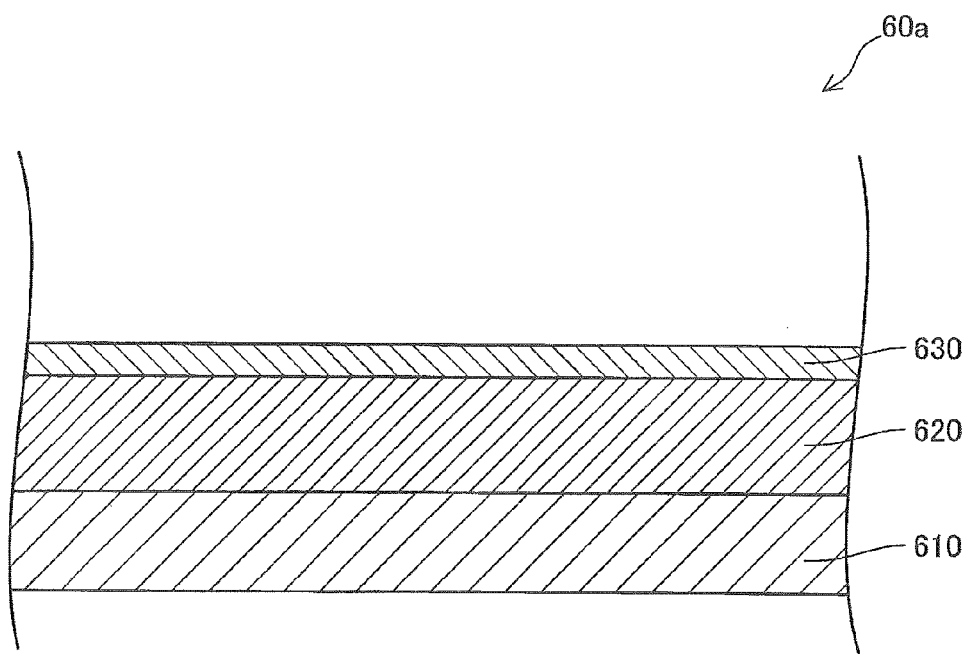
FIG. 21 is a diagram illustrating the structure of a semiconductor device in the middle of manufacture.

FIG. 21 is a diagram illustrating the structure of a semiconductor device 60a in the middle of manufacture. The semiconductor device 60a is produced by crystal growth of the n-type semiconductor layer 620 (step P212) and the p-type semiconductor layer 630 (step P214). The semiconductor device 60a has the structure in which the n-type semiconductor layer 620 and the p-type semiconductor layer 630 are sequentially stacked on the substrate 610.

Referring back to FIG. 20, after formation of the p-type semiconductor layer 630 (step P214), the manufacturer forms the convex 626 with the p-type semiconductor layer 630 stacked on its upper surface 627 in the n-type semiconductor layer 620 by dry etching and wet etching the n-type semiconductor layer 620 and the p-type semiconductor layer 630 (step P222). According to this embodiment, the manufacturer forms an etching mask in a part corresponding to the convex 626 on the +X-axis direction side surface of the p-type semiconductor layer 630 and subsequently removes a region from the +X-axis direction side of the p-type semiconductor layer 630 to a depth of 0.3 μm by dry etching. Subsequent to dry etching, the manufacturer wet-etches the exposed surfaces of the n-type semiconductor layer 620 and the p-type semiconductor layer 630 which are exposed by dry etching, and subsequently washes the surfaces of the n-type semiconductor layer 620 and the p-type semiconductor layer 630. Subsequent to wet etching, the manufacturer removes the etching mask and subsequently washes the surfaces of the n-type semiconductor layer 620 and the p-type semiconductor layer 630. This series of operations forms the convex 626 in the n-type semiconductor layer 620 and causes the p-type semiconductor layer 630 to remain on the upper surface 627 of the convex 626. According to another embodiment, the manufacturer may not perform wet etching but form the convex 626 with the p-type semiconductor layer 630 only by dry etching.

Figure 22:
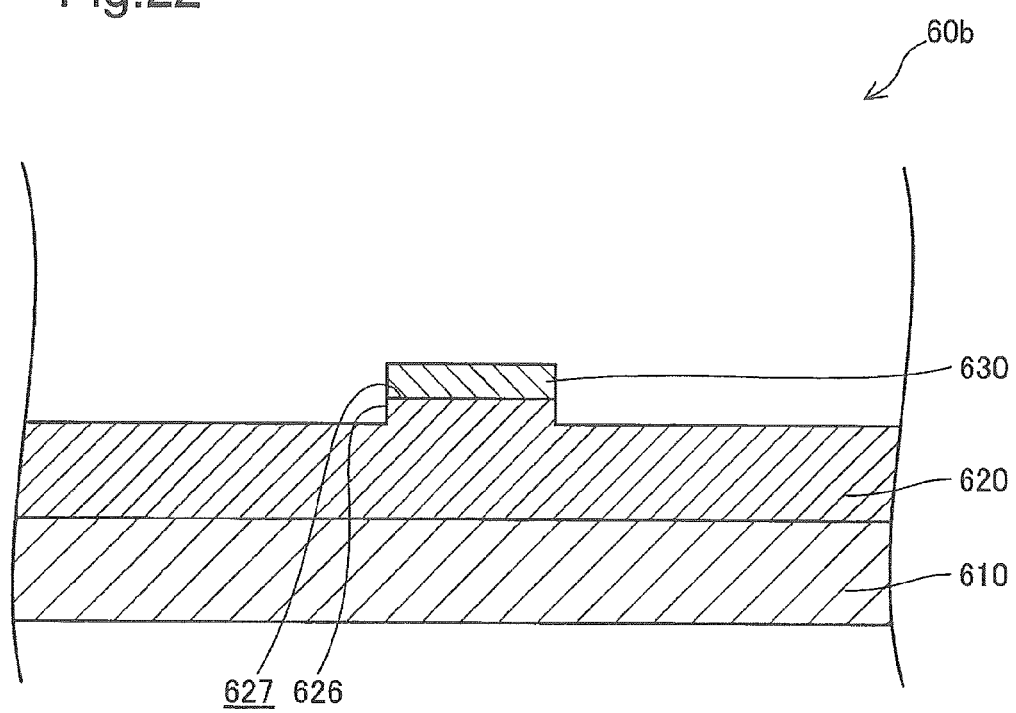
FIG. 22 is a diagram illustrating the structure of a semiconductor device in the middle of manufacture.

FIG. 22 is a diagram illustrating the structure of a semiconductor device 60b in the middle of manufacture. The semiconductor device 60b is produced by dry etching and wet etching the semiconductor device 60a (step P222). The semiconductor device 60b has the n-type semiconductor layer 620 with the convex 626 formed on the +X-axis direction side.

The p-type semiconductor layer 630 is stacked on the upper surface 627 of the convex 626.

Referring back to FIG. 20, after dry etching and wet etching (step P222), the manufacturer performs heating treatment (step P228). In the heating treatment (step P228), the manufacturer heats (anneals) the semiconductor device 60b in an oxygen ($O_2$)-containing gas. This recovers the damage of the respective semiconductor layers by dry etching and activates Mg as the acceptor of the p-type semiconductor layer 630. According to this embodiment, the temperature of the gas used for heating treatment (step P228) is 800° C. According to this embodiment, the heating time of the semiconductor device 60b in the heating treatment (step P228) is 5 minutes. According to another embodiment, the manufacture may not perform heating treatment (step P228).

After heating treatment (step P228), the manufacture forms the n-type semiconductor layer 640 by crystal growth on the respective +X-axis direction side surfaces of the n-type semiconductor layer 620 and the p-type semiconductor layer 630 (step P232). According to this embodiment, the n-type semiconductor layer 640 is in a shape protruded toward the +X-axis direction side along the convex 626 of the n-type semiconductor layer 620 and the p-type semiconductor layer 630. According to another embodiment, the n-type semiconductor layer 640 may be in a shape having a uniformly flat surface on the +X-axis direction side along the YZ plane.

According to this embodiment, the manufacturer forms the n-type semiconductor layer 640 by crystal growth using the MOCVD apparatus. According to this embodiment, the manufacturer forms the n-type semiconductor layer 640 over the entire surface on the +X-axis direction side of the n-type semiconductor layer 620 and the p-type semiconductor layer 630. According to this embodiment, the thickness of the n-type semiconductor layer 640 formed by crystal growth (step P232) is 0.5 μm.

Figure 23:
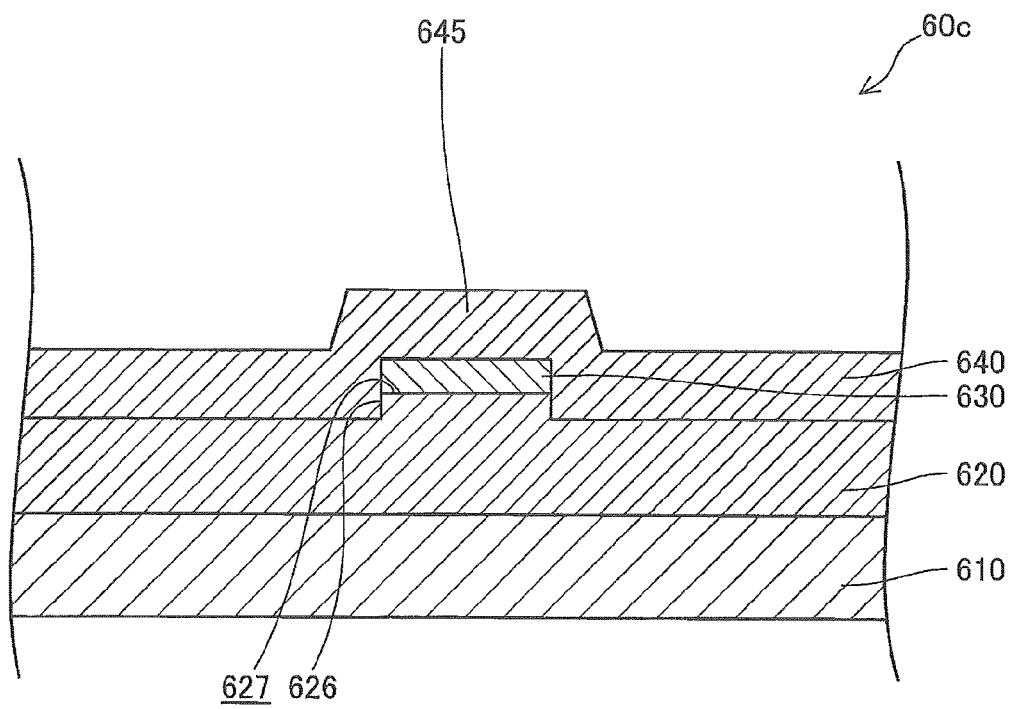
FIG. 23 is a diagram illustrating the structure of a semiconductor device in the middle of manufacture.

FIG. 23 is a diagram illustrating the structure of a semiconductor device 60c in the middle of manufacture. The semiconductor device 60c is produced by crystal growth on the semiconductor device 60b (step P232). According to this embodiment, the semiconductor device 60c has the n-type semiconductor layer 640 with the projection 645. The projection 645 of the n-type semiconductor layer 640 is a region protruded toward the +X-axis direction side along the convex 626 of the n-type semiconductor layer 620 and the p-type semiconductor layer 630.

Referring back to FIG. 20, after crystal growth (step P232), the manufacturer forms the p-type semiconductor layer 650 by crystal growth on the +X-axis direction side surface of the n-type semiconductor layer 640 (step P234). According to this embodiment, the p-type semiconductor layer 650 is in a shape protruded toward the +X-axis direction side along the projection 645 of the n-type semiconductor layer 640. According to another embodiment, the p-type semiconductor layer 650 may be in a shape having a uniformly flat surface on the +X-axis direction side along the YZ plane.

According to this embodiment, the manufacturer forms the p-type semiconductor layer 650 by crystal growth using the MOCVD apparatus. According to this embodiment, the manufacturer forms the p-type semiconductor layer 650 over the entire surface on the +X-axis direction side of the n-type semiconductor layer 640. According to this embodiment, the thickness of the p-type semiconductor layer 650 formed by crystal growth (step P234) is 1.0 μm.

Figure 24:
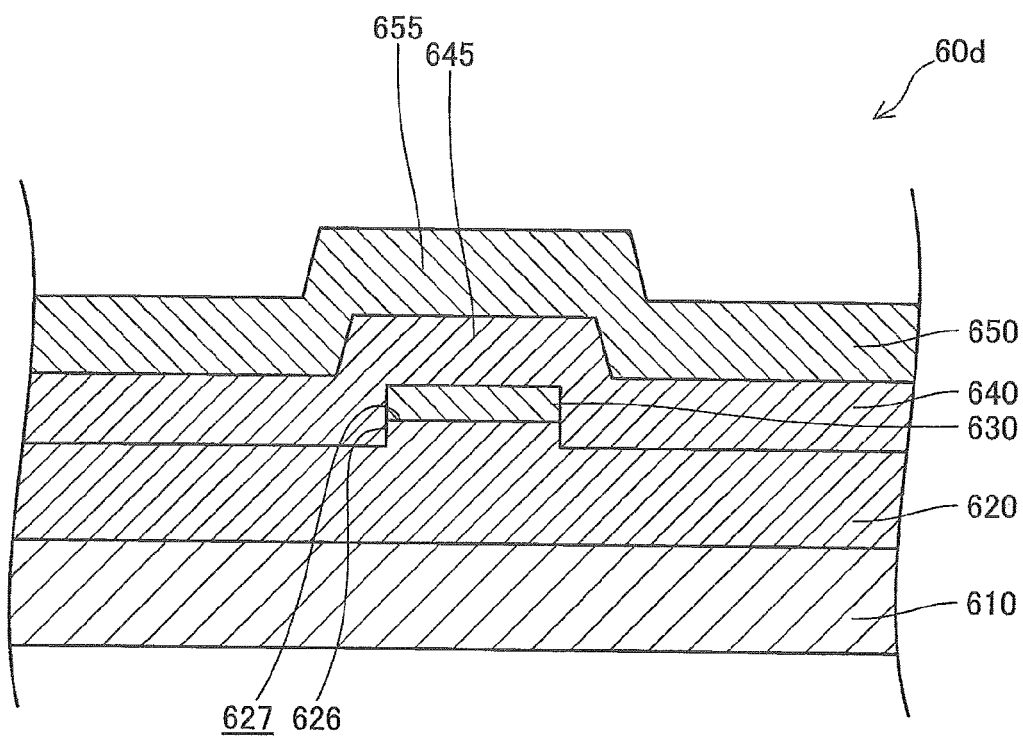
FIG. 24 is a diagram illustrating the structure of a semiconductor device in the middle of manufacture.

FIG. 24 is a diagram illustrating the structure of a semiconductor device 60d in the middle of manufacture. The semiconductor device 60d is produced by crystal growth on the semiconductor device 60c (step P234). According to this embodiment, the semiconductor device 60d has the p-type semiconductor layer 650 with the projection 655. The projection 655 of the p-type semiconductor layer 650 is a region protruded toward the +X-axis direction side along the projection 645 of the n-type semiconductor layer 640.

Referring back to FIG. 20, after crystal growth (step P234), the manufacturer forms the n-type semiconductor layer 660 by crystal growth on the +X-axis direction side surface of the p-type semiconductor layer 650 (step P236). According to this embodiment, the n-type semiconductor layer 660 is in a shape protruded toward the +X-axis direction side along the projection 655 of the p-type semiconductor layer 650. According to another embodiment, the p-type semiconductor layer 660 may be in a shape having a uniformly flat surface on the +X-axis direction side along the YZ plane.

According to this embodiment, the manufacturer forms the n-type semiconductor layer 660 by crystal growth using the MOCVD apparatus. According to this embodiment, the manufacturer forms the n-type semiconductor layer 660 over the entire surface on the +X-axis direction side of the p-type semiconductor layer 650. According to this embodiment, the thickness of the n-type semiconductor layer 660 formed by crystal growth (step P236) is 0.3 μm.

Figure 25:
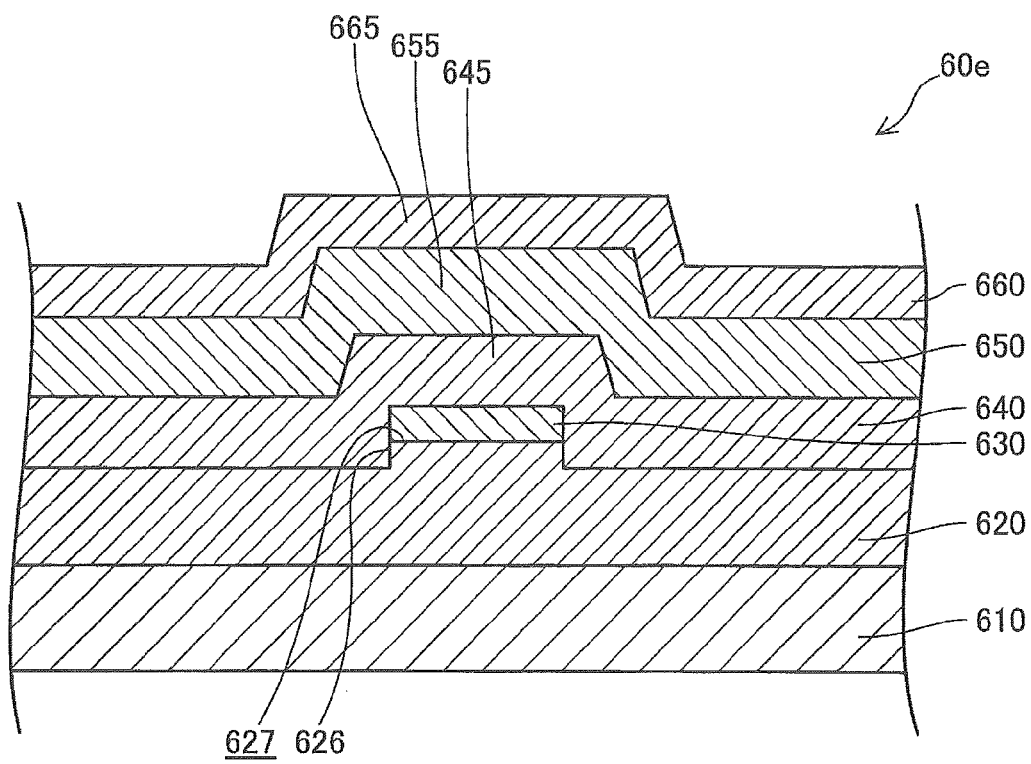
FIG. 25 is a diagram illustrating the structure of a semiconductor device in the middle of manufacture.

FIG. 25 is a diagram illustrating the structure of a semiconductor device 60e in the middle of manufacture. The semiconductor device 60e is produced by crystal growth on the semiconductor device 60d (step P236). According to this embodiment, the semiconductor device 60e has the n-type semiconductor layer 660 with the projection 665. The projection 665 of the n-type semiconductor layer 660 is a region protruded toward the +X-axis direction side along the projection 655 of the p-type semiconductor layer 650.

Referring back to FIG. 20, after crystal growth (step P236), the manufacturer forms the trench 670 by dry etching and wet etching (step P250). According to this embodiment, the manufacturer forms an etching mask around a part corresponding to the trench 670 on the +X-axis direction side surface of the n-type semiconductor layer 660 and removes a region from the n-type semiconductor layer 660 through the p-type semiconductor layer 650 and the n-type semiconductor layer 640 to the p-type semiconductor layer 630 by dry etching. Subsequent to dry etching, the manufacturer wet-etches the exposed surfaces of the respective semiconductor layers which are exposed by dry etching, and subsequently washes the surfaces of the respective semiconductor layers. Subsequent to wet etching, the manufacturer removes the etching mask and subsequently washes the surfaces of the respective semiconductor layers. This series of operations forms the trench 670. According to another embodiment, the manufacturer may not perform wet etching but form the trench 670 only by dry etching.

Figure 26:
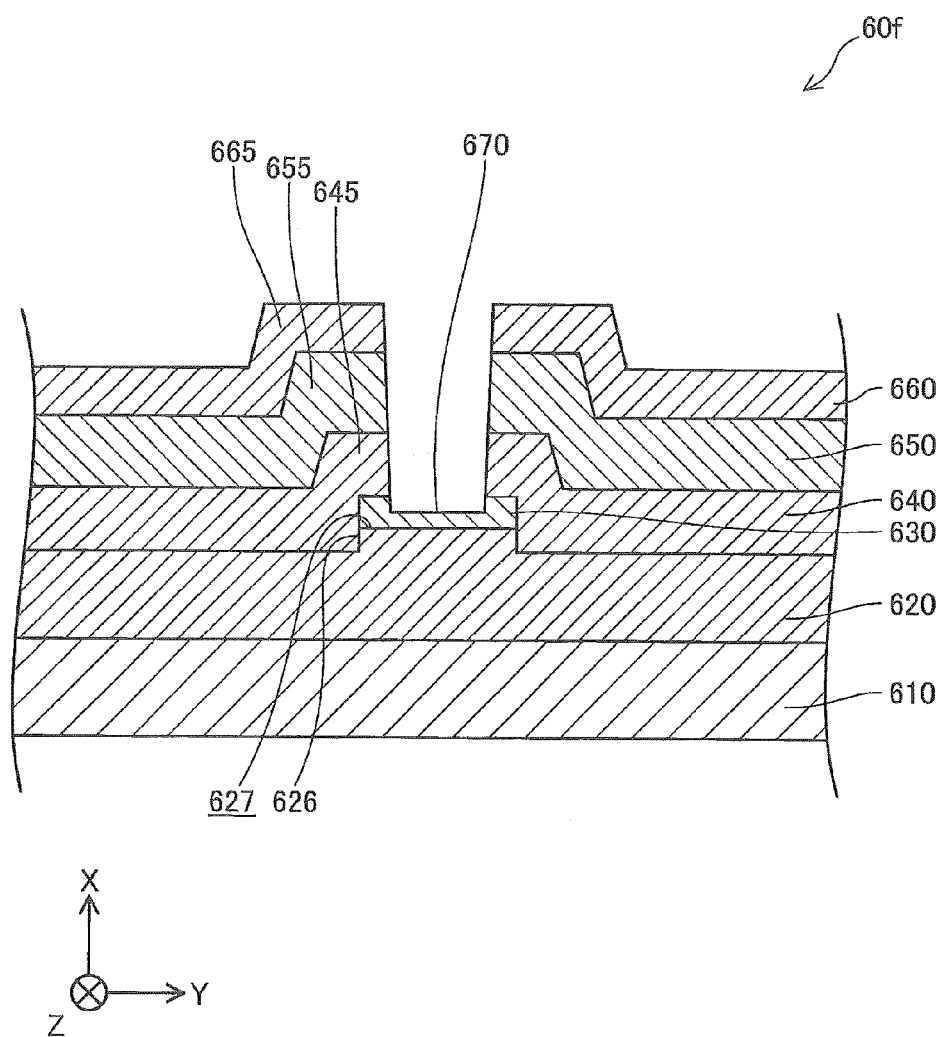
FIG. 26 is a diagram illustrating the structure of a semiconductor device in the middle of manufacture.

FIG. 26 is a diagram illustrating the structure of a semiconductor device 60f in the middle of manufacture. The semiconductor device 60f is produced by dry-etching and wet-etching the semiconductor device 60e (step P250). The semiconductor device 60f has the trench 670 depressed from the n-type semiconductor layer 660 through the p-type semiconductor layer 650 and the n-type semiconductor layer 640 to the p-type semiconductor layer 630.

Referring back to FIG. 20, after formation of the trench 670 (step P250), the manufacturer performs heating treatment (step P260). In the heating treatment (step P260), the manufacturer heats (anneals) the semiconductor device 60f in an oxygen ($O_2$)-containing gas. This recovers the damage of the respective semiconductor layers by dry etching and activates Mg as the acceptor of the p-type semiconductor layer 650. According to this embodiment, the temperature of the gas used for heating treatment (step P260) is 800° C. According to this embodiment, the heating time of the semiconductor device 60f in the heating treatment (step P260) is 5 minutes.

After the heating treatment (step P260), the manufacturer forms the insulating film 840 on the surface of the trench 670 and the n-type semiconductor layer 660 (step P270).

After formation of the insulating film 840 (step P270), the manufacturer forms the electrodes 710, 730 and 750 in the semiconductor device 60f with the insulating film 840 (step P280). This series of operations completes the semiconductor device 60.

G-3. Evaluation Test

Figure 27:
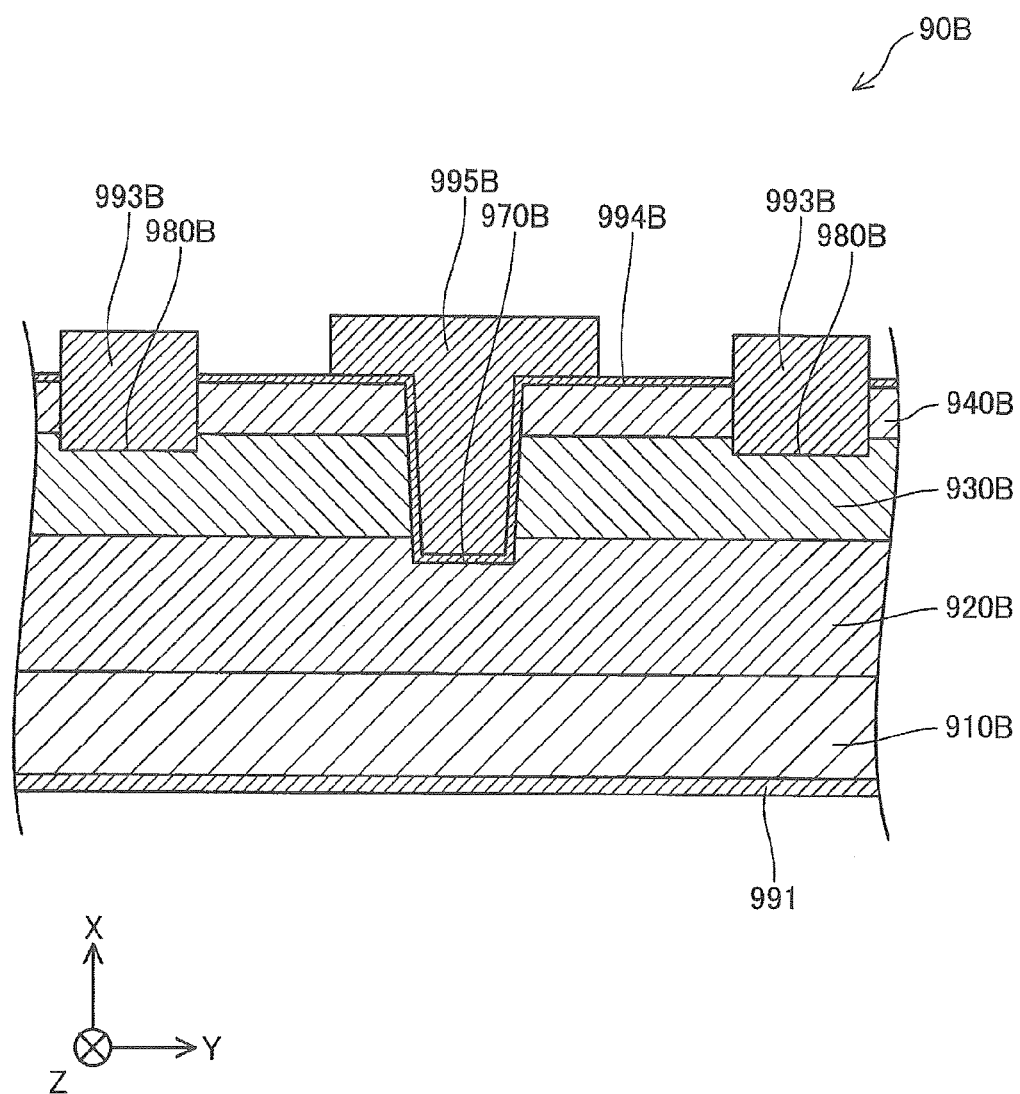
FIG. 27 is a cross sectional view schematically illustrating the structure of a semiconductor device used for an evaluation test.

FIG. 27 is a cross sectional view schematically illustrating the structure of a semiconductor device 90B used for an evaluation test. XYZ axes are shown in FIG. 27 in the same manner as FIG. 18. The semiconductor device 90B includes a substrate 910B, an n-type semiconductor layer 920B, a p-type semiconductor layer 930B, an n-type semiconductor layer 940B, electrodes 991B, 993B and 995B, and an insulating film 994B. A trench 970B and recesses 980B are formed in the semiconductor device 90B.

The substrate 910B of the semiconductor device 90B is similar to the substrate 610 of the semiconductor device 60.

The n-type semiconductor layer 920B of the semiconductor device 90B is similar to the n-type semiconductor layer 620 of the semiconductor device 60, except the absence of the convex 626.

The p-type semiconductor layer 930B of the semiconductor device 90B is similar to the p-type semiconductor layer 650 of the semiconductor device 60, except the absence of the projection 655.

The n-type semiconductor layer 940B of the semiconductor device 90B is similar to the n-type semiconductor layer 660 of the semiconductor device 60, except the absence of the projection 665.

The trench 970B of the semiconductor device 90B is similar to the trench 670 of the semiconductor device 60, except the trench 970B is depressed from the +X-axis direction side of the n-type semiconductor layer 940B through the p-type semiconductor layer 930B to the n-type semiconductor layer 920B.

The recess 980B of the semiconductor device 90B is similar to the recess 680 of the semiconductor device 60, except the recess 980B is depressed from the +X-axis direction side of the n-type semiconductor layer 940B to the p-type semiconductor layer 930B.

The electrodes 991B, 993B and 995B of the semiconductor device 90B are respectively similar to the electrodes 710, 730 and 750 of the semiconductor device 60. The insulating film 994B is similar to the insulating film 840 of the semiconductor device 60, except that the insulating film 994B is formed on the surface of the trench 970B and the n-type semiconductor layer 940B.

Figure 28:
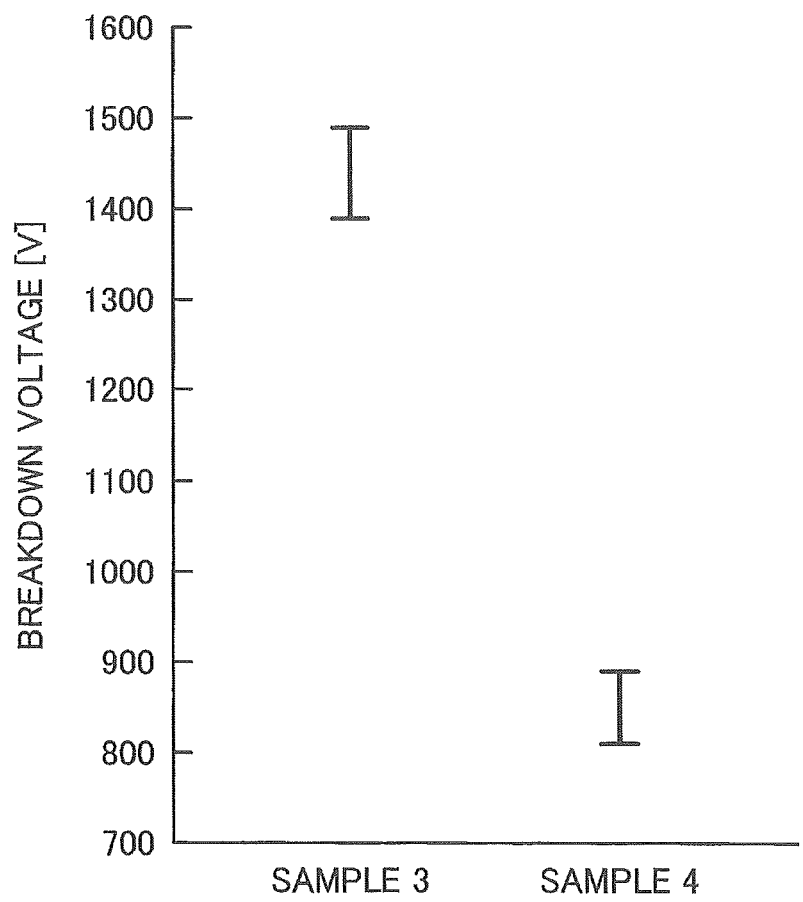
FIG. 28 is a diagram showing the results of the evaluation test.

FIG. 28 is a diagram showing the results of the evaluation test. In the evaluation test of FIG. 28, the tester provided the semiconductor device 60 as sample 3 and the semiconductor device 90B as sample 4. The tester measured the on resistance and the breakdown voltage of the respective samples. As shown in FIG. 28, the breakdown voltage of the semiconductor device 60 was 1400 to 1500 V (volts), while the breakdown voltage of the semiconductor device 90B was 800 to 900 V. In other words, the breakdown voltage of the semiconductor device 60 was increased from the semiconductor device 90B by more than 50%. The on resistance of the semiconductor device 60 was increased from the semiconductor device 90B by 3 to 5%.

G-4. Advantageous Effects

According to the seventh embodiment described above, the p-type semiconductor layer 630 relieves the potential crowding in the trench 670. This results in improving the electrical properties of the semiconductor device 60. This also improves the breakdown voltage of the GaN-based semiconductor device 60, which has difficulty in formation of a p-type semiconductor by ion implantation.

The p-type semiconductor layer 630 is formed to relieve the potential crowding in the trench 670 without using ion implantation and thermal diffusion. This reduces an increase in on resistance by diffusion of the dopant of the p-type semiconductor layer 630 into at least one of the n-type semiconductor layer 620 and the n-type semiconductor layer 640, as well as an increase in on resistance by diffusion of the dopant of the p-type semiconductor layer 650 into the n-type semiconductor layer 660. This results in improving the electrical properties of the semiconductor device 60.

H. Eighth Embodiment

Figure 29:
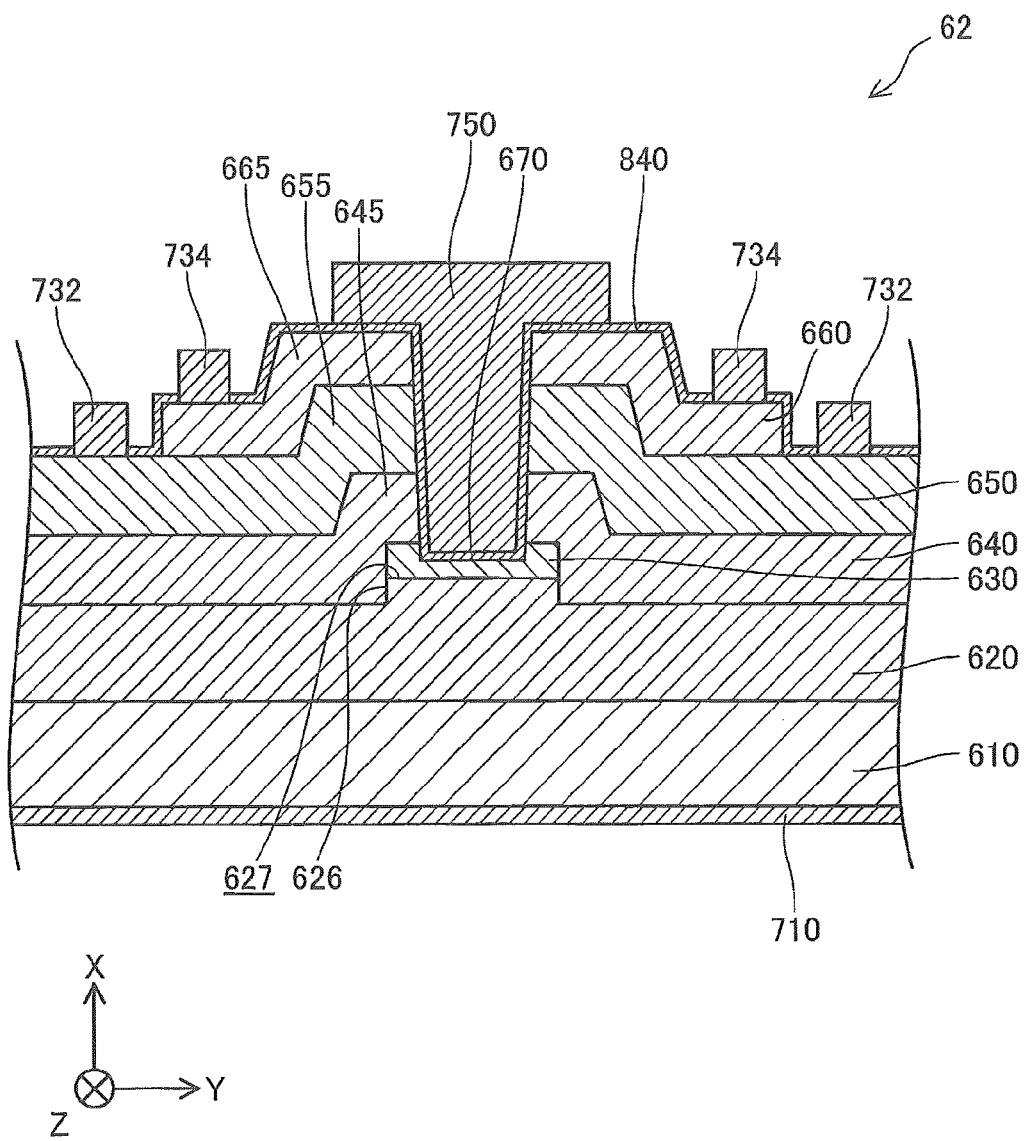
FIG. 29 is a cross sectional view schematically illustrating the structure of a semiconductor device according to an eighth embodiment.

FIG. 29 is a cross sectional view schematically illustrating the structure of a semiconductor device 62 according to an eighth embodiment. XYZ axes are shown in FIG. 29 in the same manner as FIG. 18. The semiconductor device 62 of the eighth embodiment is similar to the semiconductor device 60 of the seventh embodiment, except replacement of the electrode 730 with an electrode 732 suitable for the p-type semiconductor layer 650 and an electrode 734 suitable for the n-type semiconductor layer 660.

According to this embodiment, the electrode 732 is an electrode made of palladium (Pd). According to this embodiment, the electrode 734 is formed by stacking a layer made of aluminum (Al) on a layer made of titanium (Ti) and firing the stacked layers.

The eighth embodiment described above improves the electrical properties of the semiconductor device 62, like the seventh embodiment.

I. Ninth Embodiment

Figure 30:
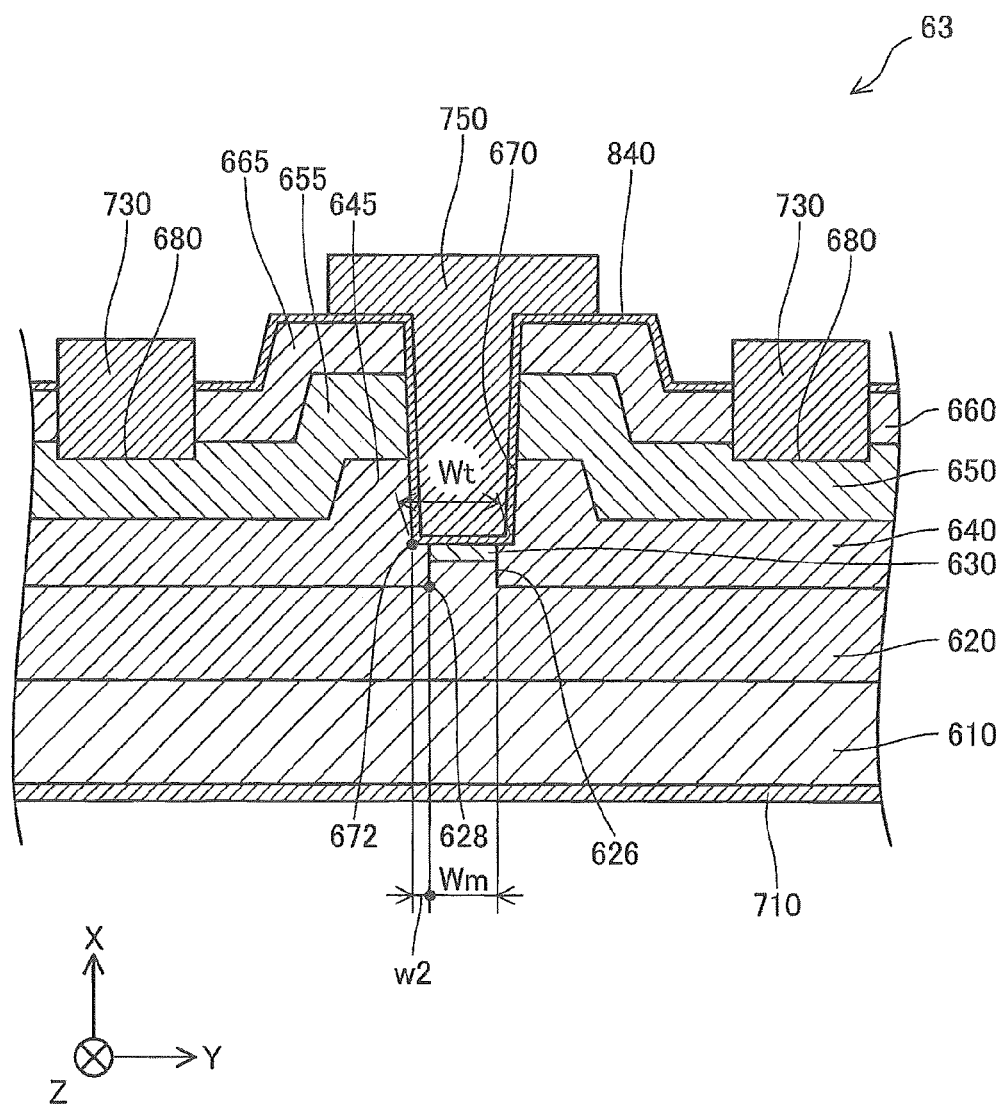
FIG. 30 is a cross sectional view schematically illustrating the structure of a semiconductor device according to a ninth embodiment.

FIG. 30 is a cross sectional view schematically illustrating the structure of a semiconductor device 63 according to a ninth embodiment. XYZ axes are shown in FIG. 30 in the same manner as FIG. 18. The semiconductor device 63 of the ninth embodiment is similar to the semiconductor device 60 of the seventh embodiment, except that the width Wt is greater than the width Wm. In other words, the semiconductor device 63 of the ninth embodiment is similar to the semiconductor device 60 of the seventh embodiment, except that the convex 626 and the p-type semiconductor layer 630 are narrower than the bottom face of the trench 670.

In terms of effectively relieving the potential crowding in the trench 670 by the p-type semiconductor layer 630, a distance w2 along the Y-axis direction between the locus 628 and the locus 672 is preferably not greater than 0.5 μm. According to this embodiment, the width Wm is 1.5 μm, the width Wt is 2.0 μm, and the distance w2 is 0.25 μm.

Figure 31:
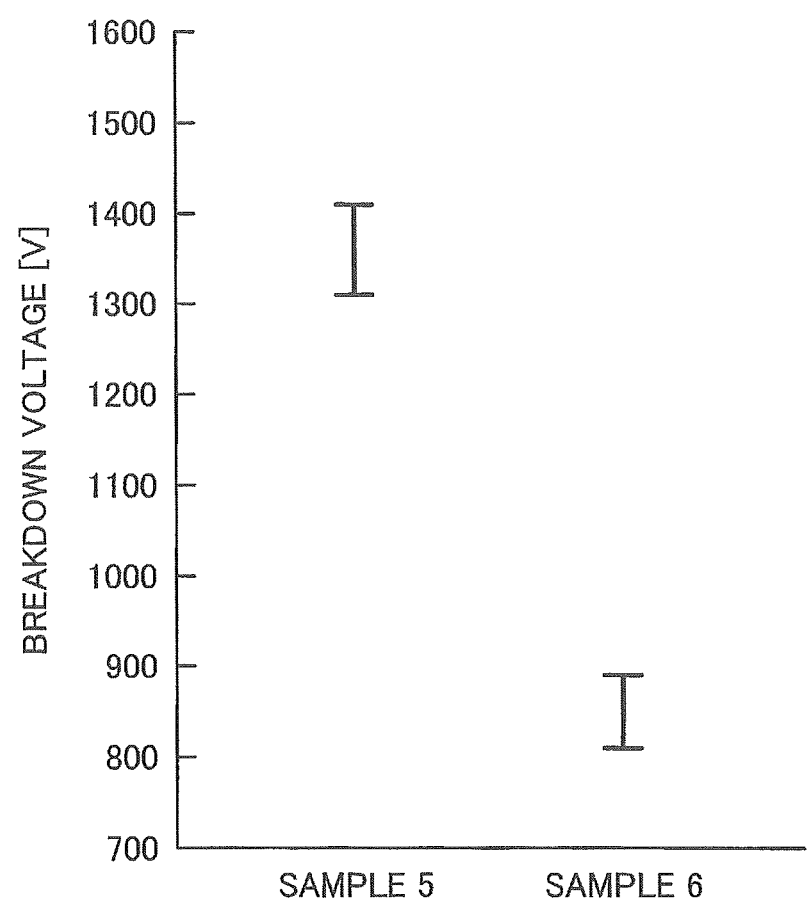
FIG. 31 is a diagram showing the results of the evaluation test.

FIG. 31 is a diagram showing the results of the evaluation test. In the evaluation test of FIG. 31, the tester provided the semiconductor device 63 as sample 5 and the semiconductor device 90B as sample 6. The tester measured the on resistance and the breakdown voltage of the respective samples. As shown in FIG. 31, the breakdown voltage of the semiconductor device 63 was 1300 to 1400 V (volts), while the breakdown voltage of the semiconductor device 90B was 800 to 900 V. In other words, the breakdown voltage of the semiconductor device 63 was increased from the semiconductor device 90B by more than 40%. The on resistance of the semiconductor device 63 was comparable to that of the semiconductor device 90B.

The eighth embodiment described above improves the electrical properties of the semiconductor device 63, like the seventh embodiment. The convex 626 and the p-type semiconductor layer 630 are narrower than the bottom face of the trench 670. This enables the p-type semiconductor layer 630 to further suppress an increase in on resistance due to a depletion layer extended on the n-type semiconductor layer 640.

J. Tenth Embodiment

Figure 32:
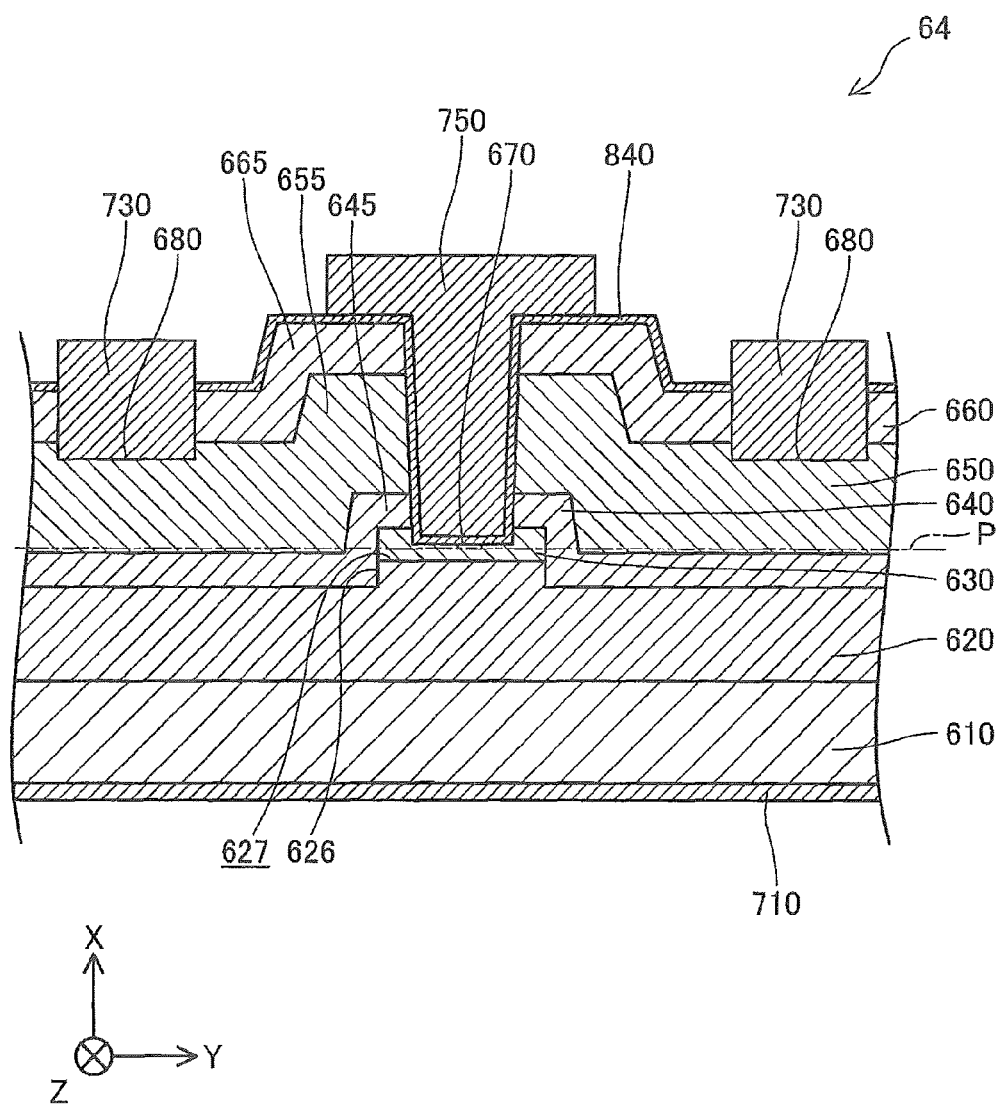
FIG. 32 is a cross sectional view schematically illustrating the structure of a semiconductor device according to a tenth embodiment.

FIG. 32 is a cross sectional view schematically illustrating the structure of a semiconductor device 64 according to a tenth embodiment. XYZ axes are shown in FIG. 32 in the same manner as FIG. 18. The semiconductor device 64 of the tenth embodiment is similar to the semiconductor device 60 of the seventh embodiment, except that the p-type semiconductor layer 650 is located on a virtual plane P (YZ plane) which is along the extending direction of the p-type semiconductor layer 630 and passes through the p-type semiconductor layer 630. The virtual plane P may be set at any position in a range along the X axis where the p-type semiconductor layer 630 is located.

Figure 33:
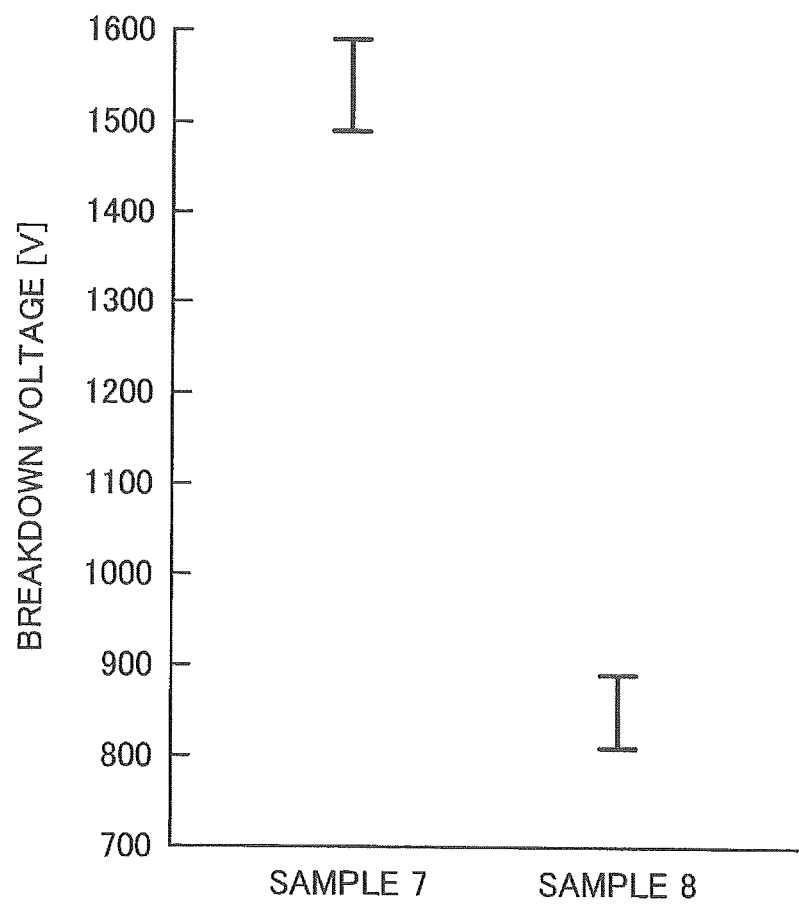
FIG. 33 is a diagram showing the results of the evaluation test.

FIG. 33 is a diagram showing the results of the evaluation test. In the evaluation test of FIG. 33, the tester provided the semiconductor device 64 as sample 7 and the semiconductor device 90B as sample 8. The tester measured the on resistance and the breakdown voltage of the respective samples. As shown in FIG. 33, the breakdown voltage of the semiconductor device 64 was 1500 to 1600 V (volts), while the breakdown voltage of the semiconductor device 90B was 800 to 900 V. In other words, the breakdown voltage of the semiconductor device 64 was increased from the semiconductor device 90B by more than 60%. The on resistance of the semiconductor device 64 was increased from the semiconductor device 90B by 3 to 5%.

The ninth embodiment described above improves the electrical properties of the semiconductor device 64 like the seventh embodiment. This can also further relieve the potential crowding in the trench 670 by the p-type semiconductor layer 630 and the p-type semiconductor layer 650.

K. Eleventh Embodiment

Figure 34:
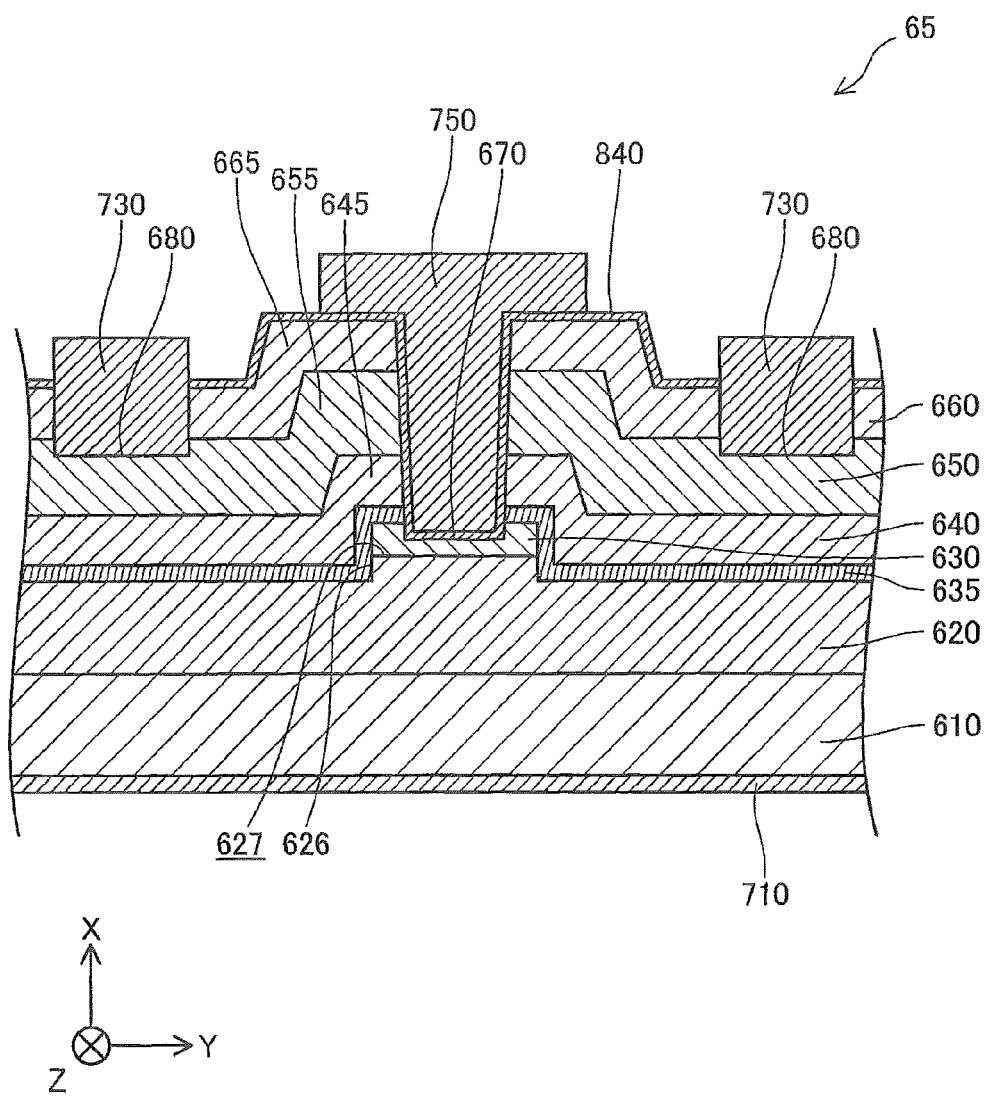
FIG. 34 is a cross sectional view schematically illustrating the structure of a semiconductor device according to an eleventh embodiment.

FIG. 34 is a cross sectional view schematically illustrating the structure of a semiconductor device 65 according to an eleventh embodiment. XYZ axes are shown in FIG. 34 in the same manner as FIG. 18. The semiconductor device 65 of the eleventh embodiment is similar to the semiconductor device 60 of the seventh embodiment, except addition of another semiconductor layer 635.

The semiconductor layer 635 of the semiconductor device 65 is a semiconductor layer placed between the n-type semiconductor layer 620 with the p-type semiconductor layer 630 and the n-type semiconductor layer 640 and may be regarded as part of the n-type semiconductor layer 640. According to this embodiment, the semiconductor layer 635 is another n-type semiconductor layer having the lower donor concentration than that of the n-type semiconductor layer 640. According to another embodiment, the semiconductor layer 635 may be an intrinsic semiconductor layer (undoped semiconductor layer) having the lower donor concentration than that of the p-type semiconductor layer 630 or may consist of a plurality of semiconductor layers comprised of at least one of the n-type semiconductor layer and the intrinsic semiconductor layer.

After forming the convex 626 with the p-type semiconductor layer 630 stacked on the upper surface 627 by dry etching and wet etching (step P222), the manufacturer of the semiconductor device 65 forms the semiconductor layer 635 by crystal growth on the respective +X-axis direction side surfaces of the n-type semiconductor layer 620 and the p-type semiconductor layer 630, prior to formation of the n-type semiconductor layer 640 (step P232). The temperature for crystal growth of the semiconductor layer 635 is preferably lower than the temperature for crystal growth of the n-type semiconductor layer 640 by 50° C. to 100° C., in order to obtain the good crystal quality, but may be equal to the temperature for crystal growth of the n-type semiconductor layer 640.

After forming the semiconductor layer 635, the manufacturer of the semiconductor device 65 forms the n-type semiconductor layer 640 by crystal growth on the +X-axis direction side surface of the semiconductor layer 635 (step P232).

The eleventh embodiment described above improves the electrical properties of the semiconductor device 65, like the seventh embodiment. Even when the effect of dry etching and wet etching for formation of the convex 626 with the p-type semiconductor layer 630 stacked on the upper surface 627 (step P222) interferes with crystal growth on the respective surfaces of the n-type semiconductor layer 620 and the p-type semiconductor layer 630 (for example, roughness of surface morphology or adhesion of foreign substances on the surface), formation of the semiconductor layer 635 facilitates crystal growth of the n-type semiconductor layer 640. This results in improving the crystal quality of the n-type semiconductor layer 640.

L. Twelfth Embodiment

Figure 35:
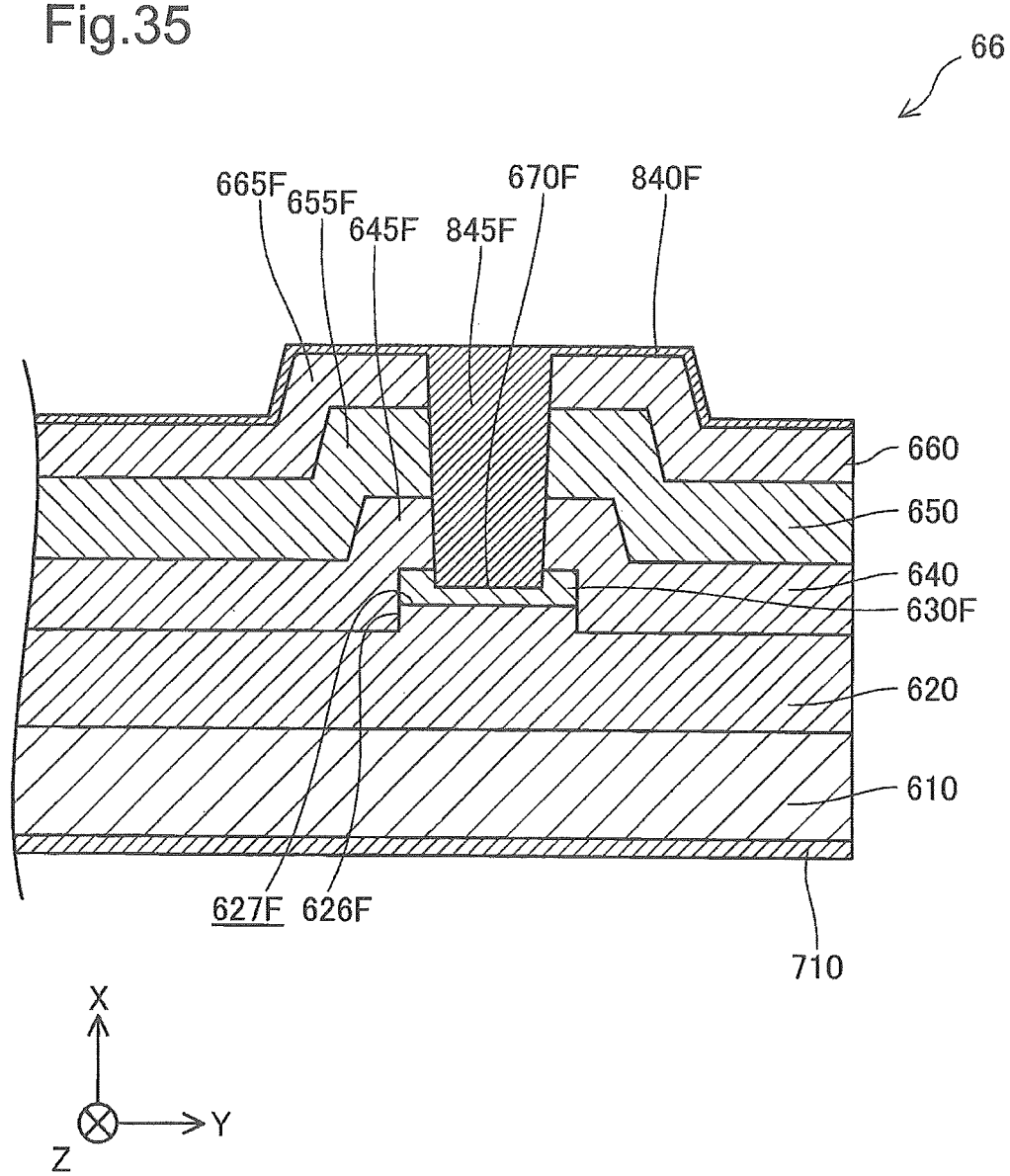
FIG. 35 is a cross sectional view schematically illustrating the structure of a semiconductor device according to a twelfth embodiment.

FIG. 35 is a sectional view schematically illustrating the structure of a semiconductor device 66 according to a twelfth embodiment. XYZ axes are shown in FIG. 35 in the same manner as FIG. 18. The semiconductor device 66 of the twelfth embodiment is similar to the semiconductor device 60 of the seventh embodiment, except a terminal structure using a trench 670F. The semiconductor device 66 includes, as the terminal structure, a convex 626F, a p-type semiconductor layer 630F, a projection 645F, a projection 655F, a projection 665F and an insulating film 840F, in addition to the trench 670F.

The convex 626F of the twelfth embodiment is similar to the convex 626 of the seventh embodiment, except that the convex 626F is provided at the location corresponding to the trench 670F. The p-type semiconductor layer 630F of the twelfth embodiment is similar to the p-type semiconductor layer 630 of the seventh embodiment, except that the p-type semiconductor layer 630F is provided at the location corresponding to the trench 670F. The p-type semiconductor layer 630F is stacked on an upper surface 627F of the convex 626F.

The projections 645F, 655F and 665F of the twelfth embodiment are similar to the projections 645, 655 and 665 of the seventh embodiment, except that the projections 645F, 655F and 665F are provided at the locations corresponding to the trench 670F.

The trench 670F of the twelfth embodiment is similar to the trench 670 of the seventh embodiment, except that the trench 670F is a trench with a terminal structure. The trench 670F is a trench depressed from the +X-axis direction side of the n-type semiconductor layer 660 through the p-type semiconductor layer 650 and the n-type semiconductor layer 640 to the p-type semiconductor layer 630F. According to this embodiment, the trench 670F is depressed into the p-type semiconductor layer 630F. According to other embodiments, the trench 670F may be applied to any of the structures of the eighth embodiment, the ninth embodiment and the tenth embodiment.

The insulating film 840F of the twelfth embodiment is similar to the insulating film 840 of the seventh embodiment, except that the insulating film 840F has a filling part 845F filled in the trench 670F. According to another embodiment, an electrode like the electrode 750 of the seventh embodiment may be provided in the trench 670D, instead of the filling part 845F.

The twelfth embodiment described above relieves the potential crowding in the trench 670F by the p-type semiconductor layer 630F, like the seventh embodiment. This results in improving the electrical properties of the semiconductor device 66.

M Other Embodiments

The invention is not limited to the above embodiments, examples or modifications, but a diversity of variations and modifications may be made to the embodiments without departing from the scope of the invention. For example, the technical features of the embodiments, examples or modifications corresponding to the technical features of the respective aspects described in SUMMARY OF INVENTION may be replaced or combined appropriately, in order to solve part or all of the problems described above or in order to achieve part or all of the advantageous effects described above. Any of the technical features may be omitted appropriately unless the technical feature is described as essential herein.

In the first to the sixth embodiments described above, the convex 150 may be in a shape extended in any arbitrary direction along the YZ plane. In the above embodiments, the cross sectional shape of the convex 150 may be any shape protruded in the +X-axis direction, for example, a trapezoidal shape having the width on the −X-axis direction side wider than the width on the +X-axis direction side or a trapezoidal shape having the width on the +X-axis direction side wider than the width on the −X-axis direction side. In the first to the sixth embodiments described above, the convex 150 may be formed only by dry etching without wet etching.

In the first to the sixth embodiments described above, the trench 170 may be in a shape extended in any arbitrary direction along the YZ plane. In the first to the sixth embodiments described above, the trench 170 may be formed only by dry etching without wet etching.

In the first to the sixth embodiments described above, the p-type semiconductor layer 130 may be in a shape having a uniformly flat surface on the +X-axis direction side along the YZ plane, i.e., in a shape without the projection 135 or 135D. In the first to the sixth embodiments described above, a region of the p-type semiconductor layer 130 located on the +Y-axis direction side of the trench 170 may be linked with a region of the p-type semiconductor layer 130 located on the −Y-axis direction side of the trench 170 through a non-illustrated region of the p-type semiconductor layer 130.

In the first to the sixth embodiments described above, the n-type semiconductor layer 140 may be in a shape having a uniformly flat surface on the +X-axis direction side along the YZ plane, i.e., in a shape without the projection 145 or 145D. In the first to the sixth embodiments described above, a region of the n-type semiconductor layer 140 located on the +Y-axis direction side of the trench 170 may be linked with a region of the n-type semiconductor layer 140 located on the −Y-axis direction side of the trench 170 through a non-illustrated region of the n-type semiconductor layer 140.

In the fifth and the sixth embodiments, the plurality of electrodes 250 may be respective regions of an electrode in a net-like shape having a plurality of meshes (for example, hexagonal meshes) viewed from the +X-axis direction side, and the electrodes 230 may be formed respectively in the plurality of meshes. In the fifth and the sixth embodiments, the plurality of electrodes 230 and the plurality of electrodes 250 may respectively be extended along the Z-axis direction. The plurality of electrodes 230 may be interconnected on the +Z-axis direction side, while the plurality of electrodes 250 may be interconnected on the −Z-axis direction side.

In the seventh to the twelfth embodiments descried above, the convex 626 and the p-type semiconductor layer 630 may be in a shape extended in any arbitrary direction along the YZ plane. In the seventh to the twelfth embodiments described above, the cross sectional shape of the convex 626 and the p-type semiconductor layer 630 may be any shape protruded in the +X-axis direction, for example, a trapezoidal shape having the width on the −X-axis direction side wider than the width on the +X-axis direction side or a trapezoidal shape having the width on the +X-axis direction side wider than the width on the −X-axis direction side. In the seventh to the twelfth embodiments described above, the convex 626 and the p-type semiconductor layer 630 may be formed only by dry etching without wet etching.

In the seventh to the twelfth embodiments described above, the trench 670 may be in a shape extended in any arbitrary direction along the YZ plane. In the seventh to the twelfth embodiments described above, the trench 670 may be formed only by dry etching without wet etching.

In the seventh to the twelfth embodiments described above, the n-type semiconductor layer 640 may be in a shape having a uniformly flat surface on the +X-axis direction side along the YZ plane, i.e., in a shape without the projection 645 or 645F. In the seventh to the twelfth embodiments described above, a region of the n-type semiconductor layer 640 located on the +Y-axis direction side of the trench 670 may be linked with a region of the n-type semiconductor layer 640 located on the −Y-axis direction side of the trench 670 through a non-illustrated region of the n-type semiconductor layer 640.

In the seventh to the twelfth embodiments described above, the p-type semiconductor layer 650 may be in a shape having a uniformly flat surface on the +X-axis direction side along the YZ plane, i.e., in a shape without the projection 655 or 655F. In the seventh to the twelfth embodiments described above, a region of the p-type semiconductor layer 650 located on the +Y-axis direction side of the trench 670 may be linked with a region of the p-type semiconductor layer 650 located on the −Y-axis direction side of the trench 670 through a non-illustrated region of the p-type semiconductor layer 650.

In the seventh to the twelfth embodiments described above, the n-type semiconductor layer 660 may be in a shape having a uniformly flat surface on the +X-axis direction side along the YZ plane, i.e., in a shape without the projection 665 or 665F. In the seventh to the twelfth embodiments described above, a region of the n-type semiconductor layer 660 located on the +Y-axis direction side of the trench 670 may be linked with a region of the n-type semiconductor layer 660 located on the −Y-axis direction side of the trench 670 through a non-illustrated region of the n-type semiconductor layer 660.

In the ninth and the tenth embodiments, like the eighth embodiment, the electrode 730 may be provided separately as an electrode 732 suitable for the p-type semiconductor layer and an electrode 734 suitable for the n-type semiconductor layer.

The n-type semiconductor layer 620 and the n-type semiconductor layer 640 of the seventh embodiment correspond to the n-type semiconductor layer 120 of the first embodiment (see FIGS. 1 and 18). The p-type semiconductor layer 650 of the seventh embodiment corresponds to the p-type semiconductor layer 130 of the first embodiment. The trench 670 of the seventh embodiment corresponds to the trench 170 of the first embodiment. The projection 645 of the seventh embodiment corresponds to the convex 150 of the first embodiment.

The n-type semiconductor layer 620 of the seventh embodiment is an n-type semiconductor layer on the lower layer side away from the p-type semiconductor layer 650. The n-type semiconductor layer 640 of the seventh embodiment is an n-type semiconductor layer on the upper layer side having respective interfaces corresponding to the first interface 121 and the second interface 122 of the first embodiment. Another convex 26 having another upper surface 627 is formed at the location corresponding to the projection 645 on the n-type semiconductor layer 620 on the lower layer side. Another p-type semiconductor layer 630 different from the p-type semiconductor layer 650 is stacked on the upper surface 627. The trench 670 is depressed to another p-type semiconductor layer 630.

The trench 670 may be in a shape having a bottom face depressed into another p-type semiconductor layer 630 as shown in FIG. 18 or may be in a shape having a bottom face wider than another p-type semiconductor layer 630 as shown in FIG. 30.

The semiconductor layer 635 of the eleventh embodiment corresponds to part of the n-type semiconductor layer 120 of the first embodiment (see FIGS. 1 and 34). The semiconductor layer 635 is another semiconductor layer placed between the n-type semiconductor layer 620 on the lower layer side with another p-type semiconductor layer 630 and the n-type semiconductor layer 640 on the upper layer side.

In the embodiments described above, an intrinsic semiconductor layer may be formed between the substrate and the n-type semiconductor layer, and an intrinsic semiconductor layer may be formed between the n-type semiconductor layer and the p-type semiconductor layer.

In the embodiments described above, the material of the substrate is not limited to gallium nitride (GaN) but may be, for example, silicon (Si), sapphire ($Al_2O_3$) or silicon carbide (SiC).

In the embodiments described above, the donor contained in at least one of the substrate and the n-type semiconductor layer is not limited to silicon (Si) but may be, for example, germanium (Ga) or oxygen (O).

In the embodiments described above, the acceptor contained in the p-type semiconductor layer is not limited to magnesium (Mg) but may be, for example, zinc (Zn) or carbon (C).

In the embodiments described above, the material of the insulating film is not limited to silicon dioxide ($SiO_2$) but may be, for example, silicon nitride (SiN), silicon nitride oxide (SiON), aluminum oxide ($Al_2O_3$), aluminum nitride oxide (AlON), zirconium dioxide ($ZrO_2$), titanium oxide ($TiO_2$), tantalum pentoxide ($Ta_2O_5$), niobium pentoxide ($Nb_2O_5$), hafnium dioxide ($HfO_2$) or aluminum nitride (AlN). In the embodiments described above, the insulating film is not limited to a single layer but may have a multi-layered structure of different materials.

The trench gate structure according to any of the embodiments described above is not limited to MOSFET but may be applied to another semiconductor device (for example, IGBT (Insulated Gate Bipolar Transistor)).

What is claimed is:

1. A semiconductor device, comprising:
    a substrate;
    a first n-type semiconductor layer that is located above the substrate and includes a first interface and a second interface, wherein the first interface is extended along the substrate and the second interface forms an upper surface of a convex protruded from the first interface;
    a p-type semiconductor layer that is stacked on the first n-type semiconductor layer and includes a first region stacked on the first interface and a second region stacked on the second interface, wherein the first region is uniformly continuous with the second region;
    a second n-type semiconductor layer that is stacked on the p-type semiconductor layer;
    a trench that is depressed from the second n-type semiconductor layer through the p-type semiconductor layer into the convex of the first n-type semiconductor layer; and
    an insulating film disposed on an upper surface of the second n-type semiconductor layer and a bottom surface of the trench.

2. The semiconductor device according to claim 1, further comprising an electrode that is formed in the trench via the insulating film.

3. The semiconductor device according to claim 1, wherein a height of the convex protruded from the first interface is less than a total thickness obtained by adding a thickness of the p-type semiconductor layer in the first region and a thickness of the second n-type semiconductor layer on the first region.

4. The semiconductor device according to claim 1, wherein a depth by which the trench is depressed into the upper surface of the convex is not less than 0.0 μm and is not greater than a total depth obtained by adding a height of the convex protruded from the first interface and 0.4 μm.

5. The semiconductor device according to claim 1, wherein a height from the first interface to a bottom face of the trench along an X-axis direction in which the convex is protruded is not greater than 1.0 μm on a +X-axis direction side from the first interface toward the second interface, and is not greater than 0.4 μm on a −X-axis direction side from the second interface toward the first interface.

6. The semiconductor device according to claim 1, wherein a distance between a lateral end of the convex and a bottom face of the trench satisfies 0.1 μm≤w1≤2.0 μm.

7. The semiconductor device according to claim 1, wherein a distance between a lateral end of the convex and a bottom face of the trench satisfies 0.2 μm≤w1≤1.0 μm.

8. The semiconductor device according to claim 1, further comprising a third n-type semiconductor layer that is placed between the first n-type semiconductor layer and the p-type semiconductor layer.

9. The semiconductor device according to claim 1, further comprising an intrinsic semiconductor layer that is placed between the first n-type semiconductor layer and the p-type semiconductor layer.

10. The semiconductor device according to claim 1, wherein an acceptor concentration in the first region is equal to an acceptor concentration in the second region.

11. The semiconductor device according to claim 1, wherein the first n-type semiconductor layer, the p-type semiconductor layer, and the second n-type semiconductor layer include semiconductor layers mainly comprising gallium nitride (GaN).

12. The semiconductor device according to claim 1, wherein the trench comprises a plurality of trenches, and the convex is protruded from the first interface at least on a terminal side of an end trench located on a terminal side of the semiconductor device among the plurality of trenches.

13. The semiconductor device according to claim 1, further comprising:
    a step portion that is formed on a terminal side of the trench in the semiconductor device and extended from the second n-type semiconductor layer through the p-type semiconductor layer to the first n-type semiconductor layer;
    the insulating film that is configured to have electrical insulation and to cover the step portion; and an electrode that is configured to have electrical conductivity and is stacked on the insulating film such that the insulating film is placed between the electrode and the step portion.

14. The semiconductor device according to claim 1, further comprising:
a source electrode that is formed in a recess from the second n-type semiconductor layer to the p-type semiconductor layer; and
a gate electrode that is formed in the trench via the insulating film,
wherein parts of the source electrode and parts of the gate electrode are arranged alternately in a cross section along a stacking direction in which the first n-type semiconductor layer, the p-type semiconductor layer and the second n-type semiconductor layer being stacked.

15. The semiconductor device according to claim 1, wherein the first n-type semiconductor layer includes:
an n-type semiconductor layer on a lower layer side away from the p-type semiconductor layer; and
an n-type semiconductor layer on an upper layer side having the first interface and the second interface, and
wherein another convex including another upper surface is formed at a location corresponding to the convex on the n-type semiconductor layer on the lower layer side, another p-type semiconductor layer different from the p-type semiconductor layer is stacked on the another upper surface of the another convex, and the trench is depressed to the another p-type semiconductor layer.

16. The semiconductor device according to claim 15, the trench is in a shape having a bottom face depressed into the another p-type semiconductor layer or in a shape having a bottom face wider than the another p-type semiconductor layer.

17. The semiconductor device according to claim 15, wherein the first n-type semiconductor layer further includes another semiconductor layer that is placed between the n-type semiconductor layer on the lower layer side with the another p-type semiconductor layer and the n-type semiconductor layer on the upper layer side.

18. A semiconductor device, comprising:
a substrate;
a first n-type semiconductor layer that is located above the substrate and includes a first interface and a second interface, wherein the first interface is extended along the substrate and the second interface forms an upper surface of a convex protruded from the first interface;
a p-type semiconductor layer that is stacked on the first n-type semiconductor layer and includes a first region stacked on the first interface and a second region stacked on the second interface, wherein the first region is uniformly continuous with the second region;
a second n-type semiconductor layer that is stacked on the p-type semiconductor layer; and
a trench that is depressed from the second n-type semiconductor layer through the p-type semiconductor layer into the convex of the first n-type semiconductor layer,
wherein the p-type semiconductor layer includes a first projection that is protruded along the convex toward a protruding direction in which the convex is protruded, and
wherein the second n-type semiconductor layer includes a second projection protruded along the first projection toward the protruding direction.

* * * * *